US012777632B2

(12) United States Patent
Simsek-Ege

(10) Patent No.: US 12,777,632 B2
(45) Date of Patent: Oct. 27, 2026

(54) MICROELECTRONIC DEVICES INCLUDING VERTICALLY STACKED STRUCTURES WITH DISTRIBUTED CONTROL LOGIC REGIONS, AND RELATED ELECTRONIC SYSTEMS AND METHODS

(71) Applicant: Micron Technology, Inc., Boise, ID (US)

(72) Inventor: Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1105 days.

(21) Appl. No.: 17/804,270

(22) Filed: May 26, 2022

(65) Prior Publication Data

US 2023/0389284 A1 Nov. 30, 2023

(51) Int. Cl.

| | |
|---|---|
| ***H10B 12/00*** | (2023.01) |
| ***G11C 11/408*** | (2006.01) |
| ***H05K 3/10*** | (2006.01) |
| ***H10B 41/27*** | (2023.01) |
| ***H10B 43/27*** | (2023.01) |
| ***H10W 90/00*** | (2026.01) |

(52) U.S. Cl.

CPC ........ *H10B 12/315* (2023.02); *G11C 11/4087* (2013.01); *H05K 3/103* (2013.01); *H10B 41/27* (2023.02); *H10B 43/27* (2023.02); *H10W 90/00* (2026.01); *H10W 90/792* (2026.01)

(58) Field of Classification Search

CPC . H01L 25/0756; H01L 25/0657; H01L 25/18; H01L 2224/08146; H01L 2225/06541; H10B 12/315; H10B 41/27; H10B 43/27; H10B 43/40; H10B 43/50; H10B 12/30; H10B 12/02; H10B 12/48; H10B 12/50; G11C 11/4087; G11C 5/02; H05K 3/103; H10W 90/00; H10W 90/792; H10W 90/297; H10W 72/90

See application file for complete search history.

(56) References Cited

U.S. PATENT DOCUMENTS

| | | | |
|---|---|---|---|
| 5,901,099 | A | 5/1999 | Gilliam et al. |
| 6,778,452 | B2 | 8/2004 | Beigel et al. |

(Continued)

*Primary Examiner* — Steven B Gauthier
*Assistant Examiner* — Candice Chan
(74) *Attorney, Agent, or Firm* — TraskBritt

(57) ABSTRACT

A microelectronic device comprises a first microelectronic device structure and a second microelectronic device structure vertically neighboring the first microelectronic device structure. The first microelectronic device structure comprises a first memory array region and a first control logic device region and the second microelectronic device structure comprises a second memory array region and a second control logic device region. A third control logic device region vertically overlies the second microelectronic device structure. The first control logic device region includes sense amplifier devices for the first memory array region. The second control logic device region includes additional sense amplifier devices and sub word line drivers for the second memory array region. The third control logic device region includes additional sub word line drivers for the second memory array region. Related microelectronic devices, electronic systems, and methods are also described.

30 Claims, 34 Drawing Sheets

(56) References Cited

U.S. PATENT DOCUMENTS

| | | | | |
|---|---|---|---|---|
| 8,067,286 | B2 | 11/2011 | Parekh et al. | |
| 8,153,499 | B2 | 4/2012 | Or-Bach et al. | |
| 8,184,471 | B2 | 5/2012 | Woo et al. | |
| 8,546,188 | B2 | 10/2013 | Liu et al. | |
| 8,716,116 | B2 | 5/2014 | Parekh et al. | |
| 9,543,433 | B2 | 1/2017 | Anathan et al. | |
| 10,366,740 | B1 | 7/2019 | Kim et al. | |
| 11,848,309 | B2 | 12/2023 | Simsek-Ege | |
| 11,916,032 | B2 * | 2/2024 | Simsek-Ege | G11C 11/4085 |
| 12,308,333 | B2 * | 5/2025 | Simsek-Ege | H10B 12/50 |
| 2014/0347945 | A1 | 11/2014 | Venkata et al. | |
| 2018/0261575 | A1 | 9/2018 | Tagami et al. | |
| 2019/0181142 | A1 | 6/2019 | Fishburn | |
| 2019/0244933 | A1 | 8/2019 | Or-Bach et al. | |
| 2020/0066730 | A1 | 2/2020 | Guo et al. | |
| 2020/0105721 | A1 | 4/2020 | Park | |
| 2021/0217460 | A1 | 7/2021 | Montierth et al. | |
| 2022/0020736 | A1 * | 1/2022 | Yip | H01L 25/18 |
| 2022/0123006 | A1 * | 4/2022 | Ahn | H01L 25/0657 |
| 2022/0399308 | A1 | 12/2022 | Simsek-Ege et al. | |
| 2023/0018127 | A1 | 1/2023 | Gandhi et al. | |
| 2023/0207505 | A1 | 6/2023 | Simsek-Ege et al. | |

* cited by examiner

MICROELECTRONIC DEVICES INCLUDING VERTICALLY STACKED STRUCTURES WITH DISTRIBUTED CONTROL LOGIC REGIONS, AND RELATED ELECTRONIC SYSTEMS AND METHODS

TECHNICAL FIELD

The disclosure, in various embodiments, relates generally to the field of microelectronic device design and fabrication. More specifically, the disclosure relates to methods of forming microelectronic devices from independently formed microelectronic device structures, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random access memory (DRAM) devices; and non-volatile memory devices such as NAND Flash memory devices. A typical memory cell of a DRAM device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., hit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the (Efferent control logic devices employed within the base control logic structure can also undesirably impede reductions to the size e.g., horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device.

DETAILED DESCRIPTION

Figure 1A:
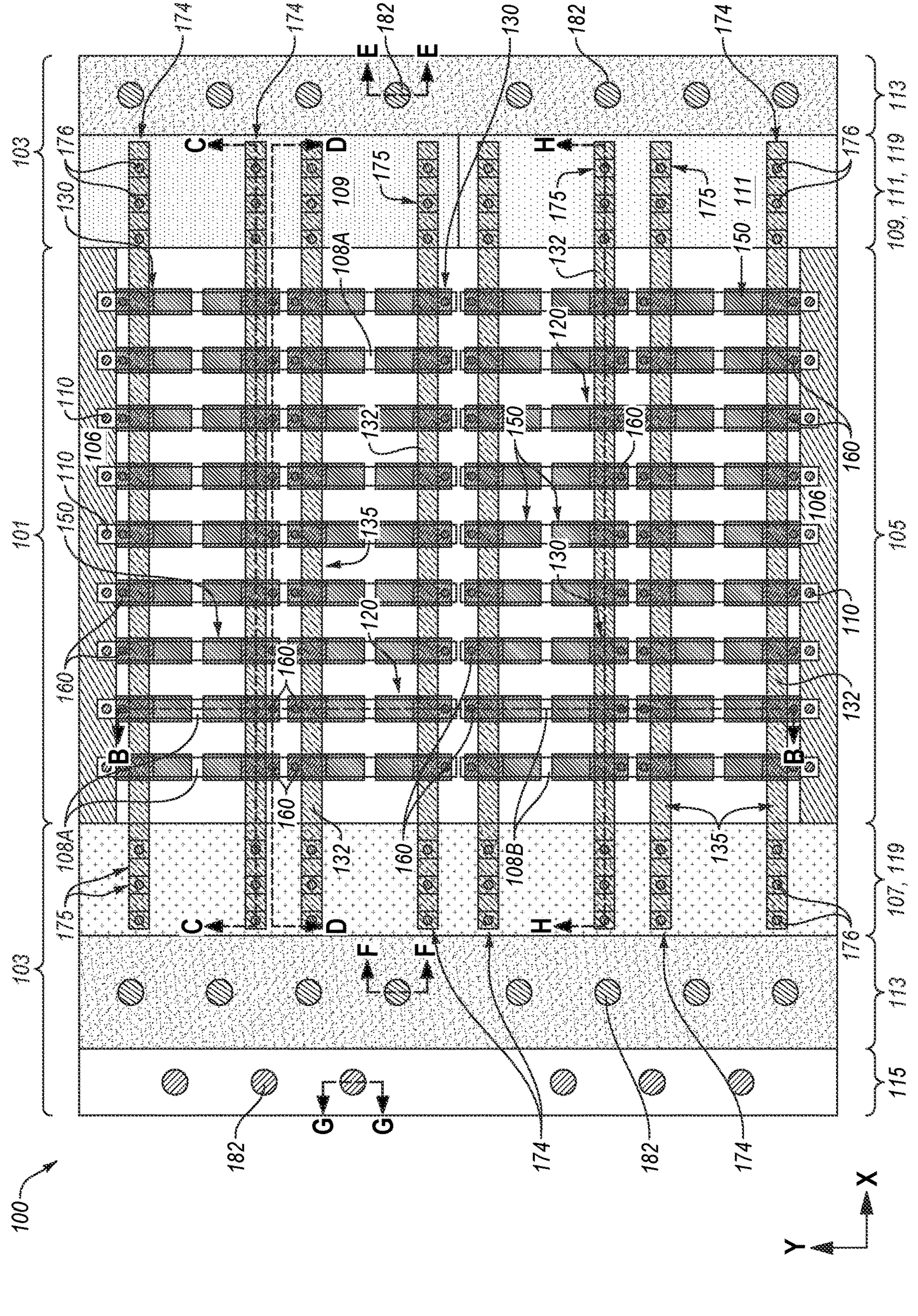
FIG. 1A through FIG. 1G include a simplified, partial top-down view (FIG. 1A) and simplified partial cross-sectional views (FIG. 1B through FIG. 1G) illustrating a first microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe-and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, "semiconductor material" or "semiconductive material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_XIn_{1-X}As_YP_{1-Y}$), without limitation. Compound semiconductor materials may include combinations of elements from columns III and V of the periodic table of elements semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

According to embodiments described herein, a microelectronic device includes a first microelectronic device structure including vertical stacks of memory cells and a first control logic device region including control logic devices and circuitry configured to effectuate control operations of the vertical stacks of memory cells of the first microelectronic device structure; a second microelectronic device structure vertically overlying the first microelectronic device structure and including additional vertical stacks of memory cells and a second control logic device region including control logic devices and circuitry configured to effectuate control operations of the additional vertical stacks of memory cells of the second microelectronic device structure and of the vertical stacks of memory cells of the first microelectronic device structure; and a third microelectronic device structure vertically overlying the second microelectronic device structure and including a third control logic device region including control logic devices and circuitry configured to effectuate control operations of the additional vertical stacks of memory cells of the second microelectronic device structure and further including additional complementary metal-oxide-semiconductor (CMOS) devices and circuitry configured for effectuating control operations of the microelectronic device including the first microelectronic device structure and the second microelectronic device structure. In some embodiments, the second control logic device region of the second microelectronic device structure includes sub word line drivers and row decoders configured to effectuate control operations of the vertical stacks of memory cells of the first microelectronic device structure; and the third control logic device region vertically overlying the second microelectronic device structure includes additional sub word line drivers and row decoders configured to effectuate control operations of the additional vertical stacks of memory cells of the second microelectronic device structure. Accordingly, the control logic devices configured to effectuate control operations of the vertical stacks of memory cells of the first microelectronic device structure may be split between the first control logic device region and the second control logic device region; and the control logic devices configured to effectuate control operations of the additional vertical stacks of memory cells of the second microelectronic device structure may be split between the second control logic device region and the third control logic device region.

Forming the microelectronic device to include the control logic devices of the first microelectronic device structure split between the first control logic device region and the second control logic device region (e.g., some of the control logic devices for effectuating operation of the first microelectronic device structure in the first control logic region, and some of the control logic devices for effectuating operation of the first microelectronic device structure in the second control logic device region) and the control logic devices of the second microelectronic device structure split between the second control logic device region and the third control logic device region (e.g., some of the control logic devices for effectuating operation of the second microelectronic device structure in the second control logic region, and some of the control logic devices for effectuating operation of the second microelectronic device structure in the third control logic device region) may facilitate forming the microelectronic device to exhibit a reduced horizontal area (e.g., footprint) and an increased memory density compared to conventional microelectronic devices. For example, the vertical stacks of memory cells of the first microelectronic device structure and additional vertical stacks of memory cells of the second microelectronic device structure may be formed to include a greater number of levels of memory cells.

FIG. 1A through FIG. 1G are a simplified partial top-down view (FIG. 1A) and simplified partial cross-sectional views (FIG. 1B through FIG. 1G) illustrating a first microelectronic device structure 100 (e.g., a memory device, such as a 3D DRAM memory device), in accordance with embodiments of the disclosure. With the description provided below, it will be readily apparent to one of ordinary skill in the art that the methods and structures described herein with reference to FIG. 1A through FIG. 1G may be used in various devices and electronic systems. The first microelectronic device structure 100 may also be referred to herein as a first die or a first wafer.

Figure 1B:
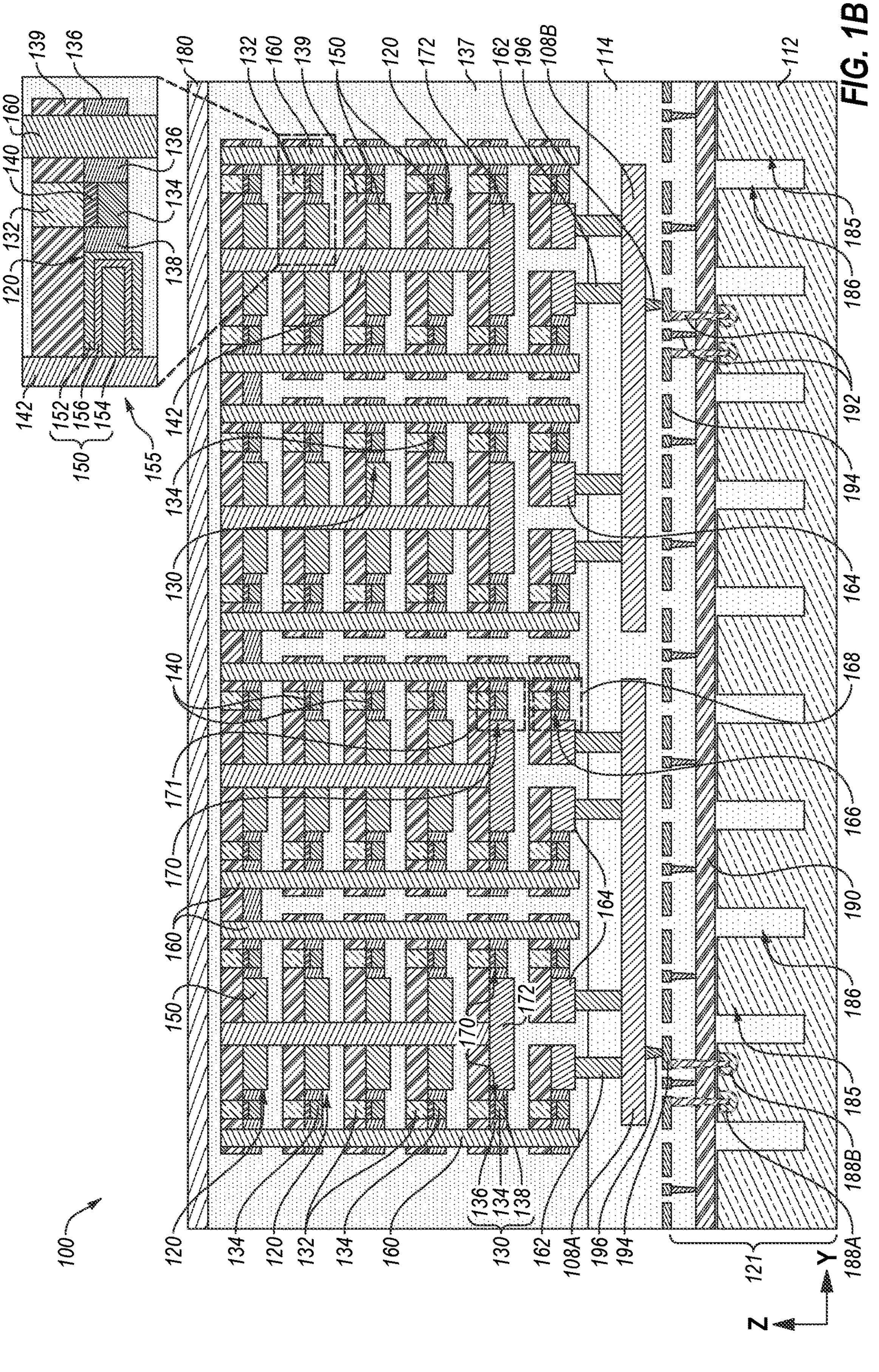
Figure 1C:
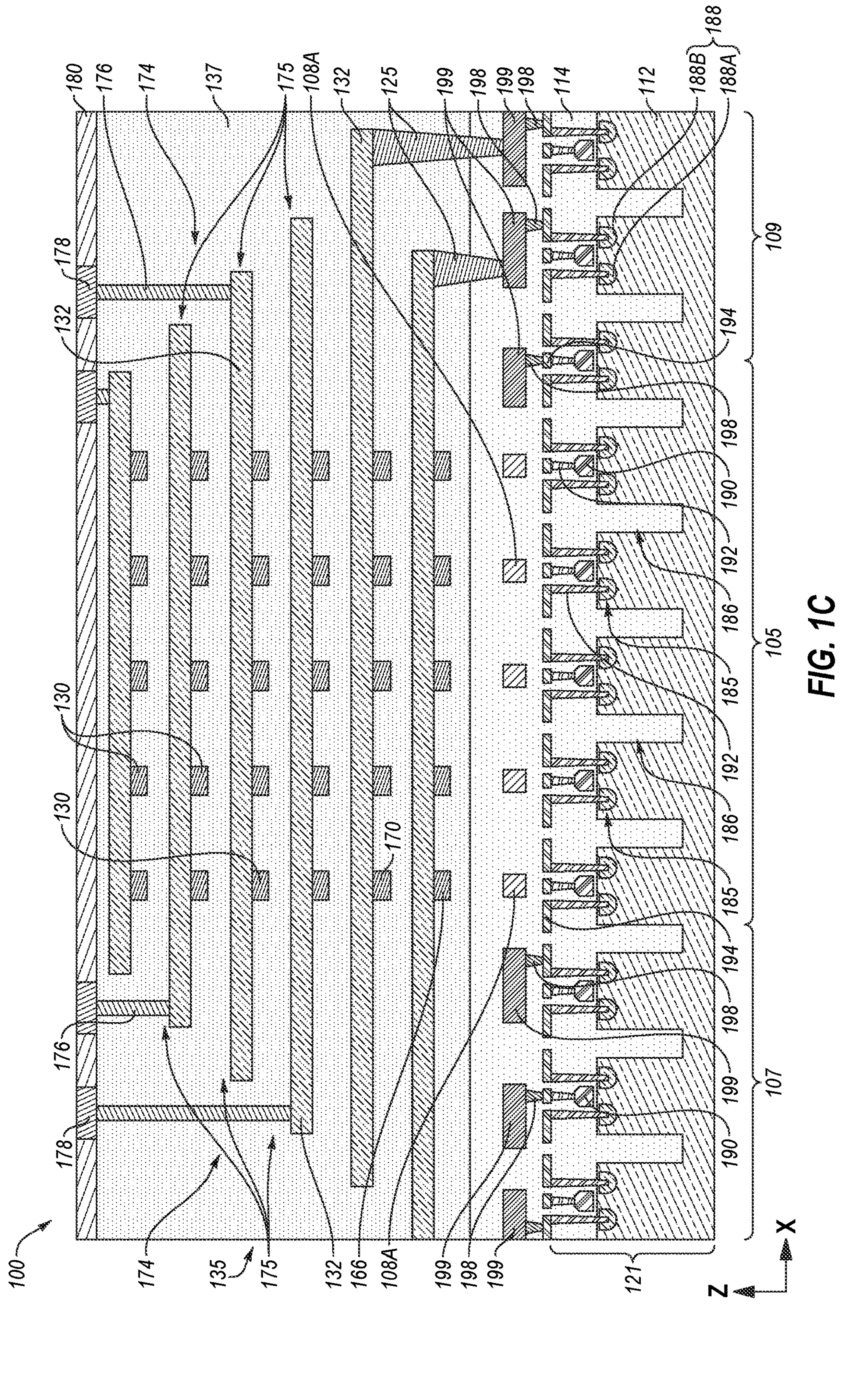
Figure 1D:
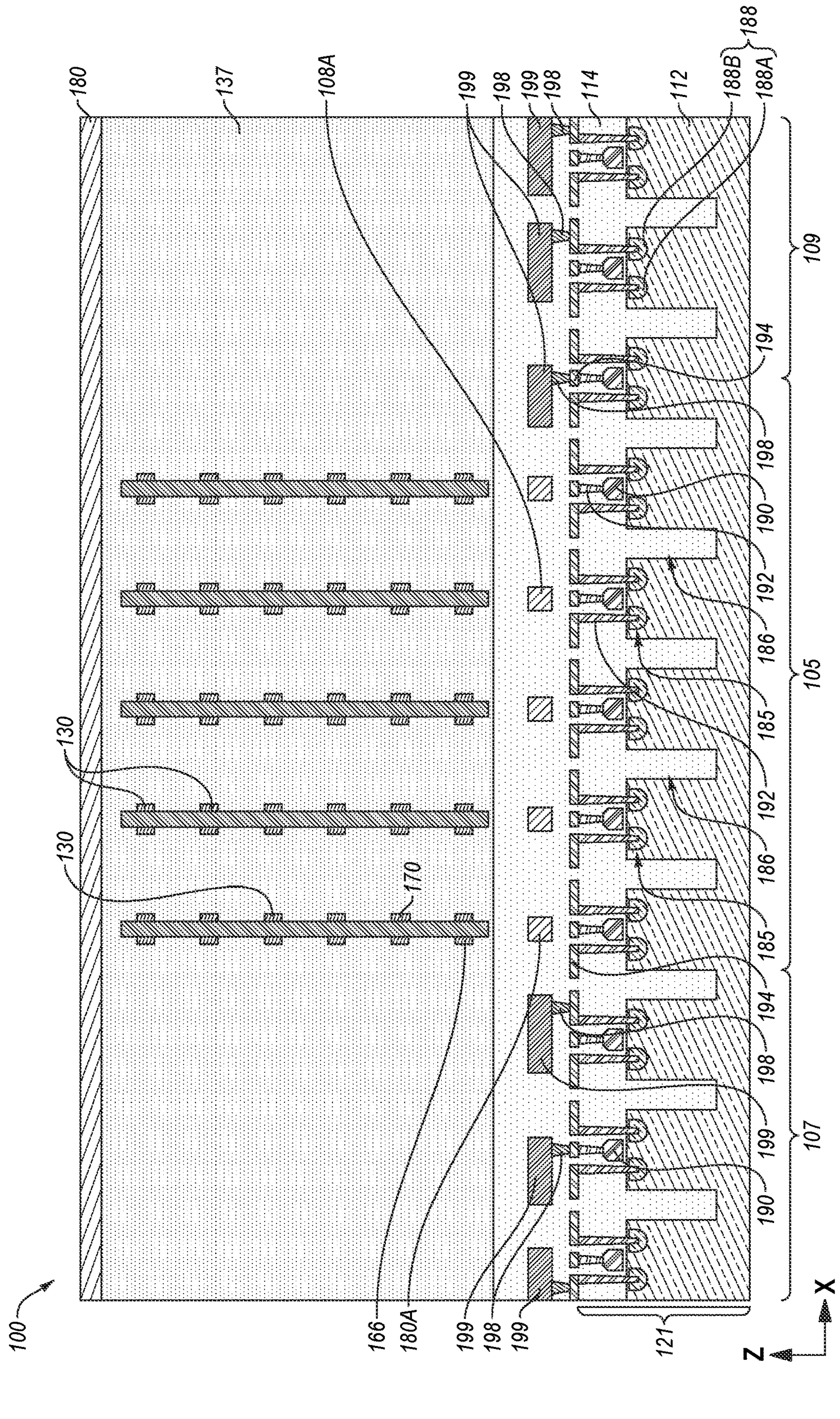
Figure 1F:
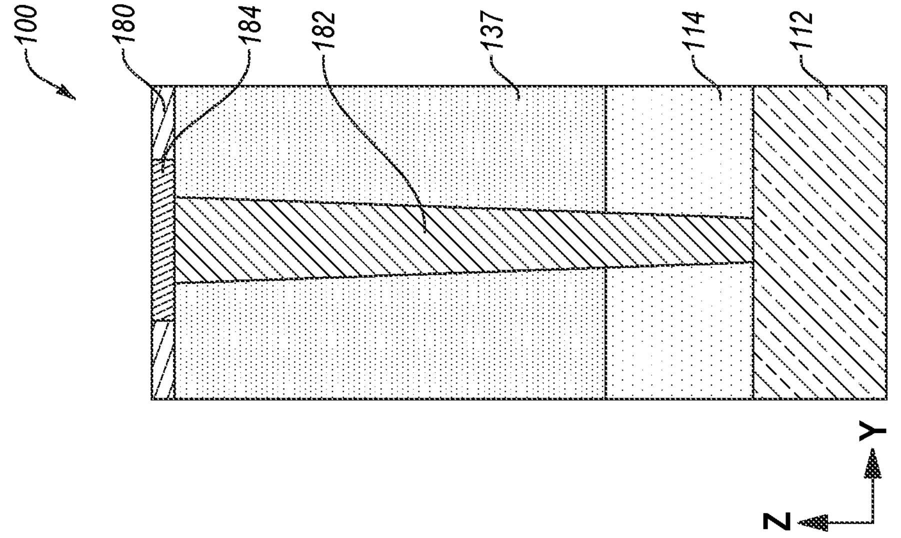
Figure 1E:
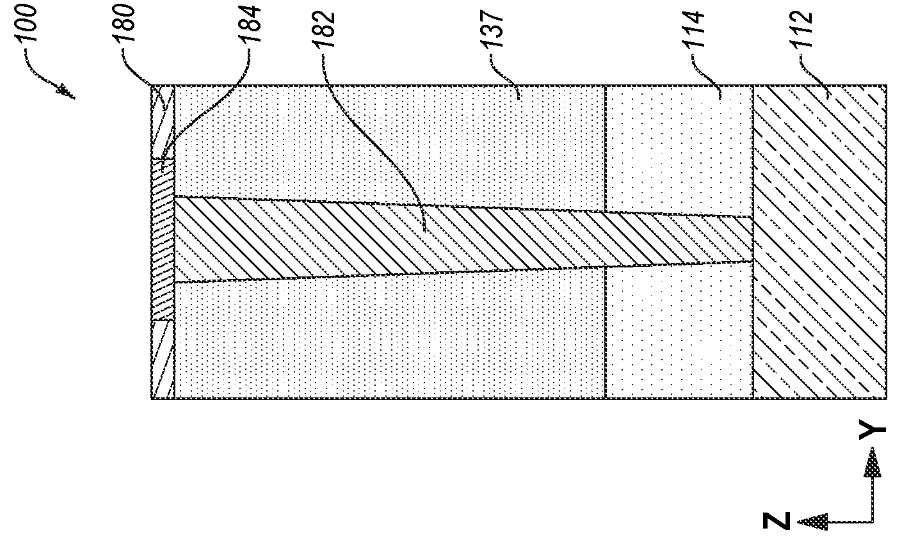
Figure 1G:
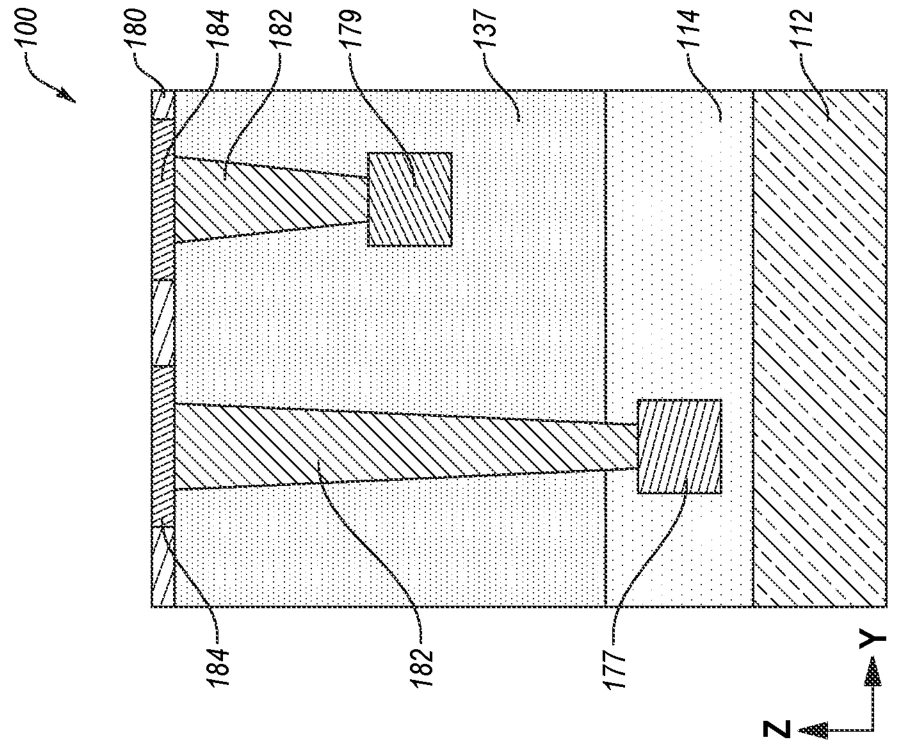

FIG. 1A is a simplified partial top-down view of the first microelectronic device structure 100; FIG. 1B is a simplified partial cross-sectional view of the first microelectronic device structure 100 taken through section line B-B of FIG. 1A; FIG. 1C is a simplified partial cross-sectional view of the first microelectronic device structure 100 taken through section line C-C of FIG. 1A; FIG. 1D is a simplified partial cross-sectional view of the first microelectronic device structure 100 taken through section line D-D of FIG. 1A; FIG. 1E is a simplified partial cross-sectional view of the first microelectronic device structure 100 taken through section line E-E of FIG. 1A; FIG. 1F is a simplified partial cross-sectional view of the first microelectronic device structure 100 taken through section line F-F of FIG. 1A; and FIG. 1G is a simplified partial cross-sectional view of the first microelectronic device structure 100 taken through section line G-G of FIG. 1A.

Referring to FIG. 1A, the first microelectronic device structure 100 includes a first array region 101 (also referred to herein as a "first memory array region") and one or more peripheral regions 103 located external to the first array region 101. In some embodiments, the peripheral regions 103 horizontally (e.g., in at least X-direction) surround the first array region 101. In some embodiments, the peripheral regions 103 substantially surround all horizontal sides of the first array region 101 in a first horizontal direction (e.g., the X-direction). In other embodiments, the peripheral regions 103 substantially surround all horizontal boundaries (e.g., an entire horizontal area) of the first array region 101.

The first array region 101 may include, for example, a first sense amplifier device region 105. The peripheral regions 103 may include, for example, a first column decoder region 107, a first multiplexer controller region 109, a first sense amplifier driver region 111, first input/output (I/O) device and socket regions 113, and a first additional electronic device region 115.

In some embodiments, the first column decoder region 107 directly horizontally neighbors (e.g., in the X-direction) the first sense amplifier device region 105 in a first horizontal direction; each of the first multiplexer controller region 109 and the first sense amplifier driver region 111 individually horizontally neighbors (e.g., in the X-direction) the first sense amplifier device region 105 in the first horizontal direction opposite the first column decoder region 107; a first input/output (I/O) device and socket region 113 horizontally neighbor (e.g., in the X-direction) the first column decoder region 107; another first the input/output (I/O) device and socket region 113 horizontally neighbors (e.g., in the X-direction) the first multiplexer controller region 109 and the first sense amplifier driver region 111; and the first additional electronic device region 115 horizontally neighbors (e.g., in the X-direction) one of the first input/output (I/O) device and socket regions 113.

The first sense amplifier device region 105 may include, for example, one or more of equalization (EQ) amplifiers, isolation (ISO) amplifiers, NMOS sense amplifiers (NSAs) (also referred to as N sense amplifiers), and PMOS sense amplifiers (PSAs) (also referred to as P sense amplifiers). As will be described in further detail herein, the devices and circuitry (e.g., sense amplifiers) of the first sense amplifier device region 105 may be coupled to global digit lines 108 within the first array region 101 for effectuating one or more control operations of memory cells (e.g., memory cells 120 (FIG. 1B)) of the first array region 101.

In some embodiments, the first sense amplifier device region 105 include column select devices configured for effectuating one or more control operations of memory cells (e.g., memory cells 120 (FIG. 1B)) within the first array region 101. In some such embodiments, the column select devices may be configured to send a column address signal to a bit line (e.g., conductive pillar structures 160 (FIG. 1B)) to selectively access desired memory cells within the first array region 101 for effectuating one or more control operations of the memory cells. The column select devices may be configured to be electrically coupled to sense amplifier devices of the first sense amplifier device region 105 with local input/output devices.

The first column decoder region 107 may include column decoder devices configured to receive, for example, an address signal from an address decoder or from an input/output device of the input/output (I/O) device and socket regions 113 and send a column select signal to a column select device (e.g., located within the first sense amplifier device region 105) or to a multiplexer driver device within the first multiplexer controller region 109.

The first multiplexer controller region 109 may include multiplexer control devices configured for effectuating operation of multiplexers (e.g., multiplexers 166 (FIG. 1B through FIG. 1D)) within the first array region 101. For example, the first multiplexer controller region 109 may include select devices (e.g., transistors) for selectively providing a current to multiplexers within the first array region 101.

The first sense amplifier driver region 111 may include NMOS sense amplifier drivers (RNL) and PMOS sense amplifier drivers (ACT). The NMOS sense amplifier drivers may generate, for example, activation signals for driving the NMOS sense amplifiers of the first sense amplifier device region 105 and the PMOS sense amplifier drivers may generate, for example, activation signals for driving the PMOS sense amplifiers of the first sense amplifier device region 105. By way of non-limiting example, NMOS sense amplifier drivers generate a low potential (e.g., ground) activation signal for activating an NMOS sense amplifier of the first sense amplifier device region 105 and the PMOS sense amplifier drivers generate a high potential (e.g., $V_{cc}$) activation signal for activating a PMOS sense amplifier of the first sense amplifier device region 105. However, the disclosure is not so limited and the NMOS sense amplifier drivers and the PMOS sense amplifier drivers may generate sense amplifier activation signals other than those described.

The first input/output (I/O) device and socket regions 113 may include one or more input/output devices configured for effectuating operation of a microelectronic device (e.g., microelectronic device 500 (FIG. 6A through FIG. 6F)). The one or more input/output devices may be coupled to, for example, a back end of line (BEOL) structure of the microelectronic device. The first input/output (I/O) device and socket regions 113 may further include electrically conductive interconnects to electrically connect circuitry of the first microelectronic device structure 100 to a second microelectronic device structure (e.g., second microelectronic device structure 200) (e.g., to input/output devices of the second microelectronic device structure) and to BEOL structures of the second microelectronic device structure.

The first additional electronic device region 115 may include one or more electronic devices such as, for example, one or more of pumps (e.g., $V_{CCP}$ charge pumps, $V_{NEGWL}$ charge pumps, DVC2 charge pumps), decoupling capacitors, voltage generators, and power supply terminals. In some embodiments, the first additional electronic device region 115 includes one or more capacitor structures, such as one or more decoupling capacitors. The first additional electronic device region 115 may also include interconnect structures for electrically connecting components of the first microelectronic device structure 100 to a second microelectronic device structure (e.g., second microelectronic device structure 200) (e.g., to input/output devices of the second microelectronic device structure) and to BEOL structures of the second microelectronic device structure.

With continued reference to FIG. 1A, each of the first column decoder region 107, the first multiplexer controller region 109, and the first sense amplifier driver region 111 include one or more staircase structures 174 including first conductive contact structures 176 for electrically coupling conductive structures 132 of a stack structure 135 extending horizontally (e.g., in the X-direction) into the respective ones of the first column decoder region 107, the first multiplexer controller region 109, and the first sense amplifier driver region 111 to one or more components of a second microelectronic device structure (e.g., the second microelectronic device structure 200 (FIG. 2A)). As described in further detail below, the one or more staircase structures 174 and the first conductive contact structures 176 may be vertically (e.g., in the Z-direction) over transistor structures (e.g., transistor structures 185 (FIG. 1C)) of each of the first column decoder region 107, the first multiplexer controller region 109, and the first sense amplifier driver region 111. The first column decoder region 107, the first multiplexer controller region 109, and the first sense amplifier driver region 111 may be located within first conductive contact exit regions 119 where the first conductive contact structures 176 exit the first microelectronic device structure 100 for electrically connecting to one or more components of a second microelectronic device structure.

With collective reference to FIG. 1A and FIG. 1B, global digit lines 108 (also referred to as "conductive lines") horizontally extend (e.g., in the Y-direction) through the first array region 101 and horizontally terminate at horizontally terminal ends (e.g., in the Y-direction) of the first array region 101 within second conductive contact exit regions 106. Each of the global digit lines 108 may individually be in electrical communication with a conductive contact structure 110 (FIG. 1A) at a horizontal end (e.g., in the Y-direction) of the global digit lines 108 within one of the second conductive contact exit regions 106.

The global digit lines 108 include first global digit lines 108A and second global digit lines 108B. The first global digit lines 108A may be referred to herein as "through global digit lines" and the second global digit lines 108B may be referred to herein as "reference global digit lines." The first global digit lines 108A and the second global digit lines 108B may collectively be referred to herein as "global digit lines." In some embodiments, the first global digit lines 108A are located on a first horizontal end (e.g., in the Y-direction) of the first microelectronic device structure 100 and the second global digit lines 108B are located on a second horizontal end (e.g., in the Y-direction) of the first microelectronic device structure 100 opposite the first horizontal end. For example, in the view illustrated in FIG. 1A, the first global digit lines 108A may be located in the upper horizontal half (e.g., in the Y-direction) of the first array region 101 and the second global digit lines 108B may be located in a lower horizontal half (e.g., in the Y-direction) of the first array region 101.

Each of the global digit lines 108 and the conductive contact structures 110 may individually be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the global digit lines 108 and the conductive contact structures 110 individually comprise tungsten. In other embodiments, the global digit lines 108 and the conductive contact structures 110 individually comprise copper.

With continued reference to FIG. 1A and FIG. 1B, within the first array region 101, the first microelectronic device structure 100 includes vertical (e.g., in the Z-direction) stacks of memory cells 120 over a first base structure 112. Each vertical stack of memory cells 120 comprises a vertical stack of access devices 130 and a vertical stack of storage devices 150, the storage devices 150 of the vertical stack of storage devices 150 coupled to the access devices 130 of the vertical stack of access devices 130. The vertical stacks of memory cells 120 may individually include vertically spaced (e.g., in the Z-direction) levels of memory cells 120, each memory cell 120 individually comprising a storage device 150 horizontally neighboring an access device 130. Although FIG. 1A illustrates seventy two (72) vertical stacks of memory cells 120 (e.g., eight (8) rows and nine (9) columns of vertical stacks of memory cells 120), the disclosure is not so limited, and the array region 101 may include greater than seventy two vertical stacks of memory cells 120.

The first base structure 112 may include a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such monocrystalline silicon or polycrystalline silicon; silicon-germanium; germanium; gallium arsenide; a gallium nitride; and indium phosphide). In some embodiments, the first base structure 112 comprises a silicon wafer.

In some embodiments, the first base structure 112 includes different layers, structures, devices, and/or regions formed therein and/or thereon. The first base structure 112 includes complementary metal-oxide-semiconductor (CMOS) circuitry and devices configured for effectuating operation of the vertical stacks of memory cells 120 of the first microelectronic device structure 100, such as within each of the first sense amplifier device region 105, the first column decoder region 107, the first multiplexer controller region 109, the first sense amplifier driver region 111, the first input/output (I/O) device and socket regions 113, and the first additional electronic device region 115.

With reference to FIG. 1B through FIG. 1D, each of the first sense amplifier device region 105, the first column decoder region 107, the first multiplexer controller region 109, and the first sense amplifier driver region 111 may be vertically below (e.g., in the Z-direction) the vertical stacks of memory cells 120. In some embodiments, the global digit lines 108 are vertically between (e.g., in the Z-direction) the vertical stacks of memory cells 120 and each of the first sense amplifier device region 105, the first column decoder region 107, the first multiplexer controller region 109, and the first sense amplifier driver region 111.

The first base structure 112 may be electrically isolated from the vertical stacks of memory cells 120 by a first insulative material 114 vertically intervening (e.g., in the Z-direction) between the first base structure 112 and the vertical stacks of memory cells 120. The first insulative material 114 may be formed of and include insulative material such as, for example, one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the first insulative material 114 comprises silicon dioxide.

Each of the first sense amplifier device region 105, the first column decoder region 107, the first multiplexer controller region 109, and the first sense amplifier driver region 111 may individually be located within a first control logic device region 121 located vertically below (e.g., in the Z-direction) the vertical stack of memory cells 120. Each of the first sense amplifier device region 105, the first column decoder region 107, the first multiplexer controller region 109, and the first sense amplifier driver region 111 may individually include transistor structures 185 formed within the first base structure 112 and vertically between (e.g., in the Z-direction) the first base structure 112 and the vertical stacks of memory cells 120. Horizontally neighboring (e.g., in the X-direction, in the Y-direction) transistor structures 185 are isolated from one another by isolation trenches 186 comprising the first insulative material 114.

The transistor structures 185 may each include conductively doped regions 188, each of which includes a source region 188A and a drain region 188B. Channel regions of the transistor structures 185 may be horizontally interposed between the conductively doped regions 188. In some embodiments, the conductively doped regions 188 of each transistor structure 185 individually comprises one or more semiconductive materials doped with at least one conductivity enhancing chemical species, such as at least one N-type dopant (e.g., one or more of arsenic, phosphorous, antimony, and bismuth) or at least one P-type dopant (e.g., one or more of boron, aluminum, and gallium). In some embodiments, the conductively doped regions 188 comprise conductively doped silicon.

The transistor structures 185 include gate structures 190 vertically overlying the first base structure 112 and horizontally extending between conductively doped regions 188. The conductively doped regions 188 and the gate structures 190 may individually be electrically coupled to first conductive interconnect structures 192. The first conductive interconnect structures 192 may individually electrically couple the conductively doped regions 188 and the gate structures 190 to one or more first routing structures 194.

The gate structures 190 may be horizontally aligned (e.g., in the Y-direction) with and shared by the channel regions of multiple transistor structures 185 horizontally neighboring (e.g., in the X-direction (FIG. 1A)) one another. In some such embodiments, the gate structures 190 extend in a first horizontal direction (e.g., in the Y-direction). In addition, dielectric material (also referred to herein as a "gate dielectric material") may be vertically interposed between the gate structures 190 and portions of the first base structure 112 at least partially defining the channel regions of the transistor structures 185. In FIG. 1B, the conductively doped regions 188 and the first conductive interconnect structures 192 in electrical communication with the conductively doped regions 188 are not illustrated, but it will be understood, that the conductively doped regions 188 and the first conductive interconnect structures 192 are located in a plane different than that in which the gate structures 190 extend. By way of non-limiting example, each gate structure 190 may be in electrical communication with a plurality of source regions 188A on a first side of the gate structure 190 (e.g., spaced from the gate structure 190 in the X-direction) and a plurality of drain regions 188B on a second, opposite side of the gate structure 190 (e.g., spaced from the gate structure 190 in the X-direction opposite the source regions 188A). At least some of the first routing structures 194 (e.g., the first routing structures 194) not in electrical communication with the first conductive interconnect structures 192 in electrical communication with the gate structure 190 may be in electrical communication with conductive interconnect structures 192 that are, in turn, in electrical communication with one of the source regions 188A or one of the drain regions 188B, as illustrated in FIG. 2C and FIG. 2D. With continued reference to FIG. 1B, two of each of the source regions 188A and the drain regions 188B, and four of the first conductive interconnect structures 192 are illustrated in broken lines to indicate that such source regions 188A, drain regions 188B, and first conductive interconnect structures 192 are located in a plane different than the plane in which the gate structure 190 illustrated in FIG. 1B extends.

Each of the gate structures 190, the first conductive interconnect structure 192, and the first routing structures 194 may individually be formed of and include conductive material, such as one or more of the materials described above with reference to the global digit lines 108. In some embodiments, the gate structures 190, the first conductive interconnect structure 192, and the first routing structures 194 are individually formed of and include tungsten. In other embodiments, the gate structures 190, the first conductive interconnect structure 192, and the first routing structures 194 are individually formed of and include copper.

The first insulative material 114 may be between the transistor structures 185 and electrical isolate different portions of the transistor structures 185, the first conductive interconnect structures 192, and the first routing structures 194.

With continued reference to FIG. 1B, the transistor structures 185 within the first sense amplifier device region 105 may form sense amplifier devices. In some embodiments, at least some of the transistor structures 185 of the first sense amplifier device region 105 are in electrical communication with the global digit lines 108 by means of the first routing structures 194 and second conductive interconnect structures 196. In some embodiments, each sense amplifier device of the first sense amplifier device region 105 includes a plurality of the transistor structures 185 and is in electrical communication with one of the first global digit lines 108A (e.g., through one of the transistor structures 185) and one of the second global digit lines 108B (e.g., through an additional one of the transistor structures 185). In use and operation (e.g., such as during a read operation), the sense amplifier devices of the first sense amplifier device region 105 are configured to amplify a signal (e.g., a difference in voltage) between the first global digit line 108A and the second global digit line 108B to which the sense amplifier device is connected.

With reference to FIG. 1C and FIG. 1D, the transistor structures 185 in each of the first column decoder region 107 and the first sense amplifier driver region 111 may be individually be in electrical communication with third conductive interconnect structures 198 that are, in turn, in electrical communication with second routing structures 199. The second routing structures 199 may be configured to electrically connect respective transistor structures 185 within a first region of the first microelectronic device structure 100 to another region of, for example, the first microelectronic device structure 100. By way of non-limiting example, at least some of the second routing structures 199 in electrical communication with transistor structures 185 within the first column decoder region 107 may be in electrical communication with transistor structures 185 of the first sense amplifier device region 105 and/or transistor structures 185 of the first multiplexer controller region 109; the second routing structures 199 in electrical communication with transistor structures 185 within the first sense amplifier driver region 111 may be in electrical communication with transistor structures 185 within the first sense amplifier device region 105; and the second routing structures 199 in electrical communication with transistor structures 185 within the first multiplexer controller region 109 may be in electrical communication with multiplexers (e.g., multiplexers 166 (FIG. 1B)) and/or with transistor structures 185 within the first column decoder region 107.

Each of the second conductive interconnect structures 196, the third conductive interconnect structures 198, and the second routing structures 199 may be formed of and include conductive material, such as one or more of the materials described above with reference to the first conductive interconnect structures 192. In some embodiments, each of the second conductive interconnect structures 196, the third conductive interconnect structures 198, and the second routing structures 199 are formed of and include tungsten. In other embodiments, each of the second conductive interconnect structures 196, the third conductive interconnect structures 198, and the second routing structures 199 are formed of and include copper.

Although FIG. 1C illustrates a cross-sectional view through the first multiplexer controller region 109, the cross-sectional view through section line H-H of FIG. 1A taken partially through the first sense amplifier driver region 111 may be substantially similar to the cross-sectional view illustrated in FIG. 1C.

Although FIG. 1A illustrates that the first multiplexer controller region 109 and the first sense amplifier driver region 111 each individually horizontally extend (e.g., in the Y-direction) along only a portion (e.g., about one-half) of the first sense amplifier device region 105 and that the first multiplexer controller region 109 and the first sense amplifier driver region 111 horizontally neighbor (e.g., in the Y-direction) each other, the disclosure is not so limited. In other embodiments, the first multiplexer controller region 109 and the first sense amplifier driver region 111 are substantially coextensive (e.g., in the Y-direction) with the first sense amplifier device region 105. The first multiplexer controller region 109 horizontally neighbors (e.g., in the X-direction) the first sense amplifier driver region 111, such as in the direction in which the conductive structures 132 extend. In some such embodiments, each of the first multiplexer controller region 109 and the first sense amplifier driver region 111 may individually have a horizontal dimension (e.g., in the X-direction) in the direction in which the conductive structures 132 extend about one-half of that illustrated in FIG. 1A and a horizontal dimension (e.g., in the Y-direction) in the direction in which the global digit lines 108 extend about two times of that illustrated in FIG. 1A.

With reference to FIG. 1B, each vertical stack of memory cells 120 comprises a vertical stack of access devices 130 and a vertical stack of storage devices 150. Each of the access devices 130 may individually be operably coupled to a conductive structure 132 (FIG. 1A through FIG. 1C) of a stack structure 135 (FIG. 1A, FIG. 1C) comprising levels of the conductive structures 132 (also referred to herein as "first conductive lines," "access lines," or "word lines") vertically (e.g., in the Z-direction) spaced from one another by one or more insulative structures.

The access devices 130 may each individually comprise a channel material 134 between a source material 136 and a drain material 138. The channel material 134 may be horizontally (e.g., in the X-direction) between the source material 136 and the drain material 138. The source material 136 and the drain material 138 may each individually comprise a semiconductive material (e.g., polysilicon) doped with at least one N-type dopant, such as one or more of arsenic ions, phosphorous ions, and antimony ions. In other embodiments, the source material 136 and the drain material 138 each individually comprise a semiconductive material doped with at least one P-type dopant, such as boron ions.

In some embodiments, the channel material 134 comprises a semiconductive material (e.g., polysilicon) doped with at least one N-type dopant or at least one P-type dopant. In some embodiments, the channel material 134 is doped with one of at least one N-type dopant and at least one P-type dopant and each of the source material 136 and the drain material 138 are each individually doped with the other of the at least one N-type dopant and the at least one P-type dopant.

The conductive structures 132 may extend horizontally (e.g., in the X-direction; FIG. 1C) through the vertical stacks of memory cells 120 as lines and may each be configured to be operably coupled to a vertically (e.g., in the Z-direction) neighboring channel material 134 of the vertically neighboring (e.g., in the Z-direction) access devices 130. In other words, a conductive structure 132 may be configured to be operably coupled to a vertically neighboring access device 130.

The conductive structures 132 may be configured to provide sufficient current through a channel region (e.g., channel material 134) of each of the access devices 130 to electrically couple a horizontally neighboring (e.g., in the Y-direction) and associated storage device 150 to, for example, a conductive pillar structure (e.g., conductive pillar structure 160) vertically extending (e.g., in the Z-direction) through the vertical stack of access devices 130 of the vertical stack of memory cells 120. The stack structure 135 including the vertically spaced conductive structures 132 may intersect the vertical stacks of memory cells 120, such as the vertical stacks of the access devices 130 of the vertical stacks of memory cells 120, each of the conductive structures 132 of the stack structure 135 intersecting a level (e.g., a tier) of the memory cells 120 of the vertical stack of memory cells 120. With reference to FIG. 1A, each stack structure 135 individually extends through several vertical stacks of access devices 130 of the vertical stacks of memory cells 120. In some embodiments, each stack structure 135 extends through horizontally neighboring (e.g., in the X-direction) vertical stacks of memory cells 120. In some embodiments, the stack structures 135 extending in a first horizontal direction (e.g., in the X-direction) are spaced from each other in a second horizontal direction (e.g., in the Y-direction).

Although FIG. 1A and FIG. 1B illustrate that conductive structures 132 of the stack structure 135 individually intersect and form portions of nine (9) of the vertical stacks of memory cells 120, the disclosure is not so limited. In other embodiments, conductive structures 132 of the stack structure 135 individually intersect and form portions of fewer than nine (9) of the vertical stacks of memory cells 120, such as fewer than or equal to eight (8) of the vertical stacks of the memory cells 120, fewer than or equal to six (6) of the vertical stacks of the memory cells 120, or fewer than or equal to four (4) of the vertical stacks of the memory cells 120. In other embodiments, the conductive structures 132 of the stack structure 135 individually intersect and form portions of more than nine (9) of the vertical stacks of the memory cells 120, such as more than or equal to ten (10) of the vertical stacks of the memory cells 120, more than or equal to twelve (12) of the vertical stacks of the memory cells 120, more than or equal to sixteen (16) of the vertical stacks of the memory cells 120, or more than or equal to twenty (20) of the vertical stacks of the memory cells 120.

The conductive structures 132 may individually be formed of and include conductive material, such as one or more of the materials described above with reference to the global digit lines 108. In some embodiments, the conductive structures 132 are individually formed of and include tungsten. In other embodiments, the conductive structures 132 are individually formed of and include copper.

The channel material 134 may be separated from the conductive structures 132 by a dielectric material 140, which may also be referred to herein as a "gate dielectric material." The dielectric material 140 may be formed of and include insulative material. By way of non-limiting example, the dielectric material 140 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material), a dielectric carbon nitride material (e.g., silicon carbon nitride (SiCN)), or a dielectric carboxynitride material (e.g., silicon carboxynitride (SiOCN)). In other embodiments, the channel material 134 directly contacts a vertically neighboring conductive structure 132.

In some embodiments, insulative structures 137 and additional insulative structures 139 vertically (e.g., in the Z-direction) intervene between vertically neighboring access devices 130 and vertically neighboring storage devices 150. The additional insulative structures 139 may horizontally (e.g., in the Y-direction) neighbor each of the conductive structures 132. With reference to FIG. 1C, the levels of the conductive structures 132 vertically alternate with the levels of the insulative structures 137. For clarity and ease of understanding the description, in FIG. 1C, the levels of the insulative structures 137 are illustrated as comprising an integral structure. In other embodiments, the levels of the insulative structures 137 may exhibit distinct boundaries at interfaces of the levels of the conductive structures 132.

The insulative structures 137 may individually be formed of and include insulative material. In some embodiments, the insulative structures 137 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 137 comprise silicon dioxide. Each of the insulative structures 137 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 137 exhibits a substantially homogeneous distribution of insulative material. In additional embodiments, at least one of the insulative structures 137 exhibits a substantially heterogeneous distribution of at least one insulative material. The insulative structures 137 may, for example, be formed of and include a stack (e.g., laminate) of at least two different insulative materials. The insulative structures 137 may each be substantially planar, and may each individually exhibit a desired thickness.

The additional insulative structures 139 may be formed of and include an insulative material that is different than, and that has an etch selectivity with respect to, the insulative structures 137. In some embodiments, the additional insulative structures 139 are formed of and include a nitride material (e.g., silicon nitride ($Si_3N_4$)) or an oxynitride material (e.g., silicon oxynitride). In some embodiments, the additional insulative structures 139 comprise silicon nitride. In other embodiments, the additional insulative structures 139 comprise substantially the same material composition as the insulative structures 137. In some embodiments, the additional insulative structures 139 comprise silicon dioxide.

In some embodiments, the storage devices 150 are in electrical communication with a conductive structure 142

(not illustrated in FIG. 1A for clarity and ease of understanding the description). The conductive structure 142 may be formed of and include conductive material, such as one or more of the materials of an electrode (e.g., a second electrode 154) of the storage devices 150. In some embodiments, the conductive structure 142 comprises substantially the same material composition as an electrode of the storage devices 150. In other embodiments, the conductive structure 142 comprises a different material composition than the electrodes of the storage devices 150. The conductive structures 142 may be referred to herein as "conductive plates" or "ground structures."

With continued reference to FIG. 1B, one of the storage devices 150 along with neighboring structures are illustrated in enlarged box 155. In some embodiments, each of the storage devices 150 individually comprises a first electrode 152 (also referred to herein as an "outer electrode," "a first electrode plate," or a "first node structure"), a second electrode 154 (also referred to herein as an "inner electrode," "a second electrode plate," or a "second node structure"), and a dielectric material 156 between the first electrode 152 and the second electrode 154. In some such embodiments, the storage devices 150 individually comprise capacitors. However, the disclosure is not so limited and in other embodiments, the storage devices 150 may each individually comprise other structures, such as, for example, phase change memory (PCM), resistance random-access memory (RRAM), conductive-bridging random-access memory (conductive bridging RAM), or another structure for storing a logic state.

The first electrode 152 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium), polysilicon, and other materials exhibiting electrical conductivity. In some embodiments, the first electrode 152 comprises titanium nitride.

The second electrode 154 may be formed of and include conductive material. In some embodiments, the second electrode 154 comprises one or more of the materials described above with reference to the first electrode 152. In some embodiments, the second electrode 154 comprises substantially the same material composition as the first electrode 152.

The dielectric material 156 may be formed of and include one or more of silicon dioxide ($SiO_2$), silicon nitride ($Si_3N_4$), polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT)), and a high-k dielectric material.

The second electrode 154 may be in electrical communication with one of the conductive structures 142 of a vertical stack of memory cells 120. In some embodiments, the conductive structures 142 are individually formed of conductive material, such as one or more of the materials of the second electrode 154. In some embodiments, the conductive structures 142 comprise substantially the same material composition as the second electrode 154. In other embodiments, the conductive structures 142 comprise a different material composition than the second electrode 154.

With continued reference to FIG. 1A and FIG. 1B, the first microelectronic device structure 100 may include conductive pillar structures 160 vertically extending (e.g., in the Z-direction) through the first microelectronic device structure 100. The conductive pillar structures 160 may also be referred to herein as "digit lines," "second conductive lines," "digit line pillar structures," "local digit lines," or "vertical digit lines." The conductive pillar structures 160 may be electrically coupled to the access devices 130 to facilitate operation of the memory cells 120 of a vertical stack of memory cells 120. Stated another way, each conductive pillar structure 160 vertically extends through access devices 130 of a vertical stack of memory cells 120.

In some, the conductive pillar structures 160 in horizontally neighboring (e.g., in the Y-direction) stack structures 135 are horizontally aligned (e.g., in the X-direction) with each other. In other embodiments, conductive pillar structures 160 in horizontally neighboring (e.g., in the Y-direction) stack structures 135 are horizontally aligned (e.g., in the X-direction) with each other.

The conductive pillar structures 160 may individually be formed of and include conductive material, such as one or more of a metal (e.g., one or more of tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the conductive pillar structures 160 comprise tungsten.

With reference still to FIG. 1B, in some embodiments, each global digit line 108 (FIG. 1A, FIG. 1B) may be in electrical communication with one or more global digit line contact structures 162 that are, in turn, individually in electrical communication with a conductive structure 164 to selectively couple the respective global digit line 108 to one of the conductive pillar structures 160 through a multiplexer 166, illustrated in box 168. In some embodiments, the multiplexers 166 may facilitate selective provision of a voltage from a conductive pillar structure 160 to which it is electrically connected (by means of the global digit line contact structure 162) to selectively provide the voltage of the conductive pillar structure 160 to the global digit line 108 through the multiplexer 166. In other words, the global digit lines 108 are configured to be selectively electrically connected to the conductive pillar structures 160 by means of the multiplexers 166. Accordingly, the global digit lines 108 are configured to be selectively electrically connected to conductive pillar structures 160 vertically extending (e.g., in the Z-direction) through a respective vertical stack of memory cells 120 by applying a voltage to the multiplexer 166 electrically connecting the global digit line 108 to the particular conductive pillar structure 160 by means of the global digit line contact structure 162 and the conductive structures 164 between the global digit line 108 and the multiplexer 166 associated with the particular conductive pillar structure 160. The multiplexers 166 may be driven by a multiplexer driver and/or a multiplexer control logic device operably coupled the conductive structure 132 to which the multiplexer 166 is coupled (e.g., the conductive structure 132 vertically above (e.g., in the Z-direction) the multiplexer 166). For example, and as described in further detail herein, the multiplexers 166 may be coupled to one or more structures (e.g., transistor structures 185) within the first multiplexer controller region 109 to selectively drive the multiplexers 166.

Each global digit line 108 may be configured to be selectively coupled to more than one of the conductive pillar structures 160 by means of the multiplexers 166 coupled to each of the conductive pillar structures 160. In some embodiments, each global digit line 108 is configured to selectively be in electrical communication with four (4) of the conductive pillar structures 160, each one of which is associated with a different stack structure 135. In other embodiments, each of the global digit lines 108 is configured to selectively be in electrical communication with eight (8) of the conductive pillar structures 160 or sixteen (16) of the conductive pillar structures 160. One of the multiplexers 166 may be located between (e.g., horizontally between) a conductive pillar structure 160 and a horizontally neighboring conductive structure 164 that is, in turn, in electrical communication with a global digit line 108 by means of a global digit line contact structure 162. In some embodiments, the multiplexers 166 are individually configured to receive a signal (e.g., a select signal) from a multiplexer controller region (e.g., multiplexer controller region 109) and provide the signal to a bit line (e.g., conductive pillar structures 160 (FIG. 1B)) to selectively access desired memory cells within the first array region 101 for effectuating one or more control operations of the memory cells 120.

In some embodiments, the global digit line contact structures 162 and the conductive structures 164 individually comprise a conductive material, such as a material exhibiting a relatively low resistance value to facilitate an increased speed (e.g., low RC delay) of data transmission. In some embodiments, the global digit line contact structures 162 and the conductive structures 164 individually comprise copper. In other embodiments, the global digit line contact structures 162 and the conductive structures 164 individually comprise tungsten. In yet other embodiments, the global digit line contact structures 162 and the conductive structures 164 individually comprise titanium nitride.

The global digit lines 108 and at least a portion of each of the global digit line contact structures 162 may be formed within the first insulative material 114.

In some embodiments, an access device 130 vertically (e.g., in the Z-direction) neighboring (e.g., vertically above) the multiplexer 166 may comprise a transistor 170, one of which is illustrated in box 171, configured to electrically couple horizontally neighboring (e.g., in the X-direction) conductive pillar structure 160 to the conductive structure 142 through an additional conductive structure 172. In some embodiments, the multiplexers 166 are individually configured to receive a signal (e.g., a select signal) from a multiplexer controller region (e.g., the multiplexer controller region 109) and provide the signal to a bit line (e.g., conductive pillar structures 160 (FIG. 1B)) to selectively access desired memory cells within the first array region 101 for effectuating one or more control operations of the memory cells 120.

The transistor 170 may comprise a so-called “bleeder” transistor or a “leaker” transistor configured to provide a bias voltage to the conductive pillar structures 160 to which it is coupled (e.g., the horizontally neighboring (e.g., in the X-direction) conductive pillar structures 160). In some embodiments, the conductive structure 132 coupled to the transistors 170 may be in electrical communication with a voltage, such as a drain voltage $V_{dd}$ or a voltage source supply $V_{ss}$. In use and operation, the transistors 170 are configured to provide a negative voltage to the conductive pillar structures 160 of unselected (e.g., inactive) vertical stacks of memory cells 120. In other words, the transistors 170 are configured to electrically connect unselected conductive pillar structures 160 with their respective conductive structures 142 (e.g., ground structures, cell plates), which may be coupled to a negative voltage. In some embodiments, each vertical stack of memory cells 120 comprises one multiplexer 166 and one transistor 170. In some embodiments, each vertical stack of memory cells 120 includes at least one (e.g., one) of the multiplexers 166 and at least one (e.g., one) of the transistors 170.

The additional conductive structure 172 may comprise one or more of the conductive materials described above with reference to the conductive structures 164. In some embodiments, the additional conductive structure 172 comprises substantially the same material composition as the conductive structure 164. In some embodiments, the additional conductive structure 172 comprises copper. In other embodiments, the additional conductive structure 172 comprises tungsten. In yet other embodiments, the additional conductive structure 172 comprises titanium nitride.

With reference to FIG. 1B and FIG. 1C, in some embodiments, the global digit lines 108 may be located vertically below (e.g., in the Z-direction) the stack structures 135 and the vertical stacks of memory cells 120. In some embodiments, the vertical stacks of memory cells 120 are vertically spaced from the first base structure 112 a greater vertical distance than the global digit lines 108.

With reference to FIG. 1A and FIG. 1C, the conductive structures 132 of the stack structure 135 may horizontally (e.g., in the X-direction) terminate at staircase structures 174 located at horizontally (e.g., in the X-direction) terminal portions of the stack structure 135. While the staircase structures 174 are illustrated in FIG. 1A, it will be understood that the staircase structures 174 are located beneath a vertically upper (e.g., in the Z-direction) surface of the first microelectronic device structure 100. With reference to FIG. 1C, vertically higher (e.g., in the Z-direction) conductive structures 132 may have a smaller horizontal dimension (e.g., in the X-direction) than vertically lower conductive structures 132, such that horizontal edges of the conductive structures 132 at least partially define steps 175 of the staircase structures 174. In some embodiments, the memory cells 120 of the vertical stack of memory cells 120 that are vertically higher (e.g., in the Z-direction) than other memory cells 120 comprise and are intersected by conductive structures 132 having a smaller horizontal dimension (e.g., in the X-direction) than conductive structures 132 of vertically lower memory cells 120 of the vertical stacks of memory cells 120. In some embodiments, a horizontal dimension (e.g., in the X-direction) of the conductive structures 132 of the multiplexers 166 may be greater than a horizontal dimension of the conductive structures 132 of the transistors 170, which may be greater than a horizontal dimension of the conductive structures 132 intersecting the memory cells 120. As described in further detail herein, in some embodiments, vertically lowermost (e.g., in the Z-direction) (e.g., the two vertically lowermost) conductive structures 132 associated with the transistor multiplexer 166 and the transistor 170 may have a relatively smaller horizontal dimension (e.g., in the Z-direction) to facilitate electrically connecting such conductive structures 132 (e.g., by means of fourth conductive interconnect structures 125 (FIG. 1C)) to vertically underlying (e.g., in the Z-direction) transistor structures 185 of the first multiplexer controller region 109.

In some embodiments, the global digit lines 108 are located vertically below (e.g., in the Z-direction) the staircase structures 174. The global digit lines 108 may be located vertically closer (e.g., in the Z-direction) to conductive structures 132 having a greater horizontal dimension (e.g., in the X-direction) than conductive structures 132 having a relatively shorted horizontal dimension (e.g., in the X-direction).

The staircase structures 174 may be located within one or more of the first column decoder region 107, the first multiplexer controller region 109, and the first sense amplifier driver region 111. Stated another way, each of the first column decoder region 107, the first multiplexer controller region 109, and the first sense amplifier driver region 111 may include at least a portion of (e.g., all of) one or more of the staircase structures 174. With reference to FIG. 1A, in some embodiments, the staircase structures 174 of each of the stack structures 135 are horizontally aligned in a first direction (e.g., in the X-direction) and horizontally offset in a second direction (e.g., the Y-direction). In some such embodiments, each stack structure 135 individually include a staircase structure 174 at a first horizontal end (e.g., in the X-direction) of the stack structure 135 and an additional staircase structure 174 at a second, opposite horizontal end (e.g., in the X-direction) of the stack structure 135. In some such embodiments, each stack structure 135 may individually include a staircase structure 174 within the first column decoder region 107 and an additional staircase structure 174 within one of the first multiplexer controller region 109 or the first sense amplifier driver region 111. In some such embodiments, each of the stack structures 135 individually includes two (2) staircase structures 174.

In other embodiments, the staircase structures 174 of horizontally neighboring (e.g., in the Y-direction) stack structures 135 may be located at opposing horizontal ends (e.g., in the X-direction) of the first microelectronic device structure 100. In some such embodiments, every other stack structure 135 (e.g., in the Y-direction) includes a staircase structure 174 at a first horizontal end (e.g., in the X-direction) of the first microelectronic device structure 100 while the other of the stack structures 135 individually includes a staircase structure 174 at a second horizontal end (e.g., in the X-direction) of the first microelectronic device structure 100 opposite the first horizontal end. Stated another way, the staircase structures 174 of horizontally neighboring (e.g., in the Y-direction) stack structures 135 may alternate between a first horizontal end (e.g., in the X-direction) of the first microelectronic device structure 100 and a second horizontal end (e.g., in the X-direction) of the first microelectronic device structure 100, the second horizontal end opposing the first horizontal end.

Although FIG. 1A illustrates two staircase structures 174 for every stack structure 135 (e.g., a staircase structure 174 at each horizontal end (e.g., in the X-direction) of each stack structure 135), the disclosure is not so limited. In other embodiments, each stack structure 135 may include one staircase structure 174, and each of the staircase structures 174 may be located at a same horizontal end (e.g., in the X-direction) of the stack structures 135. In some such embodiments, the staircase structures 174 may each be located in the first column decoder region 107; or the staircase structures 174 may be individually be located in one of the first multiplexer controller region 109 or the first sense amplifier driver region 111.

The quantity of the steps 175 of the staircase structures 174 may correspond to the quantity of the levels of memory cells 120 of the vertical stack (minus one level for the multiplexers 166 and one level for the transistors 170). Although FIG. 1A and FIG. 1C illustrate that the staircase structures 174 individually comprise a particular number (e.g., six (6)) steps 175, the disclosure is not so limited. In other embodiments, the staircase structures 174 each individually include a desired quantity of the steps 175, such as within a range from thirty-two (32) of the steps 175 to two hundred fifty-six (256) of the steps 175. In some embodiments, the staircase structures 174 each individually include sixty-four (64) of the steps 175. In other embodiments, the staircase structures 174 each individually include ninety-six (96) or more of the steps 175. In other embodiments, the staircase structures 174 each individually include a different number of the steps 175, such as less than sixty-four (64) of the steps 175 (e.g., less than or equal to sixty (60) of the steps 175, less than or equal to fifty (50) of the steps 175, less than about forty (40) of the steps 175, less than or equal to thirty (30) of the steps 175, less than or equal to twenty (20) of the steps 175, less than or equal to ten (10) of the steps 175); or greater than sixty-four (64) of the steps 175 (e.g., greater than or equal to seventy (70) of the steps 175, greater than or equal to one hundred (100) of the steps 175, greater than or equal to about one hundred twenty-eight (128) of the steps 175, greater than two hundred fifty-six (256) of the steps 175).

In some embodiments, the staircase structures 174 each individually include the same quantity of the steps 175. In some such embodiments, staircase structures 174 of the same stack structure 135 include the same quantity of the steps 175. In some embodiments, each step 175 of each staircase structure 174 of a stack structure 135 may be vertically offset (e.g., in the Z-direction) from a vertically neighboring step 175 of the staircase structure 174 by one level (e.g., one tier) of the vertically alternating conductive structures 132 and insulative structures 137. In some such embodiments, every conductive structure 132 of the stack structure 135 may comprise a step 175 at each horizontal end (e.g., in the X-direction) of the staircase structures 174 of the stack structure 135. In other embodiments, vertically neighboring (e.g., in the Z-direction) steps 175 of a staircase structure 174 on a first horizontal size (e.g., in the X-direction) of a stack structure 135 may be vertically offset (e.g., in the Z-direction) by two levels (e.g., two tiers) of the vertically alternating conductive structures 132 and insulative structures 137. In some such embodiments, the steps 175 of each staircase structure 174 are formed of every other conductive structure 132 of the stack structure 135 and the steps 175 of staircase structures 174 at horizontally opposing ends (e.g., in the X-direction) of the same stack structure 135 may be defined by conductive structures 132 that are vertically spaced (e.g., in the Z-direction) from one another by one level of a conductive structure 132 and an insulative structure 137.

With continued reference to FIG. 1A and FIG. 1C, first conductive contact structures 176 may be in electrical communication with individual conductive structures 132 at the steps 175. For example, the first conductive contact structures 176 may individually physically contact (e.g., land on) portions of upper surfaces of the conductive structures 132 at least partially defining treads of the steps 175. In some embodiments, every other step 175 of each staircase structure 174 may be in electrical communication with a first conductive contact structure 176. In some such embodiments, each stack structure 135 includes one staircase structure 174 at each horizontal (e.g., in the X-direction) end thereof and every other step 175 of each staircase structure 174 is individually in contact with a first conductive contact structure 176. Each conductive structure 132 of a first staircase structure 174 at a first horizontal end of the stack structure 135 not in electrical communication with a first conductive contact structure 176 may individually be in electrical communication with a first conductive contact structure 176 at steps 175 of a second staircase structure 174 at a second, opposite horizontal end of the stack structure 135. In other embodiments, each step 175 of each staircase structure 174 may be in electrical communication with a first conductive contact structure 176 at the horizontal (e.g., in the X-direction) end of the staircase structure 174.

The first conductive contact structures 176 may individually be formed of and include conductive material, such as one or more of the materials described above with reference to the conductive pillar structures 160. In some embodiments, the first conductive contact structures 176 comprise substantially the same material composition as the conductive pillar structures 160. In other embodiments, the first conductive contact structures 176 comprise a different material composition than the conductive pillar structures 160. In some embodiments, the first conductive contact structures 176 comprise tungsten.

First pad structures 178 may vertically overlie and individually be in electrical communication with of the first conductive contact structures 176. Each of the first conductive contact structures 176 is individually in electrical communication with one of the first pad structures 178. The first pad structure 178 may be formed within a second insulative material 180.

The first pad structures 178 may individually be formed of and include conductive material, such as one or more of the materials described above with reference to the global digit lines 108. In some embodiments, the first pad structures 178 are formed of and include tungsten. In other embodiments, the first pad structures 178 are formed of and include copper.

With continued reference to FIG. 1C, in some embodiments, the conductive structures 132 in electrical communication with the multiplexers 166 may be in electrical communication with transistor structures 185 within the first multiplexer controller region 109 by means of fourth conductive interconnect structures 125. In addition, the conductive structures 132 in electrical communication with the transistors 170 may be in electrical communication with transistor structures 185 within the first multiplexer controller region 109 by means of other fourth conductive interconnect structures 125. In some embodiments, the conductive structure 132 in electrical communication with the multiplexer 166 and the conductive structure 132 in electrical communication with the transistor 170 may each individually exhibit a horizontal dimension (e.g., in the X-direction) to facilitate electrically connecting the respective conductive structures 132 with a transistor structure 185 within the first multiplexer controller region 109 by means of a fourth conductive interconnect structure 125 without shorting to a vertically neighboring (e.g., in the Z-direction) conductive structure 132. In other embodiments, the vertically lowermost conductive structure 132 may be in electrical communication with one of the fourth conductive interconnect structures 125 at a first horizontal end (e.g., in the X-direction) of the stack structure 135 and the next vertically lowermost conductive structures 132 may be in electrical communication with a fourth conductive interconnect structure 125 at an opposite horizontal end (e.g., in the X-direction) of the stack structure 135. In some embodiments, the two vertically lowermost conductive structures 132 may have substantially the same horizontal dimension, but may protrude farther from the other of the two vertically lowermost conductive structures 132 at a first horizontal end of the stack structure 135 and less than the other lowermost conductive structure 132 at a second horizontal end of the stack structure 135 such that each of the two lowermost conductive structures 132 are in electrical communication with one of the fourth conductive interconnect structures 125 without electrically shorting to one another.

FIG. 1D is a simplified partial cross-sectional view of the first microelectronic device structure 100 taken through section line D-D of FIG. 1A through a different portion of the first column decoder region 107, the first sense amplifier device region 105, and the first multiplexer controller region 109 than that illustrated in FIG. 1C. The cross-section of FIG. 1D is taken through the access devices 130 of the vertical stack of memory cells 120 but horizontally offset (e.g., in the Y-direction) from the stack structure 135 including the conductive structures 132.

With reference to FIG. 1E and FIG. 1F, one or more fifth conductive interconnect structures 182 vertically extend (e.g., in the Z-direction) through the insulative structures 137 and the first insulative material 112 to contact the first base structure 112 within the first input/output (I/O) device and socket regions 113.

A second pad structure 184 may vertically overlie and individually be in electrical communication with one of the fifth conductive interconnect structures 182. The second pad structures 184 may be located within the second insulative material 180.

With reference to FIG. 1G, within the first additional electronic device region 115, at least some of the fifth conductive interconnect structures 182 are in electrical communication with capacitor structures 177 (not illustrated in FIG. 1A) and at least some of the fifth conductive interconnect structures 182 are in electrical communication with pump structures 179 (not illustrated in FIG. 1A). In some embodiments, the capacitor structures 177 are substantially similar to the storage devices 150 within the first array region 101, but are not configured to be in electrical communication with a conductive structure 132 or a conductive pillar structure 160. In some embodiments, the pump structures 179 comprise one or more transistor structures substantially similar to the transistor structures 185.

The fifth conductive interconnect structures 182 may individually be formed of and include conductive material, such as, for example, one or more of the materials described above with reference to the global digit lines 108. In some embodiments, the fifth conductive interconnect structures 182 individually comprise tungsten.

The second pad structures 184 may be formed of and include conductive material, such as one or more of the materials of the first pad structures 178. In some embodiments, the second pad structures 184 individually comprise substantially the same material composition as the first pad structures 178. In some embodiments, the second pad structures 184 are formed of and include tungsten. In other embodiments, the second pad structures 184 are formed of and include copper.

With collective reference to FIG. 1B through FIG. 1G, the second insulative material 180 vertically overlies the first microelectronic device structure 100. As described in further detail herein, the second insulative material 180 may facilitate attaching (e.g., bonding) the first microelectronic device structure 100 to a second microelectronic device structure (e.g., the second microelectronic device structure 200 (FIG. 2A)).

The second insulative material 180 may be formed of and include one or more of the materials described above with reference to the first insulative material 114. In some embodiments, the second insulative material 180 comprises substantially the same material composition as the first insulative material 114. In some embodiments, the second insulative material 180 comprises silicon dioxide.

FIG. 2A through FIG. 2M are simplified partial cross-sectional views illustrating a second microelectronic device structure 200, in accordance with embodiments of the disclosure. Components of the second microelectronic device structure 200 that are similar to corresponding components of the first microelectronic device structure 100 may retain the same numerical designation, except that reference numerals 1XX are replaced with 2XX. Put another way, in FIG. 2A through FIG. 2M and the associated description, features (e.g., structures, materials, devices, regions) of the second microelectronic device structure 200 functionally similar to previously described features (e.g., structures, materials, devices, regions) of the first microelectronic device structure 100 described with reference to FIG. 1A through FIG. 1G are referred to with similar reference numerals incremented by 100. To avoid repetition, not all features shown in FIG. 2A through 2M are described in detail herein. Rather, unless described otherwise below, in FIG. 2A through 2M, a feature designated by a reference numeral that is a 100 increment of the reference numeral of a feature previously described with reference to one or more of FIG. 1A through FIG. 1G will be understood to be substantially similar to the previously described feature. By way of non-limiting example, unless described otherwise below, a feature designated by the reference numeral 230 in FIG. 2A will be understood to be substantially similar to one of the access devices 130 (including the channel material 134, the source material 136, and the drain material 138 thereof) previously described herein with reference to FIG. 1A and FIG. 1B. The second microelectronic device structure 200 may also be referred to herein as a second die or a second semiconductive wafer.

Figure 2A:
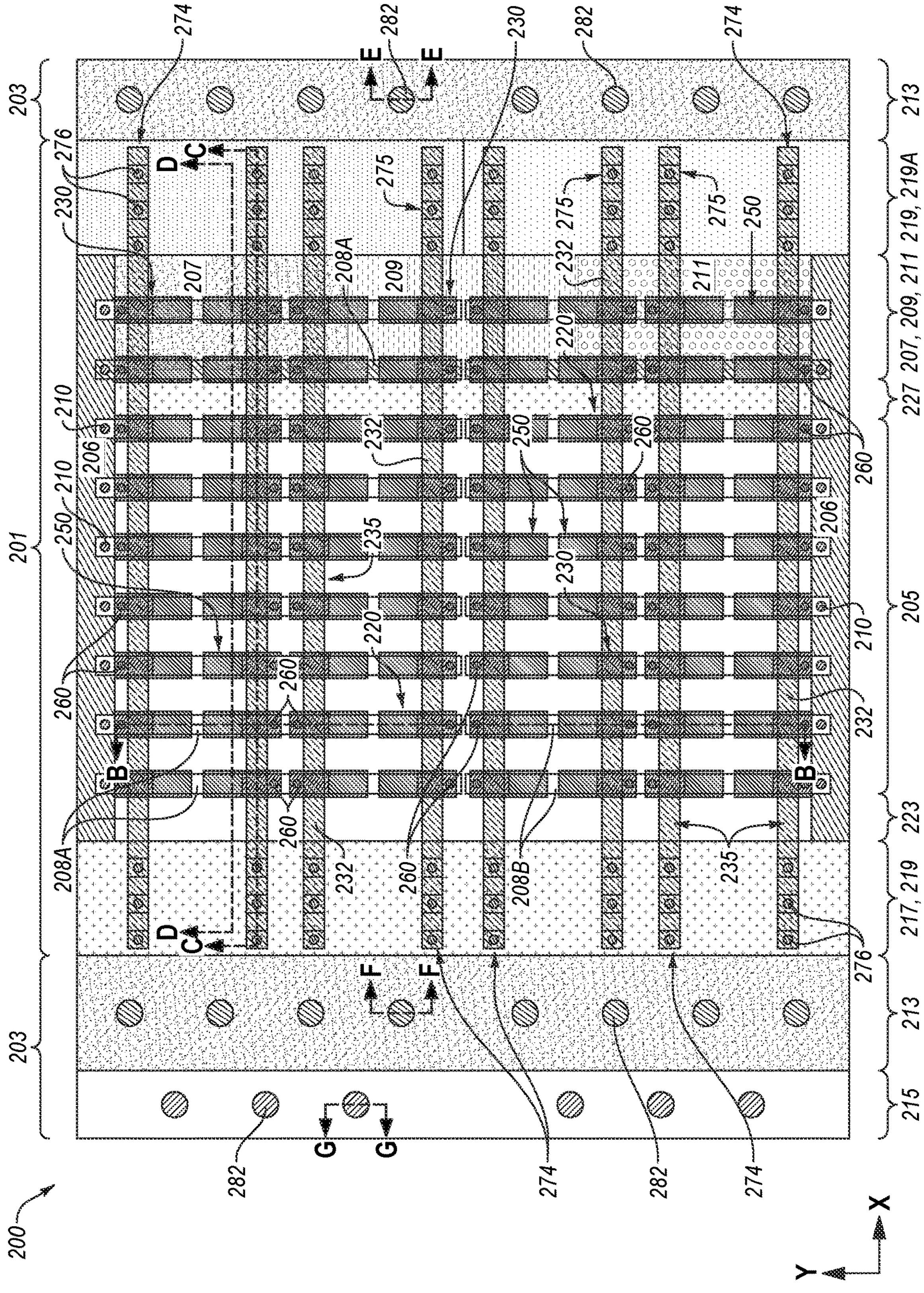
FIG. 2A through FIG. 2M include a simplified, partial top-down view (FIG. 2A) and simplified partial cross-sectional views (FIG. 2B through FIG. 2M) illustrating a second microelectronic device structure and a method of attaching a carrier wafer assembly to the second microelectronic device structure to form a first microelectronic device structure assembly, in accordance with embodiments of the disclosure.
Figure 2B:
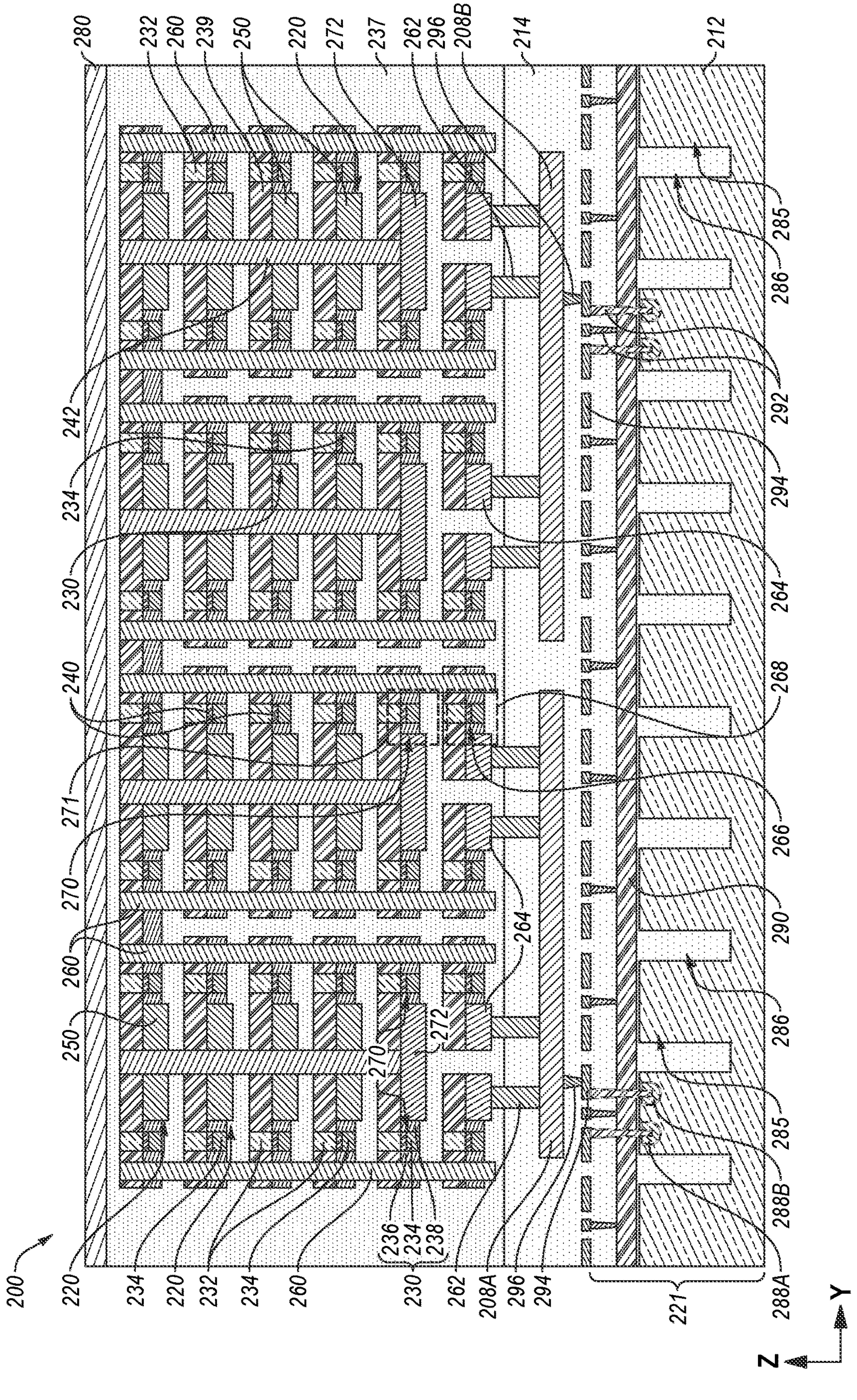
Figure 2C:
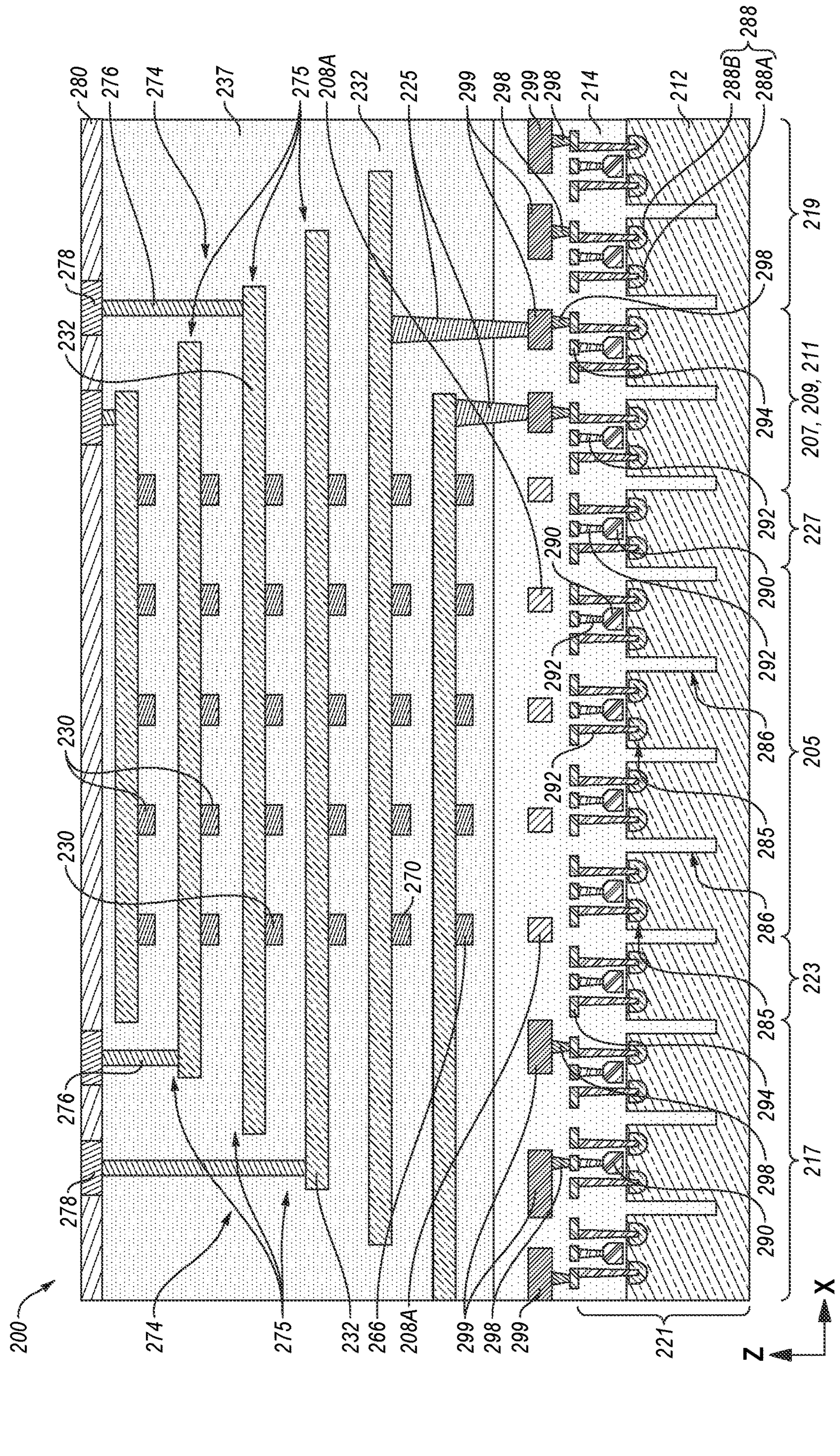
Figure 2D:
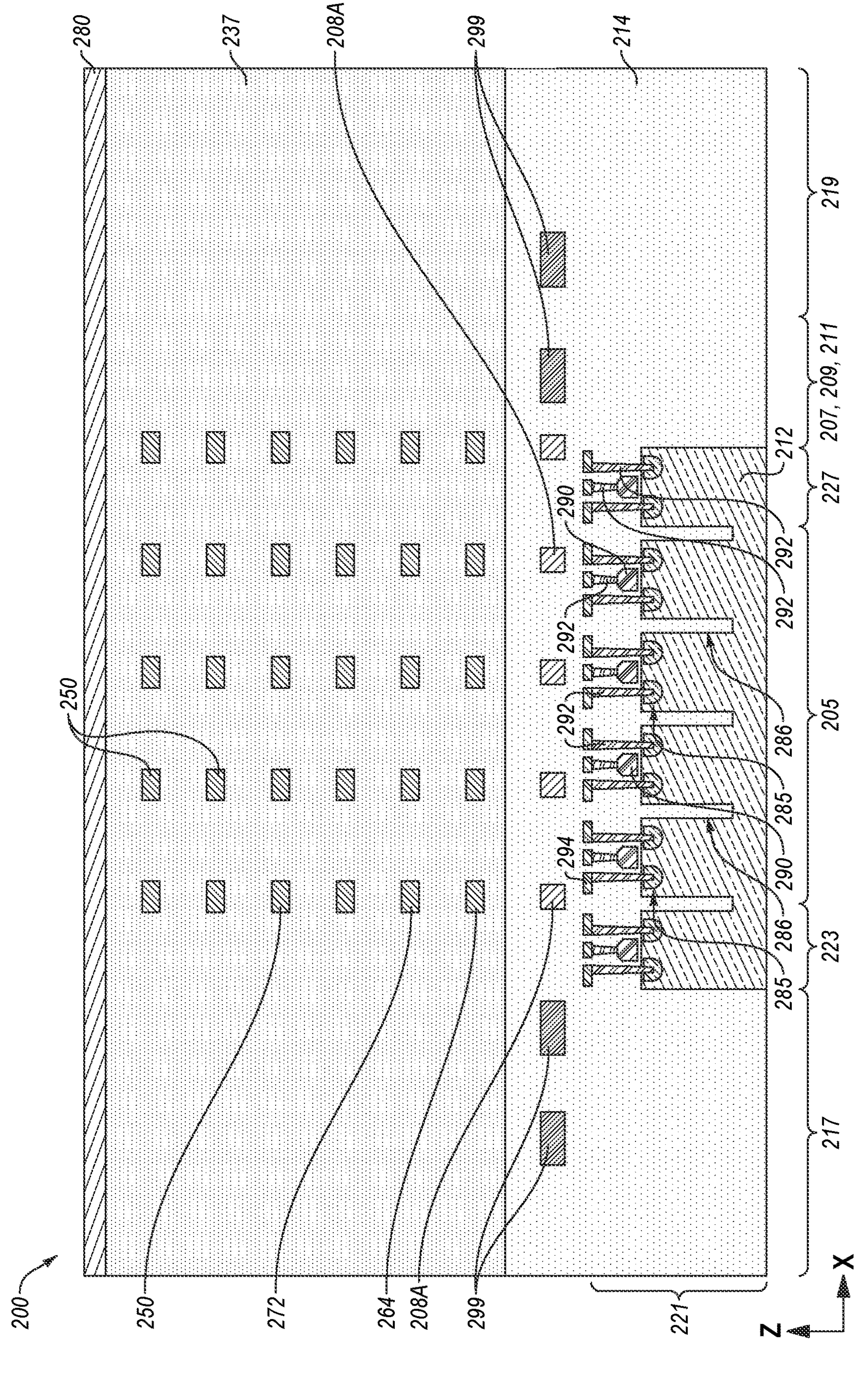
Figure 2F:
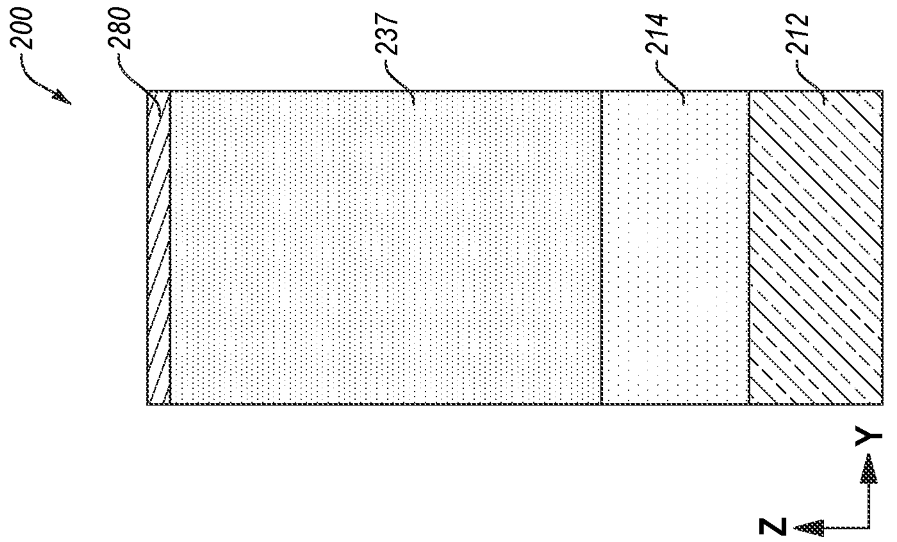
Figure 2E:
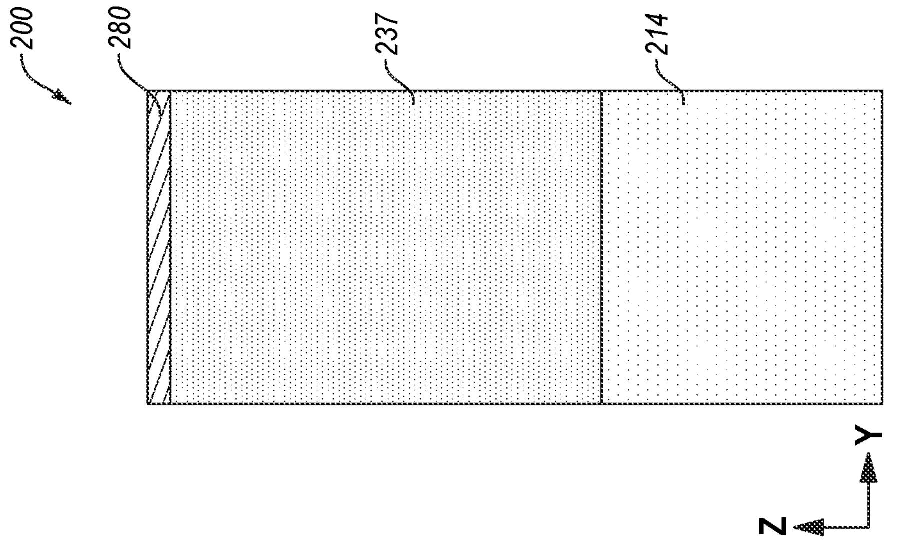
Figure 2G:
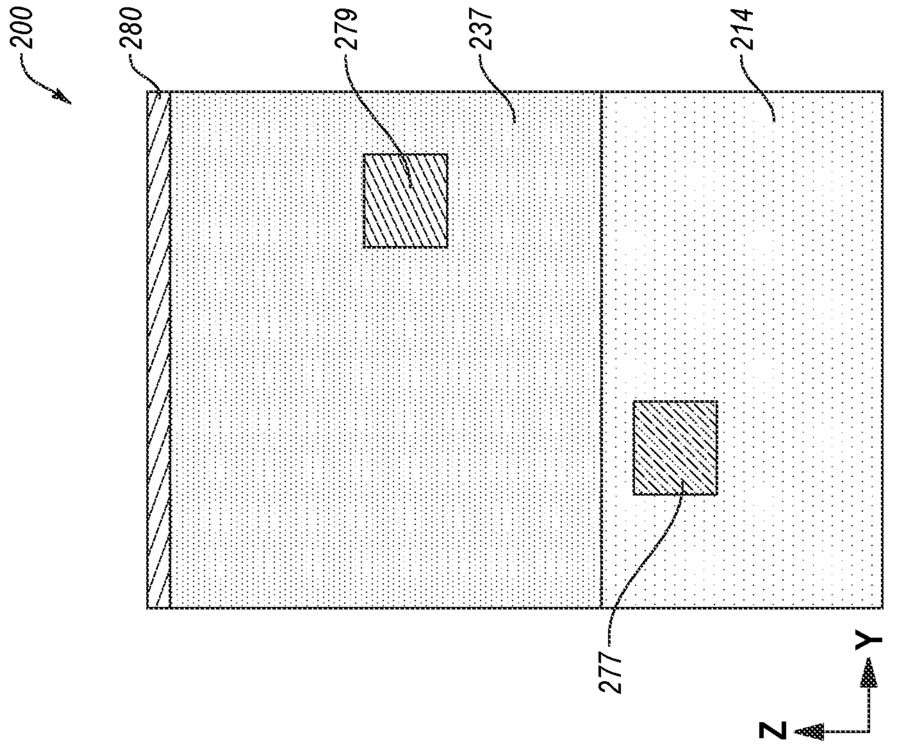
Figure 2H:
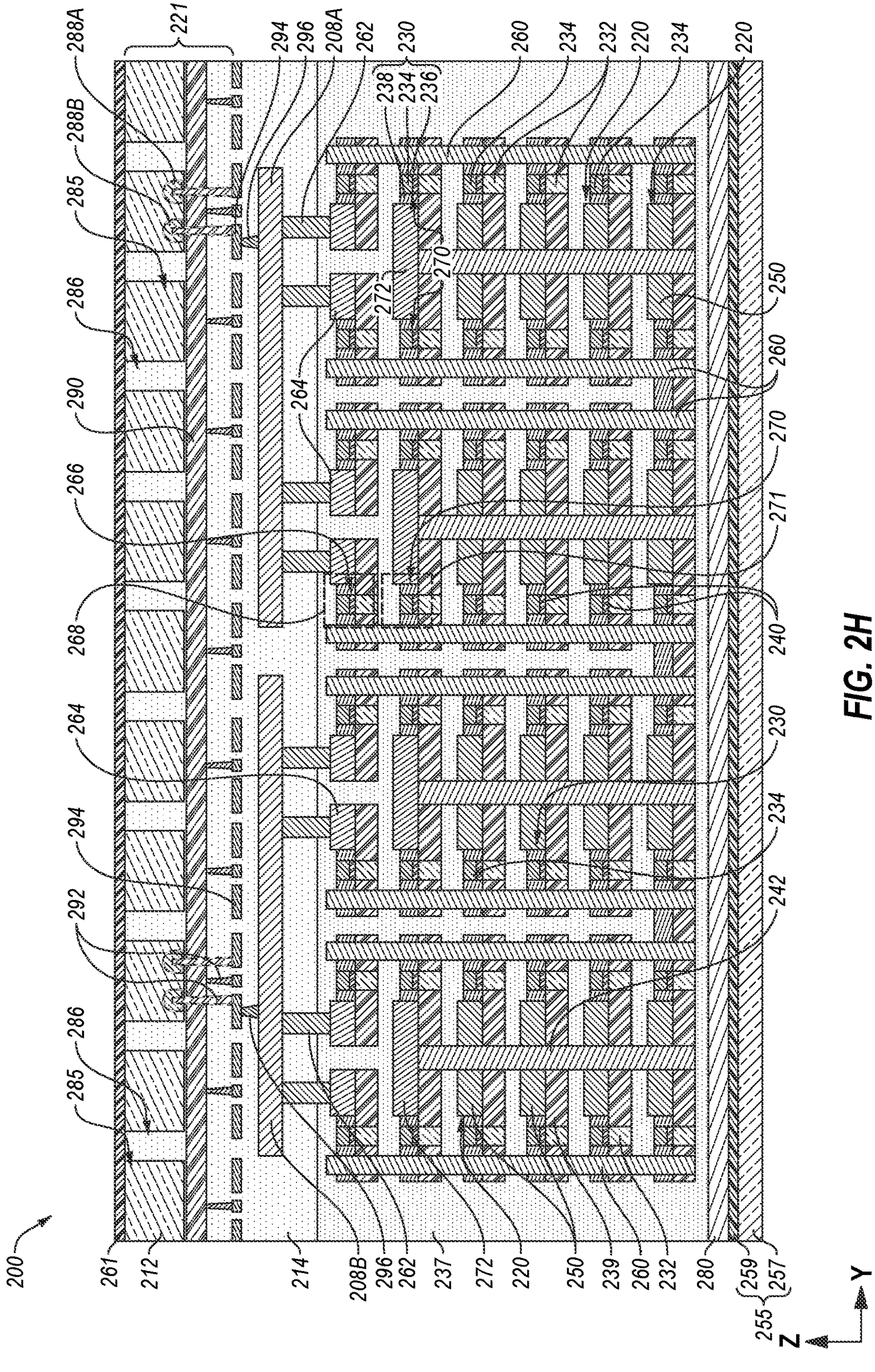
Figure 2I:
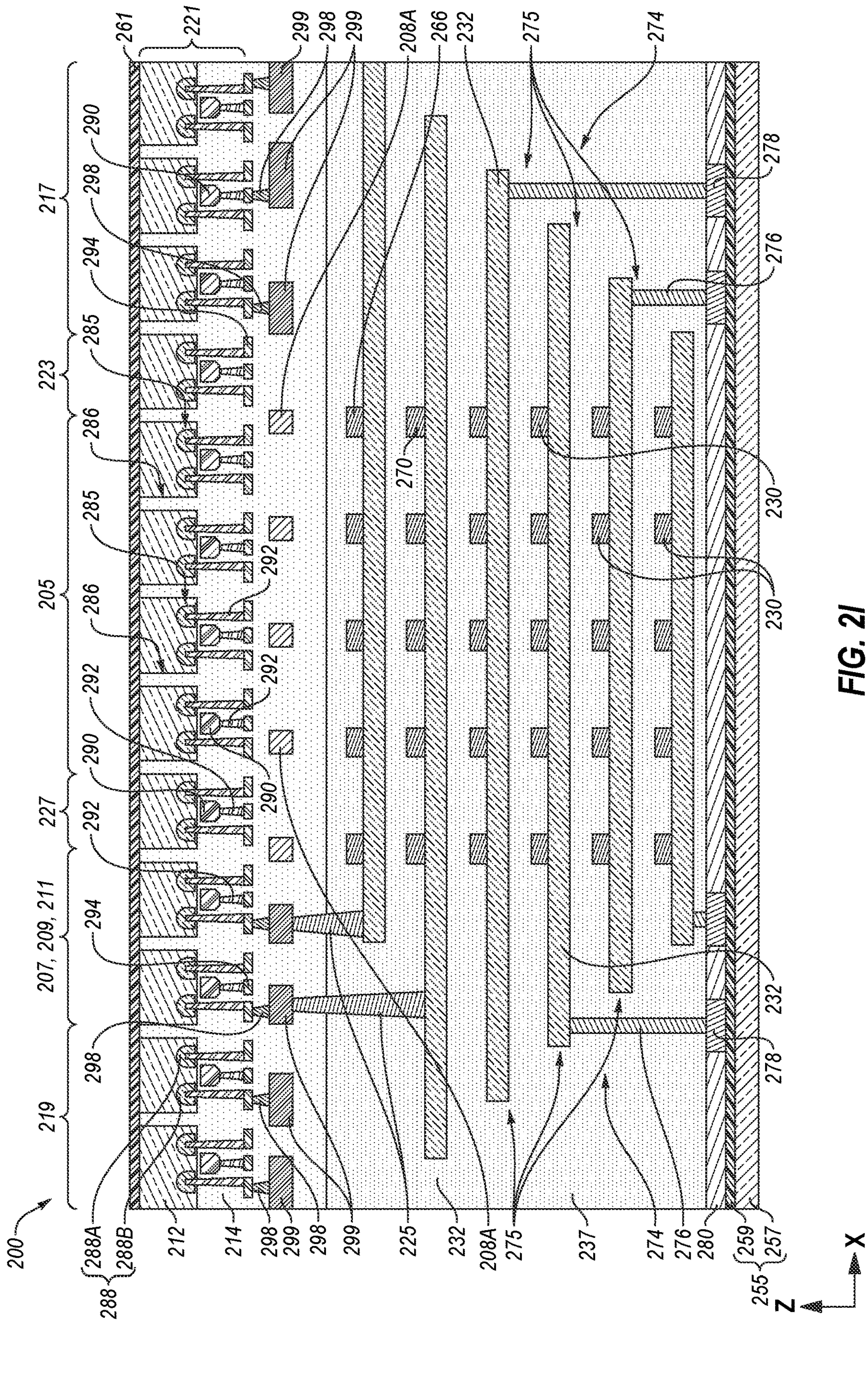
Figure 2J:
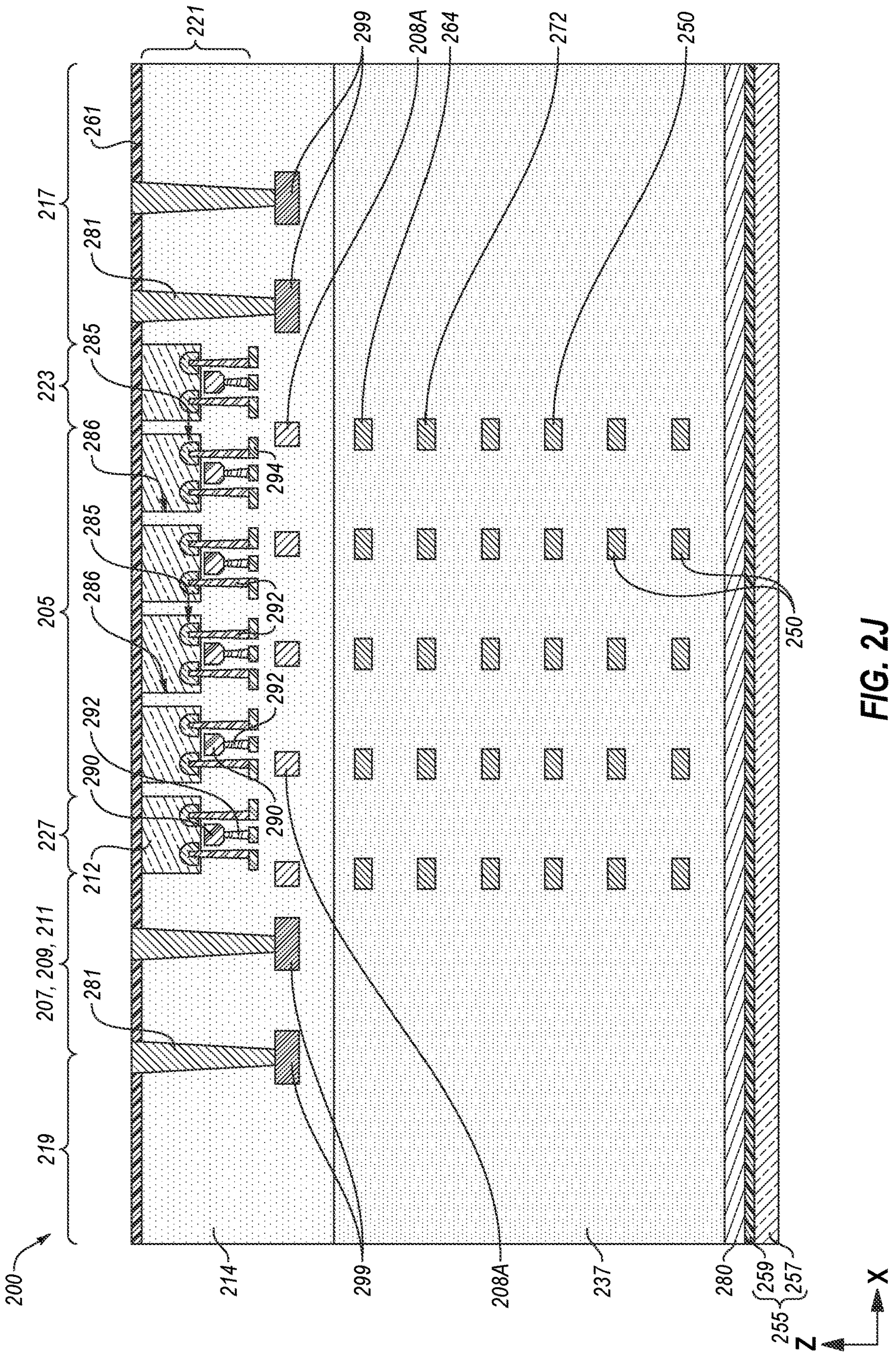
Figure 2L:
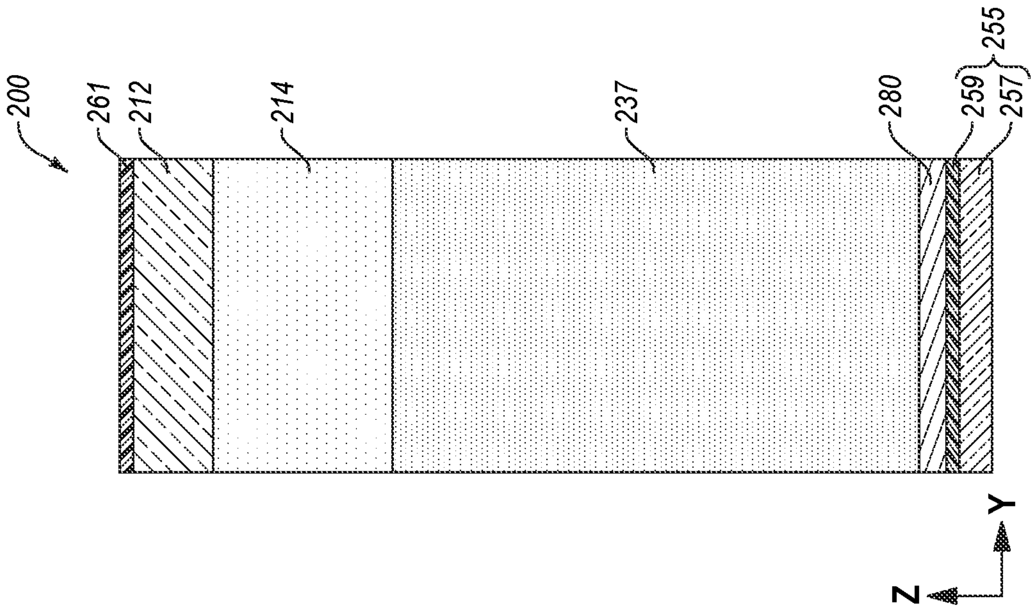
Figure 2K:
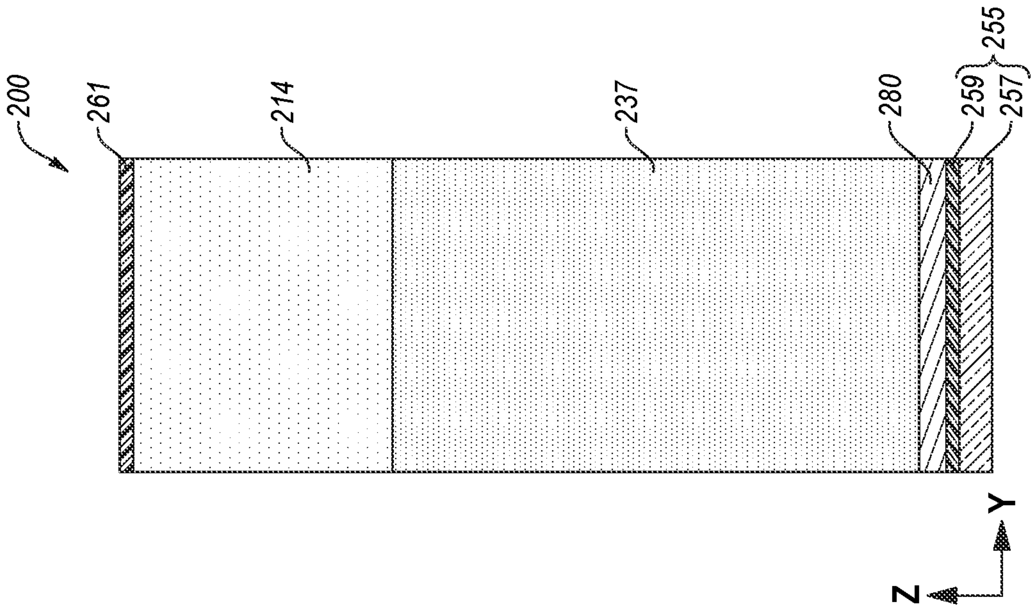
Figure 2M:
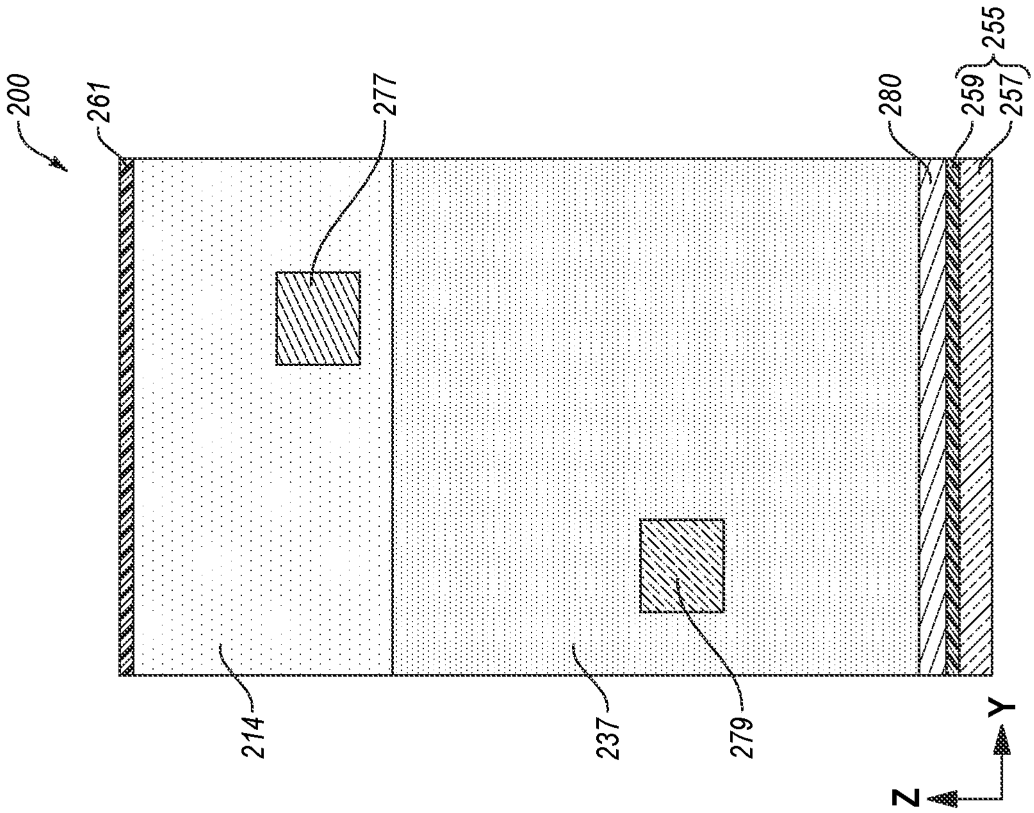

FIG. 2B is a simplified, partial cross-sectional view of the second microelectronic device structure 200 taken through section line B-B of FIG. 2A; FIG. 2C is a simplified, partial cross-sectional view of the second microelectronic device structure 200 taken through section line C-C of FIG. 2A; FIG. 2D is a simplified, partial cross-sectional view of the second microelectronic device structure 200 taken through section line D-D of FIG. 2A; FIG. 2E is a simplified, partial cross-sectional view of the second microelectronic device structure 200 taken through section line E-E of FIG. 2A; FIG. 2F is a simplified, partial cross-sectional view of the second microelectronic device structure 200 taken through section line F-F of FIG. 2A; and FIG. 2G is a simplified, partial cross-sectional view of the second microelectronic device structure 200 taken through section line G-G of FIG. 2A. FIG. 2H through FIG. 2M illustrate the second microelectronic device structure 200 at a processing stage after that illustrated in FIG. 2B through FIG. 2G.

With reference to FIG. 2A, in some embodiments, the second microelectronic device structure 200 may exhibit substantially a same horizontal area (e.g., in the XY plane) as the first microelectronic device structure 100. The second microelectronic device structure 200 may include a second array region 201 (also referred to herein as a "second memory array region") and one or more peripheral regions 203 located external to the second array region 201. In some embodiments, the peripheral regions 203 horizontally (e.g., in at least X-direction) surround the second array region 201. In some embodiments, the peripheral regions 203 substantially surround all horizontal sides of the second array region 201 in a first horizontal direction (e.g., the X-direction). In other embodiments, the peripheral regions 203 substantially surround all horizontal boundaries (e.g., an entire horizontal area) of the second array region 201.

In some embodiments, the peripheral regions 203 of the second microelectronic device structure 200 are about the same size as an area of the peripheral regions 103 of the first microelectronic device structure 100. In some such embodiments, an area of the second array region 201 may be about the same size an area of the first array region 101. However, the disclosure is not so limited. For example, in some embodiments, an area of the second array region 201 is larger than an area of the first array region 101. In other embodiments, the area of the second array region 201 is less than the area of the first array region 101.

The second array region 201 may include, for example, a second sense amplifier device region 205, a first sub word line driver region 217, and a second sub word line driver region 219. The first sub word line driver region 217 and the second sub word line driver region 219 are located in respective first conductive contact exit regions 219A where additional first conductive contact structures 276 exit the second microelectronic device structure 200 for electrically connecting to one or more components of an additional microelectronic device structure. In some embodiments, the second sense amplifier device region 205 is horizontally between (e.g., in the X-direction) the first sub word line driver region 217 and the second sub word line driver region 219.

In some embodiments, such as where the every other step 175 of each staircase structure 174 is in electrical communication with a first conductive contact structure 176, one of the first sub word line driver region 217 and the second sub word line driver region 219 comprises an even sub word line driver region including even sub word line drivers configured to be in electrical communication with even levels of the conductive structures 132 and the other of the first sub word line driver region 217 and the second sub word line driver region 219 comprises an odd word line driver region including odd sub word line drivers configured to be in electrical communication with odd levels of the conductive structures 132.

In some embodiments, the second array region 201 includes a first row decoder device region 223 and a second row decoder device region 227. The first row decoder device region 223 horizontally neighbors (e.g., in the X-direction) the first sub word line driver region 217 and the second row decoder device region 227 horizontally neighbors (e.g., in the X-direction) the second sub word line driver region 219. In some embodiments, the first row decoder device region 223 horizontally intervenes (e.g., in the X-direction) between the first sub word line driver region 217 and the second sense amplifier device region 205; and the second row decoder device region 227 horizontally intervenes (e.g., in the X-direction) between the second sub word line driver region 219 and the second sense amplifier device region 205.

Each of the first row decoder device region 223 and the second row decoder device region 227 may be in electrical communication with the respective first sub word line driver region 217 and the second sub word line driver region 219. Each of the first row decoder device region 223 and the second row decoder device region 227 may individually be configured to receive an address signal from, for example, an address decoder.

The peripheral region 203 may include, for example, a second column decoder region 207, a second multiplexer controller region 209, a second sense amplifier driver region 211, second input/output (I/O) device and socket regions 213, and a second additional electronic device region 215. The second column decoder region 207, the second multiplexer controller region 209, the second sense amplifier driver region 211, the second input/output (I/O) device and socket regions 213, and the second additional electronic device region 215 may be substantially similar to the respective ones of the first column decoder region 107, the first multiplexer controller region 109, the first sense amplifier driver region 111, the first input/output (I/O) device and socket regions 113, and the first additional electronic device region 115.

The first sub word line driver region 217 and the second sub word line driver region 219 may individually include sub word line drivers in electrical communication with the memory cells 120 (FIG. 1B) of the first microelectronic device structure 100 (FIG. 1B). As will be described in further detail herein, in some embodiments, after attachment of the second microelectronic device structure 200 to the first microelectronic device structure 100, the first sub word line driver region 217 and the second sub word line driver region 219 may be vertically above (e.g., in the Z-direction) the first column decoder region 107, a first multiplexer controller region 109, a first sense amplifier driver region 111.

The second sense amplifier device region 205 may include, for example, one or more of the circuitry and devices described above with reference to the first sense amplifier device region 105. By way of non-limiting example, the second sense amplifier device region 205 may include one or more of equalization (EQ) amplifiers, isolation (ISO) amplifiers, NMOS sense amplifiers (NSAs) (also referred to as N sense amplifiers), and PMOS sense amplifiers (PSAs) (also referred to as P sense amplifiers). As will be described in further detail herein, the devices and circuitry (e.g., sense amplifiers) of the second sense amplifier device region 205 may be coupled to local digit lines (e.g., conductive pillar structures 260 (FIG. 2B of memory cells (e.g., memory cells 220 (FIG. 2B)) within the second array region 201 for effectuating one or more control operations of the memory cells 220.

The second column decoder region 207 may include one or more of the devices and circuitry described above with reference to the first column decoder region 107. By way of non-limiting example, the second column decoder region 207 may include column decoder devices configured to receive, for example, an address signal from an address decoder or from a device of the second additional input/output device of the input/output (I/O) device and socket regions 213 and send a column select signal to a column select device of the second sense amplifier device region 205. In some embodiments, the second column decoder region 207 includes substantially the same devices and circuitry as the first column decoder region 107.

The second multiplexer controller region 209 may include one or more of the same devices and circuitry described above with reference to the first multiplexer controller region 109. By way of non-limiting example, the second multiplexer controller region 209 may include multiplexer control devices configured for effectuating operation of multiplexers (e.g., 266 (FIG. 2B, FIG. 2C)) within the second array region 201. For example, the second multiplexer controller region 209 may include select devices (e.g., transistors) for selectively providing a current to multiplexers within the second array region 201. In some embodiments, the second multiplexer controller region 209 includes substantially the same devices and circuitry as the first multiplexer controller region 109.

The second sense amplifier driver region 211 may include one or more of the same devices and circuitry described above with reference to the first sense amplifier driver region 111. By way of non-limiting example, the second sense amplifier driver region 211 may include NMOS sense amplifier drivers and PMOS sense amplifier drivers. In some embodiments, the second sense amplifier driver region 211 includes substantially the same devices and circuitry as the first sense amplifier driver region 111.

Each of the second column decoder region 207, the second multiplexer controller region 209, and the second sense amplifier driver region 211 may individually horizontally neighbor (e.g., in the X-direction) the second row decoder device region 227 and the second sub word line driver region 219. In some embodiments, each of the second column decoder region 207, the second multiplexer controller region 209, and the second sense amplifier driver region 211 horizontally neighbors (e.g., in the Y-direction) one or both of the other of the second column decoder region 207, the second multiplexer controller region 209, and the second sense amplifier driver region 211. In other embodiments, each of the second column decoder region 207, the second multiplexer controller region 209, and the second sense amplifier driver region 211 is substantially coextensive with the second sense amplifier device region 205 and exhibits substantially the same horizontal dimension (e.g., in the Y-direction) as the second sense amplifier device region 205. In some such embodiments, each of the second column decoder region 207, the second multiplexer controller region 209, and the second sense amplifier driver region 211 may horizontally neighbor (e.g., in the X-direction) one or both of the other of the second column decoder region 207, the second multiplexer controller region 209, and the second sense amplifier driver region 211.

The second input/output (I/O) device and socket regions 213 may include one or more of the same devices and circuitry described above with reference to the first input/output (I/O) device and socket region 113. By way of non-limiting example, the second input/output (I/O) device and socket regions 213 may include one or more input/output devices configured for effectuating operation of a microelectronic device (e.g., microelectronic device 500 (FIG. 6A through FIG. 6F)) and/or the second microelectronic device structure 200. The one or more second input/output devices may be coupled to, for example, one or more of a back end of line (BEOL) structure of the microelectronic device and to one or more components of the first microelectronic device structure 100 (e.g., to input/output devices of the first microelectronic device structure 100). In some embodiments, the second input/output (I/O) device and socket regions 213 includes substantially the same devices and circuitry as the first input/output (I/O) device and socket region 113.

In some embodiments, one of the second input/output (I/O) device and socket regions 213 horizontally neighbors (e.g., in the X-direction) the first sub word line driver region 217 and the second additional electronic device region 215; and the other one of the second input/output (I/O) device and socket regions 213 horizontally neighbors (e.g., in the X-direction) the second sub word line driver region 219.

The second additional electronic device region 215 may include one or more of the same devices and circuitry described above with reference to the first additional electronic device region 115. By way of non-limiting example, the second additional electronic device region 215 may include one or more of pump capacitors, decoupling capacitors, voltage generators, and power supply terminals. In some embodiments, the second additional electronic device region 215 includes one or more capacitor structures, such as one or more pump capacitors and one or more decoupling capacitors. In some embodiments, the second additional electronic device region 215 includes substantially the same devices and circuitry as the first additional electronic device region 115.

The second additional electronic device region 215 may horizontally neighbor (e.g., in the X-direction) one of the second input/output (I/O) device and socket regions 213.

In some embodiments, each of the second sense amplifier device region 205, the second column decoder region 207, the second multiplexer controller region 209, the second sense amplifier driver region 211 may have a horizontal area (e.g., in the XY plane) less than a horizontal area of the respective ones of the first sense amplifier device region 105, the first column decoder region 107, the first multiplexer controller region 109, and the first sense amplifier driver region 111. In some embodiments, and as described in further detail herein, the second microelectronic device structure 200 comprises fewer levels (tiers) of memory cells 220 than the first microelectronic device structure 100.

With collective reference to FIG. 2A and FIG. 2B, additional global digit lines 208 (also referred to as "additional conductive lines") horizontally extend (e.g., in the Y-direction) through the second array region 201 and horizontally terminate at horizontally terminal ends (e.g., in the Y-direction) of the second array region 201 within second conductive contact exit regions 206. Each of the additional global digit lines 208 may individually be in electrical communication with a conductive contact structure 210 (FIG. 2A) at a horizontal end (e.g., in the Y-direction) of the additional global digit lines 208 within one of the second conductive contact exit regions 206, as described above with reference to the global digit lines 108.

The additional global digit lines 208 include first global digit lines 208A and second global digit lines 208B. The first global digit lines 208A may be referred to herein as "through global digit lines" and the second global digit lines 208B may be referred to herein as "reference global digit lines," as described above with reference to the first global digit lines 108A and the second global digit lines 108B. The first global digit lines 208A and the second global digit lines 208B may collectively be referred to herein as "global digit lines." In some embodiments, the first global digit lines 208A are located on a first horizontal end (e.g., in the Y-direction) of the second microelectronic device structure 200 and the second global digit lines 208B are located on a second horizontal end (e.g., in the Y-direction) of the second microelectronic device structure 200 opposite the first horizontal end.

Each of the additional global digit lines 208 and the conductive contact structures 210 may individually be formed of and include conductive material, such as one or more of the materials described above with reference to the global digit lines 108 and the conductive contact structures 110. In some embodiments, the additional global digit lines 208 and the conductive contact structures 210 are individually formed of and include the same material composition as each of the respective global digit lines 108 and the conductive contact structures 110. In some embodiments, the additional global digit lines 208 and the conductive contact structures 210 individually comprise tungsten. In other embodiments, the additional global digit lines 208 and the conductive contact structures 210 individually comprise copper.

With continued reference to FIG. 2A and FIG. 2B, within the second array region 201, the second microelectronic device structure 200 includes vertical (e.g., in the Z-direction) stacks of memory cells 220 over a second base structure 212. Each vertical stack of memory cells 220 comprises a vertical stack of access devices 230 and a vertical stack of storage devices 250, the storage devices 250 of the vertical stack of storage devices 250 coupled to the access devices 230 of the vertical stack of access devices 230. Although FIG. 2A illustrates seventy two (72) vertical stacks of memory cells 220, the disclosure is not so limited, and the second array region 201 may include greater than seventy two vertical stacks of memory cells 220.

The second base structure 212 may also be referred to herein as a second die or a second wafer. The second base structure 212 may be formed of and include one or more of the materials described above with reference to the first base structure 112. In some embodiments, the second base structure 212 comprises substantially the same material composition as the first base structure 112. In some embodiments, the second base structure 212 comprises a bulk substrate comprising a semiconductive material, such as silicon.

In some embodiments the second base structure 212 includes different layers, structures, devices, and/or regions formed therein and/or thereon. The second base structure 212 includes complementary metal-oxide-semiconductor (CMOS) circuitry and devices configured for effectuating operation of the vertical stacks of memory cells 220 of the second microelectronic device structure 200, such as within each of the second sense amplifier device region 205, the second column decoder region 207, the second multiplexer controller region 209, the second sense amplifier driver region 211, the second input/output (I/O) device and socket regions 213, the second additional electronic device region 215, the first sub word line driver region 217, and the second sub word line driver region 219.

As described above with reference to the sense amplifier device region 105, the first column decoder region 107, the first multiplexer controller region 109, and the first sense amplifier driver region 111, each of the second sense amplifier device region 205, the second column decoder region 207, the second multiplexer controller region 209, the second sense amplifier driver region 211, the first sub word line driver region 217, and the second sub word line driver region 219 may be vertically below (e.g., in the Z-direction) the vertical stacks of memory cells 220.

The second base structure 212 may be electrically isolated from the vertical stacks of memory cells 220 by a third insulative material 214 vertically intervening (e.g., in the Z-direction) between the second base structure 212 and the vertical stacks of memory cells 220. The third insulative material 214 may be formed of and include insulative material, such as one or more of the materials described above with reference to the first insulative material 114. In some embodiments, the third insulative material 214 comprises substantially the same material composition as the first insulative material 114. In some embodiments, the third insulative material 214 comprises silicon dioxide.

Each of the second sense amplifier device region 205, the second column decoder region 207, the second multiplexer controller region 209, the second sense amplifier driver region 211, the first sub word line driver region 217, and the second sub word line driver region 219 may individually include transistor structures 285 formed within the second base structure 212 and vertically between (e.g., in the Z-direction) the second base structure 212 and the vertical stacks of memory cells 220. Horizontally neighboring (e.g., in the X-direction, in the Y-direction) transistor structures 285 are isolated from one another by isolation trenches 286 comprising the third insulative material 214. The second sense amplifier device region 205, the second column decoder region 207, the second multiplexer controller region 209, the second sense amplifier driver region 211, the first sub word line driver region 217, the second sub word line driver region 219, the first row decoder device region 223, and the second row decoder device region 227 may each be located within a second control logic device region 221 located vertically below (e.g., in the Z-direction) the vertical stack of memory cells 220.

The transistor structures 285 may be substantially similar to the transistor structures 185. For example, the transistor structures 285 may each individually include conductively doped regions 288, each of which includes a source region 288A and a drain region 288B. Each of the conductively doped regions 288 may be formed of and include substantially the same materials described above with reference to the conductively doped region 188, the source regions 188A, and the drain regions 188B.

The transistor structures 285 may further include gate structures 290 vertically overlying the second base structure 212 and horizontally extending between conductively doped regions 288. Channel regions of the transistor structures 285 may be horizontally interposed between the conductively doped regions. The conductively doped regions 288 and the gate structures 290 may individually be electrically coupled to sixth conductive interconnect structures 292. The sixth conductive interconnect structures 292 may individually electrically couple the conductively doped regions 288 and the gate structures 290 to one or more third routing structures 294.

The gate structures 290 may be horizontally aligned (e.g., in the Y-direction) with and shared by the channel regions of multiple transistor structures 285 horizontally neighboring (e.g., in the X-direction (FIG. 2A)) one another. In some such embodiments, the gate structures 290 extend in a first horizontal direction (e.g., in the Y-direction). In addition, dielectric material (also referred to herein as a “gate dielectric material”) may be vertically interposed between the gate structures 290 and portions of the second base structure 212 at least partially defining the channel regions of the transistor structures 285. In FIG. 2B, the conductively doped regions 288 and the sixth conductive interconnect structures 292 in electrical communication with the conductively doped regions 288 are not illustrated, but it will be understood, that the conductively doped regions 288 and the sixth conductive interconnect structures 292 are located in a plane different than that in which the gate structures 290 extend. By way of non-limiting example, each gate structure 290 may be in electrical communication with a plurality of source regions 288A on a first side of the gate structure 290 (e.g., spaced from the gate structure 290 in the X-direction) and a plurality of drain regions 288B on a second, opposite side of the gate structure 290 (e.g., spaced from the gate structure 290 in the X-direction opposite the source regions 288A). At least some of the third routing structures 294 (e.g., the third routing structures 294 not in electrical communication with the sixth conductive interconnect structures 292 in electrical communication with the gate structure 290) may be in electrical communication with sixth conductive interconnect structures 292 that are, in turn, in electrical communication with one of the source regions 288A or one of the drain regions 288B, as illustrated in FIG. 2C and FIG. 2D. With continued reference to FIG. 2B, two of each of the source regions 288A and the drain regions 288B, and four of the sixth conductive interconnect structures 292 are illustrated in broken lines to indicate that such source regions 288A, drain regions 288B, and sixth conductive interconnect structures 292 are located in a plane different than the plane in which the gate structure 290 illustrated in FIG. 2B extends.

Each of the gate structures 290, the sixth conductive interconnect structures 292, and the third routing structures 294 may be formed of and include substantially the same materials described above with reference to the gate structures 190, the first conductive interconnect structures 192, and the first routing structures 194.

The third insulative material 214 may be between the transistor structures 285 and electrical isolate different portions of the transistor structures 285, the sixth conductive interconnect structures 292, and the third routing structures 294.

With continued reference to FIG. 2B, the transistor structures 285 within the second sense amplifier device region 205 may form sense amplifier devices. In some embodiments, at least some of the transistors structures 285 of the second sense amplifier device region 205 are in electrical communication with the global digit lines 208 by means of the third routing structures 294 and seventh conductive interconnect structures 296. In some embodiments, each sense amplifier device of the second sense amplifier device region 205 includes a plurality of transistor structures 285 and is in electrical communication with one of the first global digit lines 208A (e.g., through one of the transistor structures 285) and one of the second global digit lines 208B (e.g., through an additional one of the transistor structures 285). In use and operation (e.g., such as during a read operation), the sense amplifier devices of the second sense amplifier device region 205 are configured to amplify a signal (e.g., a difference in voltage) between the first global digit line 208A and the second global digit line 208B to which the sense amplifier device is connected.

With collective reference to FIG. 2C and FIG. 2D, the transistor structures 285 in each of the first sub word line driver region 217, the first row decoder device region 223, the second row decoder device region 227, the second column decoder region 207 (and each of the second multiplexer controller region 209, the second sense amplifier driver region 211, not illustrated in the cross-section of FIG. 2C), and the second sub word line driver region 219 may individually be in electrical communication with eighth conductive interconnect structures 298 that are, in turn, in electrical communication with fourth routing structures 299. The fourth routing structures 299 may be configured to electrically connect respective transistor structures 285 within a first region of the second microelectronic device structure 200 to another region of, for example, the second microelectronic device structure 200. By way of non-limiting example, at least some of the fourth routing structures 299 in electrical communication with transistor structures 285 within the first row decoder device region 223 and the second row decoder device region 227 may individually be in electrical communication with one or more components of the respective first sub word line driver region 217 and the second sub word line driver region 219 (e.g., such as through one or more components of one or more main word line drivers), and with one or more components of an address decoder; at least some of the fourth routing structures 299 in electrical communication with the transistor structure 285 within each of the first sub word line driver region 217 and the second sub word line driver region 219 may be in electrical communication with one or more components of a main word line driver region; at least some of the fourth routing structures 299 in electrical communication with the transistor structure 285 within the second column decoder region 207 may be in electrical communication with transistor structures 285 of column select devices of the second sense amplifier device region 205; at least some of the fourth routing structures 299 in electrical communication with the transistor structure 285 within the second sense amplifier driver region 211 may be in electrical communication with transistor structures 285 within the second sense amplifier device region 205; and at least some of the fourth routing structures 299 in electrical communication with the transistor structure 285 within second multiplexer controller region 209 may be in electrical communication with multiplexers (e.g., multiplexers 266 (FIG. 2B)) and/or with transistor structures 285 within the second column decoder region 207.

In some embodiments, a region of the second control logic device region 221 within horizontal boundaries (e.g., in the X-direction) of the steps 275 of the staircase structures 274 may include transistor structures 285 of the first sub word line driver region 217 and the second sub word line driver region 219. In some embodiments, the fourth routing structures 299 electrically coupled to the transistor structures 285 within the first sub word line driver region 217 and the second sub word line driver region 219 may be routed to a different region of the respective ones of the first sub word line driver region 217 and the second sub word line driver region 219 illustrated in FIG. 2D horizontally offset (e.g., in the Y-direction) from the staircase structures 274. As described in further detail herein, conductive interconnect structures (e.g., tenth conductive interconnect structures 281 (FIG. 2J)) are formed in electrical communication with the fourth routing structures 299 within the first sub word line driver region 217 and the second sub word line driver region 219.

Although FIG. 2C and FIG. 2D illustrate a cross-sectional view through the second column decoder region 207, it will be understood that the cross-sectional view of FIG. 2C and FIG. 2D illustrating the second column decoder region 207 may be substantially similar to a cross-section taken through the second multiplexer controller region 209 or the second sense amplifier driver region 211 and each of the second multiplexer controller region 209 and the second sense amplifier driver region 211 individually comprises transistor structures 285, as described and illustrated with reference to the second column decoder region 207.

Each of the seventh conductive interconnect structures 296, the eighth conductive interconnect structures 298, and the fourth routing structures 299 may individually be formed of and include conductive material, such as one or more of the materials described above with reference to the second conductive interconnect structures 196, the third conductive interconnect structures 198, and the second routing structures 199. In some embodiments, each of the seventh conductive interconnect structures 296, the eighth conductive interconnect structures 298, and the fourth routing structures 299 are formed of and include substantially the same material composition as the respective ones of the second conductive interconnect structures 196, the third conductive interconnect structures 198, and the second routing structures 199.

With reference to FIG. 2B, and as described above with reference to the vertical stacks of memory cells 120, each of the vertical stacks of memory cells 220 comprises a vertical stack of access devices 230 and a vertical stack of storage devices 250. Each of the access devices 230 may individually be coupled to a conductive structure 232 (FIG. 2A, FIG. 2C) of a stack structure 235 (FIG. 2C) comprising levels of the conductive structures 232 (also referred to herein as “first conductive lines,” “access lines,” or “word lines”) vertically (e.g., in the Z-direction) spaced from one another by one or more insulative structures.

The access devices 230 may be substantially similar to the access devices 130 and include, for example, a channel material 234 between a source material 236 and a drain material 238 comprising substantially the same material compositions as each of the respective channel material 134, source material 136, and drain material 138.

The conductive structures 232 may extend horizontally (e.g., in the X-direction; FIG. 2C) through the vertical stacks of memory cells 220 as lines and may each be configured to be operably coupled to a vertically (e.g., in the Z-direction) neighboring channel material 234 of the vertically neighboring (e.g., in the Z-direction) access devices 230. In other words, a conductive structure 232 may be configured to be operably coupled to a vertically neighboring access device 230. The conductive structures 232 may individually be formed of and include conductive material, such as one or more of the materials described above with reference to the conductive structures 132. In some embodiments, the conductive structures 232 comprise substantially the same material composition as the conductive structures 132.

As described above with reference to the conductive structures 132, the conductive structures 232 may be configured to provide sufficient current through a channel region (e.g., channel material 234) of each of the access devices 230 to electrically couple a horizontally neighboring and associated storage device 250 to, for example, a conductive pillar structure (e.g., conductive pillar structure 260) vertically extending (e.g., in the Z-direction) through the vertical stack of access devices 230. The stack structure 235 may intersect the vertical stacks of memory cells 220, such as the vertical stacks of the access devices 130 of the vertical stacks of memory cells 220, each of the conductive structures 232 of the stack structure 235 intersecting a level of the memory cells 220 of the vertical stack of memory cells 220. With reference to FIG. 2A, each stack structure 235 individually extends through several vertical stacks of access devices 230 of the vertical stacks of memory cells 220. In some embodiments, each stack structure 235 extends through horizontally neighboring (e.g., in the X-direction) vertical stacks of memory cells 220. In some embodiments, the stack structures 235 are spaced from each other in a horizontal direction (e.g., in the Y-direction).

Although FIG. 2A and FIG. 2B illustrate that the stack structures 235 individually intersect nine (9) of the vertical stacks of memory cells 220, the disclosure is not so limited. In other embodiments, the stack structures 235 individually intersect fewer than nine (9) of the vertical stacks of memory cells 220, such as eight (8) of the vertical stacks of the memory cells 220, six (6) of the vertical stacks of the memory cells 220, or four (4) of the vertical stacks of the memory cells 220. In other embodiments, the stack structures 235 individually intersect more than nine (9) of the vertical stacks of the memory cells 220, such as more than ten (10) of the vertical stacks of the memory cells 220, more than twelve (12) of the vertical stacks of the memory cells 220, more than sixteen (16) of the vertical stacks of the memory cells 220, or more than twenty (20) of the vertical stacks of the memory cells 220.

The channel material 234 may be separated from the conductive structures 232 by a dielectric material 240, which may also be referred to herein as a "gate dielectric material" and may be substantially similar to the dielectric material 140 described above. In some embodiments, the dielectric material 240 comprises substantially the same material composition as the dielectric material 140.

In some embodiments, insulative structures 237 and additional insulative structures 239 vertically (e.g., in the Z-direction) intervene between vertically neighboring access devices 230 and vertically neighboring storage devices 250. The insulative structures 237 and the additional insulative structures 239 may be substantially the same as the insulative structures 137 and the additional insulative structures 139 of the first microelectronic device structure 100.

The storage devices 250 are in electrical communication with a conductive structure 242 (not illustrated in FIG. 2A for clarity and ease of understanding the description). The conductive structure 242 may be substantially the same as the conductive structure 142 described above with reference to the first microelectronic device structure 100. The conductive structures 242 may be referred to herein as "conductive plates."

The storage devices 250 may be substantially similar to the storage devices 150 and may individually comprise, for example, a first electrode 152 (FIG. 1B), a second electrode 154 (FIG. 1B), and a dielectric material 156 (FIG. 1B) between the first electrode 152 and the second electrode 154, as described above with reference to the storage devices 150. The second electrode 154 may be in electrical communication with one of the conductive structures 242 of the vertical stack of memory cells 220.

With continued reference to FIG. 2A and FIG. 2B, the second microelectronic device structure 200 may include conductive pillar structures 260 vertically extending (e.g., in the Z-direction) through the second microelectronic device structure 200. The conductive pillar structures 260 may also be referred to herein as "digit lines," "second conductive lines," "digit line pillar structures," "local digit lines," or "vertical digit lines" and may be substantially similar to the conductive pillar structures 160. The conductive pillar structures 260 may be electrically coupled to the access devices 230 to facilitate operation of the memory cells 220 of a vertical stack of memory cells 220. Stated another way, each conductive pillar structure 260 vertically extends through access devices 230 of a vertical stack of memory cells 220. The conductive pillar structures 260 may be formed of and include conductive material, such as one or more of the materials described above with reference to the conductive pillar structures 160.

In some, the conductive pillar structures 260 in horizontally neighboring (e.g., in the Y-direction) stack structures 235 are horizontally aligned (e.g., in the X-direction) with each other. In other embodiments, conductive pillar structures 260 in horizontally neighboring (e.g., in the Y-direction) stack structures 235 are horizontally aligned (e.g., in the X-direction) with each other.

With reference to FIG. 2B, in some embodiments, each additional global digit line 208 (FIG. 2A, FIG. 2B) may be in electrical communication with one or more global digit line contact structures 262 that are, in turn, individually in electrical communication with a conductive structure 264 to selectively couple the respective additional global digit line 208 to one of the conductive pillar structures 260 through a multiplexer 266, illustrated in box 268. In some embodiments, the multiplexers 266 may facilitate selective provision of a voltage to and/or from a conductive pillar structure 260 to which it is electrically connected (by means of the global digit line contact structure 262). Accordingly, the global digit lines 208 are configured to be selectively electrically connected to each conductive pillar structure 260 vertically extending (e.g., in the Z-direction) through a vertical stack of memory cells 220 by applying a voltage to the multiplexer 266 electrically connecting the global digit line 208 to the particular conductive pillar structure 260 by means of the global digit line contact structure 262 and the conductive structures 264 between the global digit line 208 and the multiplexer 266 associated with the particular conductive pillar structure 260. The multiplexers 266 may be driven by a multiplexer driver and/or a multiplexer control logic device operably coupled the conductive structure 232 to which the multiplexer 266 is coupled (e.g., the conductive structure 232 vertically above (e.g., in the Z-direction) the multiplexer 266). For example, and as described in further detail herein, the multiplexers 266 may be coupled to one or more structures (e.g., transistor structures 285) within the second multiplexer controller region 209 to selectively drive the multiplexers 266.

Each additional global digit line 208 may be configured to be selectively coupled to more than one of the conductive pillar structures 260 by means of the multiplexers 266 coupled to each of the conductive pillar structures 260. In some embodiments, each additional global digit line 208 is configured to be in electrical communication with four (4) of the conductive pillar structures 260. In other embodiments, each of the additional global digit lines 208 is configured to be in electrical communication with eight (8) of the conductive pillar structures 260 or sixteen (16) of the conductive pillar structures 260. One of the multiplexers 266 may be located between (e.g., horizontally between) a conductive pillar structure 260 and a horizontally neighboring conductive structure 264 that is, in turn, in electrical communication with a global digit line 208 by means of a global digit line contact structure 262. As described above with reference to the multiplexers 166, in some embodiments, the multiplexers 266 are individually configured to receive a signal (e.g., a select signal) from a multiplexer controller region and provide the signal to a bit line (e.g., conductive pillar structures 260 (FIG. 2B)) to selectively access desired memory cells within the second array region 201 for effectuating one or more control operations of the memory cells 220.

The global digit line contact structures 262 and the conductive structures 264 may individually be formed of and include conductive material, such as one or more of the materials described above with reference to the global digit line contact structures 162 and the conductive structures 164. In some embodiments, each of the global digit line contact structures 262 and the conductive structures 264 comprises substantially the same material composition as the respective ones of the global digit line contact structures 162 and the conductive structures 164.

In some embodiments, an access device 230 vertically (e.g., in the Z-direction) neighboring (e.g., vertically above) the multiplexer 266 may comprise a transistor 270, one of which is illustrated in box 271, configured to electrically couple the conductive pillar structure 260 to the conductive structure 242 through an additional conductive structure 272. The transistor 270 may comprise a so-called "bleeder"

transistor or a “leaker” transistor configured to provide a bias voltage to the conductive pillar structures 260 to which it is coupled (e.g., the horizontally neighboring (e.g., in the X-direction) conductive pillar structures 260). In some embodiments, the conductive structure 232 coupled to the transistors 270 may be in electrical communication with a voltage, such as a drain voltage $V_{dd}$ or a voltage source supply $V_{ss}$. In some embodiment, each vertical stack of memory cells 220 comprises one of the multiplexers 266 and one of the transistors 270.

The additional conductive structure 272 may be substantially the same as the additional conductive structure 172 and may comprise one or more of the materials described above with reference to the additional conductive structure 172.

With reference to FIG. 2A and FIG. 2C, the conductive structures 232 of the stack structure 235 may horizontally (e.g., in the X-direction) terminate at staircase structures 274 located at horizontally (e.g., in the X-direction) terminal portions of the stack structure 235. While the staircase structures 274 are illustrated in FIG. 2A, it will be understood that the staircase structures 274 are located beneath a vertically upper (e.g., in the Z-direction) surface of the second microelectronic device structure 200. With reference to FIG. 2C, vertically higher (e.g., in the Z-direction) conductive structures 232 may have a smaller horizontal dimension (e.g., in the X-direction) than vertically lower conductive structures 232, such that horizontal edges of the conductive structures 232 at least partially define steps 275 of the staircase structures 274. The staircase structures 274 may be substantially the same as the staircase structures 174 described above with reference to the first microelectronic device structure 100.

In some embodiments, the additional global digit lines 208 may be vertically closer (e.g., in the Z-direction) to a vertically lowermost (e.g., in the Z-direction) conductive structure 232 of the stack structures 235 than to a vertically uppermost conductive structure 232 of the stack structures 235. In some such embodiments, the additional global digit lines 208 are located closer to a conductive structure 232 having a larger horizontal dimension (e.g., in the X-direction) than other conductive structures 232 of the stack structure 235.

Each of the staircase structures 274 may individually be located within one of the first sub word line driver region 217 and the second sub word line driver region 219. Stated another way, each of the first sub word line driver region 217 and the second sub word line driver region 219 may include one or more of the staircase structures 274. With reference to FIG. 2A, in some embodiments, the staircase structures 274 of each of the stack structures 235 are horizontally aligned in a first direction (e.g., in the X-direction) and horizontally offset in a second direction (e.g., the Y-direction). In some such embodiments, each stack structure 235 individually includes a staircase structure 274 at a first horizontal end (e.g., in the X-direction) of the stack structure 235 and an additional staircase structure 274 at a second, opposite horizontal end (e.g., in the X-direction) of the stack structure 235. In some such embodiments, each stack structure 235 may individually include a staircase structure 274 within the first sub word line driver region 217 and an additional staircase structure 274 within one of the second sub word line driver region 219. In some such embodiments, each of the stack structures 235 individually includes two (2) staircase structures 274.

In other embodiments, and as described above with reference to the staircase structures 174, the staircase structures 274 of horizontally neighboring (e.g., in the Y-direction) stack structures 235 may be located at opposing horizontal ends (e.g., in the X-direction) of the second microelectronic device structure 200 and every other stack structure 235 (e.g., in the Y-direction) includes a staircase structure 274 at a first horizontal end (e.g., in the X-direction) of the second microelectronic device structure 200 while the other of the stack structures 235 individually includes a staircase structure 274 at a second horizontal end (e.g., in the X-direction) of the second microelectronic device structure 200 opposite the first horizontal end.

Although FIG. 2A illustrates two staircase structures 274 for every stack structure 235 (e.g., a staircase structure 274 at each horizontal end (e.g., in the X-direction) of each stack structure 235), the disclosure is not so limited. In other embodiments, each stack structure 235 may include one staircase structure 274, and each of the staircase structures 274 may be located at a same horizontal end (e.g., in the X-direction) of the stack structures 235.

The quantity of steps 275 of the staircase structures 274 may correspond to the levels of memory cells 220 of the vertical stack (minus one level for the multiplexers 266 and one level for the transistors 270), as described above with reference to the staircase structures 174. In some embodiments, the quantity (e.g., number) of steps 275 of the staircase structures 274 may be fewer than the quantity (e.g., number) of steps 175 of the staircase structures 174. In some embodiments, the staircase structures 274 each individually include the same quantity of the steps 275.

In some embodiments, vertically neighboring (e.g., in the Z-direction) steps 275 of a staircase structure 274 on a first horizontal size (e.g., in the X-direction) of a stack structure 235 may be vertically offset (e.g., in the Z-direction) by two levels of the vertically alternating conductive structures 232 and insulative structures 237. In other embodiments, each step 275 of each staircase structure 274 of a stack structure 235 may be vertically offset (e.g., in the Z-direction) from a vertically neighboring step 275 of the staircase structure 274 by one level of the vertically alternating conductive structures 232 and insulative structures 237.

With continued reference to FIG. 2A and FIG. 2C, additional first conductive contact structures 276 may be in electrical communication with individual conductive structures 232 at the steps 275. In some embodiments, each step 275 of each staircase structure 274 may be in electrical communication with an additional first conductive contact structure 276 at the horizontal (e.g., in the X-direction) end of the staircase structure 274. In other embodiments, every other step 275 of each staircase structure 274 may include an additional first conductive contact structure 276 in contact therewith. In other words, in some such embodiments, every other step 275 of the staircase structures 274 may individually be in contact with an additional first conductive contact structure 276. In some such embodiments, each stack structure 235 may include one staircase structure 274 at each horizontal (e.g., in the X-direction) end thereof and each step 275 of a first staircase structure 274 at a first horizontal end of the stack structure 235 not in electrical communication with an additional first conductive contact structure 276 may individually be in electrical communication with an additional first conductive contact structure 276 at a second staircase structure 274 at a second, opposite horizontal end of the stack structure 235.

The additional first conductive contact structures 276 may individually be formed of and include conductive material, such as one or more of the materials described above with reference to the first conductive contact structures 176. In some embodiments, the additional first conductive contact structures 276 individually comprises substantially the same material composition as the first conductive contact structures 176.

Third pad structures 278 may vertically overlie and individually be in electrical communication with of the additional first conductive contact structures 276. Each of the additional first conductive contact structures 276 is individually in electrical communication with one of the third pad structures 278. The third pad structure 278 may be formed within a fourth insulative material 280.

The third pad structures 278 are individually formed of and include conductive material, such as one or more of the materials described above with reference to the first pad structures 178. In some embodiments, the third pad structures 278 are formed of and include tungsten. In other embodiments, the third pad structures 278 are formed of and include copper.

With continued reference to FIG. 2C, in some embodiments, the conductive structures 232 in electrical communication with the multiplexers 266 may be in electrical communication with transistor structures 285 within the second multiplexer controller region 209 by means of ninth conductive interconnect structures 225. In addition, the conductive structures 232 in electrical communication with the transistors 270 may be in electrical communication with transistor structures 285 within the second multiplexer controller region 209 by means of other ninth conductive interconnect structures 225. In other embodiments, and as described above with reference to the fourth conductive interconnect structures 125, the vertically lowermost conductive structure 232 may be in electrical communication with one of the ninth conductive interconnect structures 225 at a first horizontal end (e.g., in the X-direction) of the stack structure 235 and the next vertically uppermost conductive structures 232 may be in electrical communication with a ninth conductive interconnect structure 225 at an opposite horizontal end (e.g., in the X-direction) of the stack structure 235 such that each of the two lowermost conductive structures 232 may be in electrical communication with one of the ninth conductive interconnect structures 225 without electrically shorting to one another.

With reference to FIG. 2E through FIG. 2G, in some embodiments, each of the second input/output (I/O) device and socket regions 213 and the second additional electronic device region 215 may include the third insulative material 214, the insulative structures 237, and the fourth insulative material 280. With reference to FIG. 2G, the second additional electronic device region 215 may include additional capacitor structures 277 (not illustrated in FIG. 2A) and additional pump structures 279 (not illustrated in FIG. 2A), such as within the third insulative material 214. As described in further detail herein, additional circuitry (e.g., conductive contact structures) may be formed in each of the second input/output (I/O) device and socket regions 213 and the second additional electronic device region 215, such as attachment of the second microelectronic device structure 200 to the first microelectronic device structure 100.

In some embodiments, the additional capacitor structures 277 are substantially similar to the storage devices 250 within the second array region 201, but are not configured to be in electrical communication with a conductive structure 232 or a conductive pillar structure 260. In some embodiments, the additional pump structures 279 comprise one or more transistor structures substantially similar to the transistor structures 285.

With collective reference to FIG. 2B through FIG. 2G, the fourth insulative material 280 vertically overlies the first microelectronic device structure 100. As described in further detail herein, the fourth insulative material 280 may facilitate attaching (e.g., bonding) the second microelectronic device structure 200 to the first microelectronic device structure 100.

The fourth insulative material 280 may be formed of and include insulative material, such as one or more of the materials described above with reference to the second insulative material 180. In some embodiments, the fourth insulative material 280 comprises silicon dioxide.

Referring now to FIG. 2H through FIG. 2M, a carrier wafer assembly 255 may be bonded to the second microelectronic device structure 200 and the second microelectronic device structure 200 may be vertically (e.g., in the Z-direction) inverted (e.g., flipped). The carrier wafer assembly 255 may include a wafer structure 257 and a fifth insulative material 259 over the wafer structure 257. The wafer structure 257 may comprise, for example, a glass substrate. The fifth insulative material 259 may comprise an oxide material, such as, for example, silicon dioxide. In some embodiments, the fifth insulative material 259 comprises substantially the same material composition as the fourth insulative material 280.

The carrier wafer assembly 255 may be attached to the second microelectronic device structure 200 by placing the fifth insulative material 259 in contact with the fourth insulative material 280 and exposing the second microelectronic device structure 200 and the carrier wafer assembly 255 to annealing conditions to form bonds (e.g., oxide-to-oxide bonds) between the fifth insulative material 259 in contact with the fourth insulative material 280. In some embodiments, the second microelectronic device structure 200 and the carrier wafer assembly 255 are exposed to a temperature greater than, for example, 800° C., to form the oxide-to-oxide bonds and attach the second microelectronic device structure 200 to the carrier wafer assembly 255.

After attaching the carrier wafer assembly 255 to the second microelectronic device structure 200, the second microelectronic device structure 200 may be vertically (e.g., in the Z-direction) inverted (e.g., flipped) and the second base structure 212 may be vertically (e.g., in the Z-direction) thinned by exposing the second base structure 212 to a chemical mechanical planarization (CMP) process. In other embodiments, the second base structure 212 is vertically thinned by exposing the second base structure 212 to a dry etch. Vertically thinning the second base structure 212 may electrically isolate the transistor structures 285 from one another.

After vertically thinning the second base structure 212, a sixth insulative material 261 is formed over the second microelectronic device structure 200. The sixth insulative material 261 may be formed of and include one or more of the materials described above with reference to the third insulative material 214. In some embodiments, the sixth insulative material 261 comprises silicon dioxide.

In some embodiments, tenth conductive interconnect structures 281 may be formed through the sixth insulative material 261 and the third insulative material 214 and in contact with the fourth routing structures 299 within each of the first sub word line driver region 217 and the second sub word line driver region 219. As described in further detail below, the tenth conductive interconnect structures 281 may be electrically coupled to the first pad structures 178 to electrically connect the transistor structures 285 of the first sub word line driver region 217 and the second sub word line driver region 219 to the conductive structures 132 of the first microelectronic device structure 100 after attachment of the second microelectronic device structure 200 to the first microelectronic device structure 100.

Figure 3A:
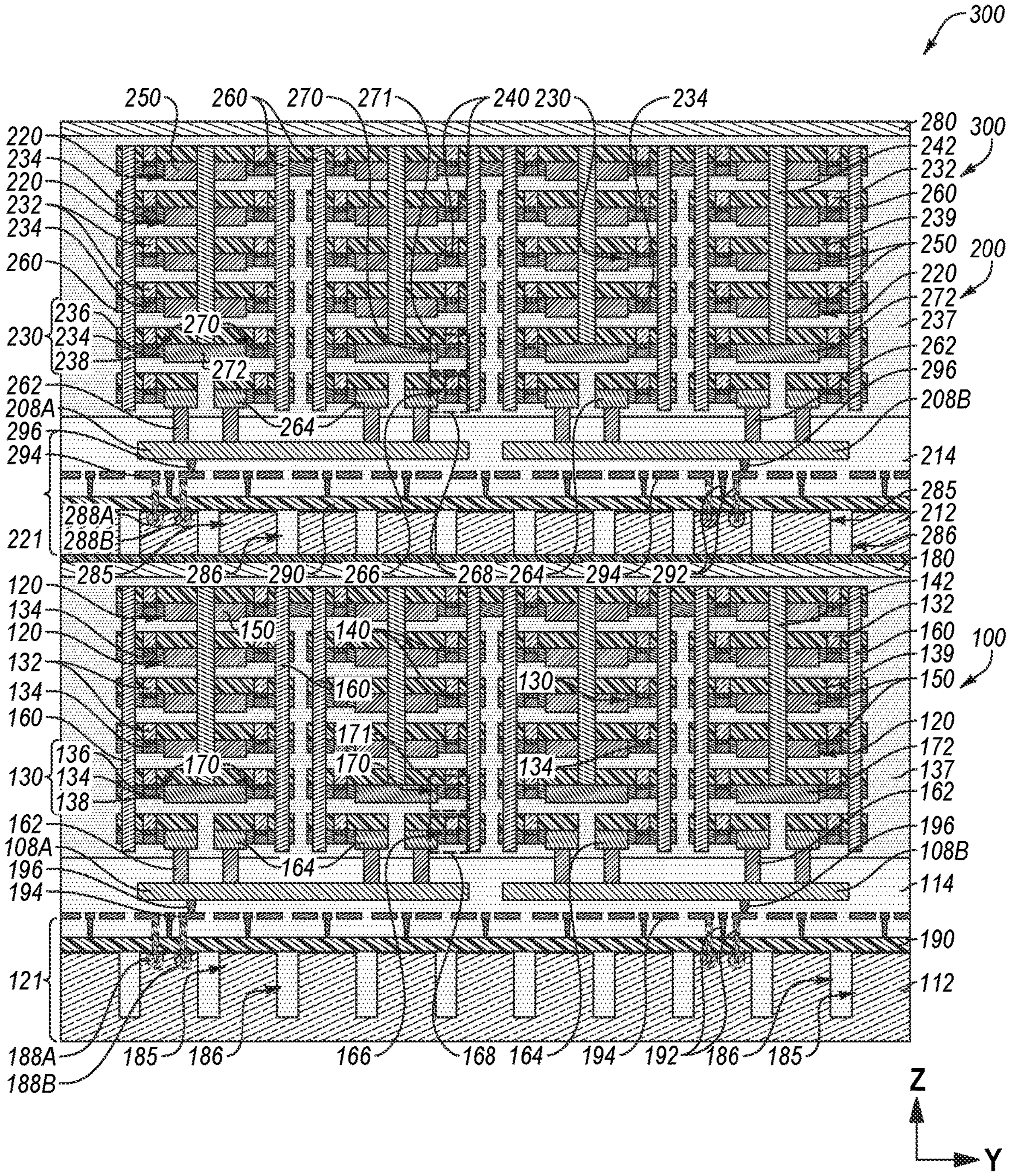
FIG. 3A through FIG. 3F are simplified, partial cross-sectional views illustrating a method of attaching the first microelectronic device structure assembly to the first microelectronic device structure, in accordance with embodiments of the disclosure.
Figure 3B:
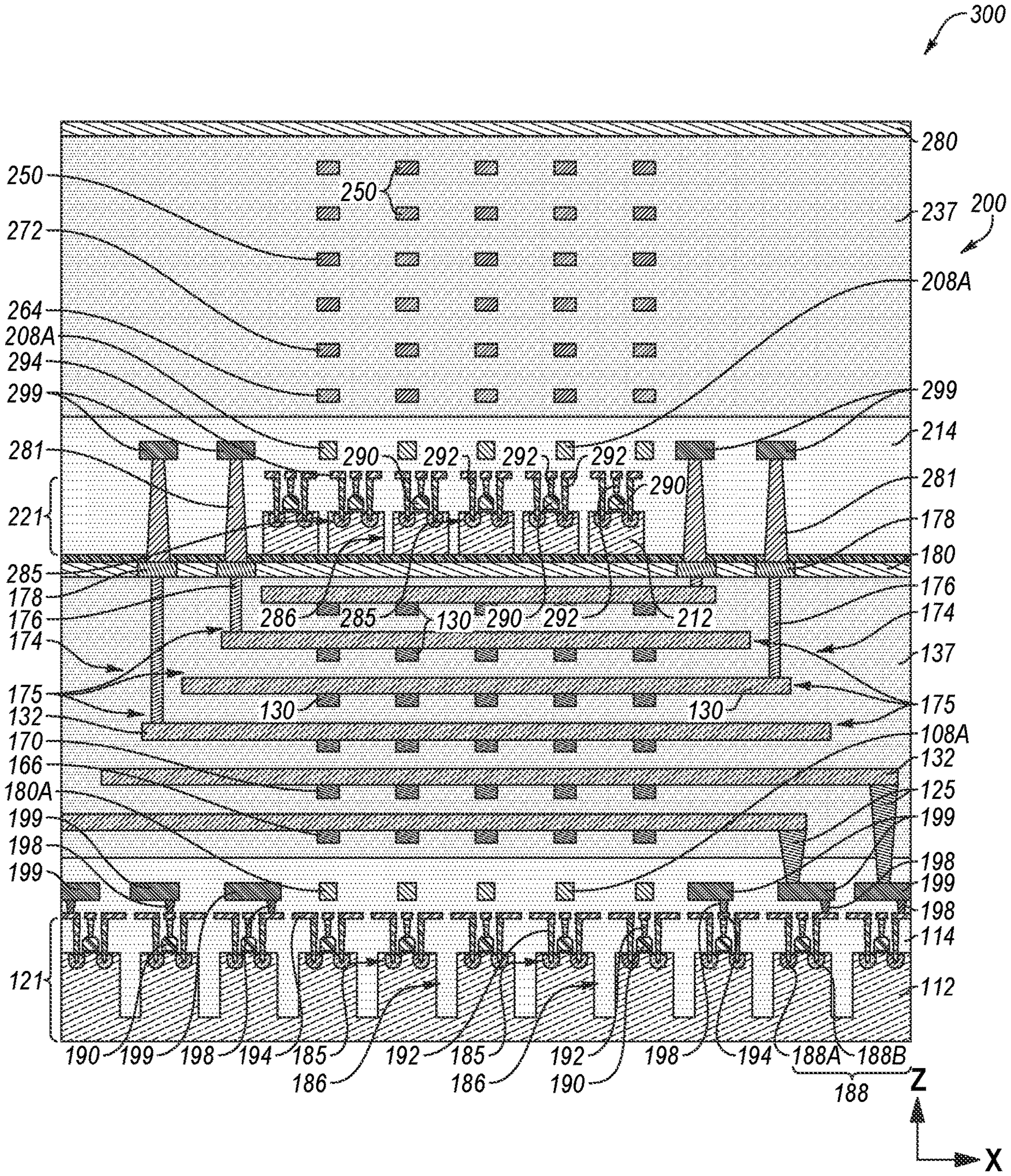
Figure 3C:
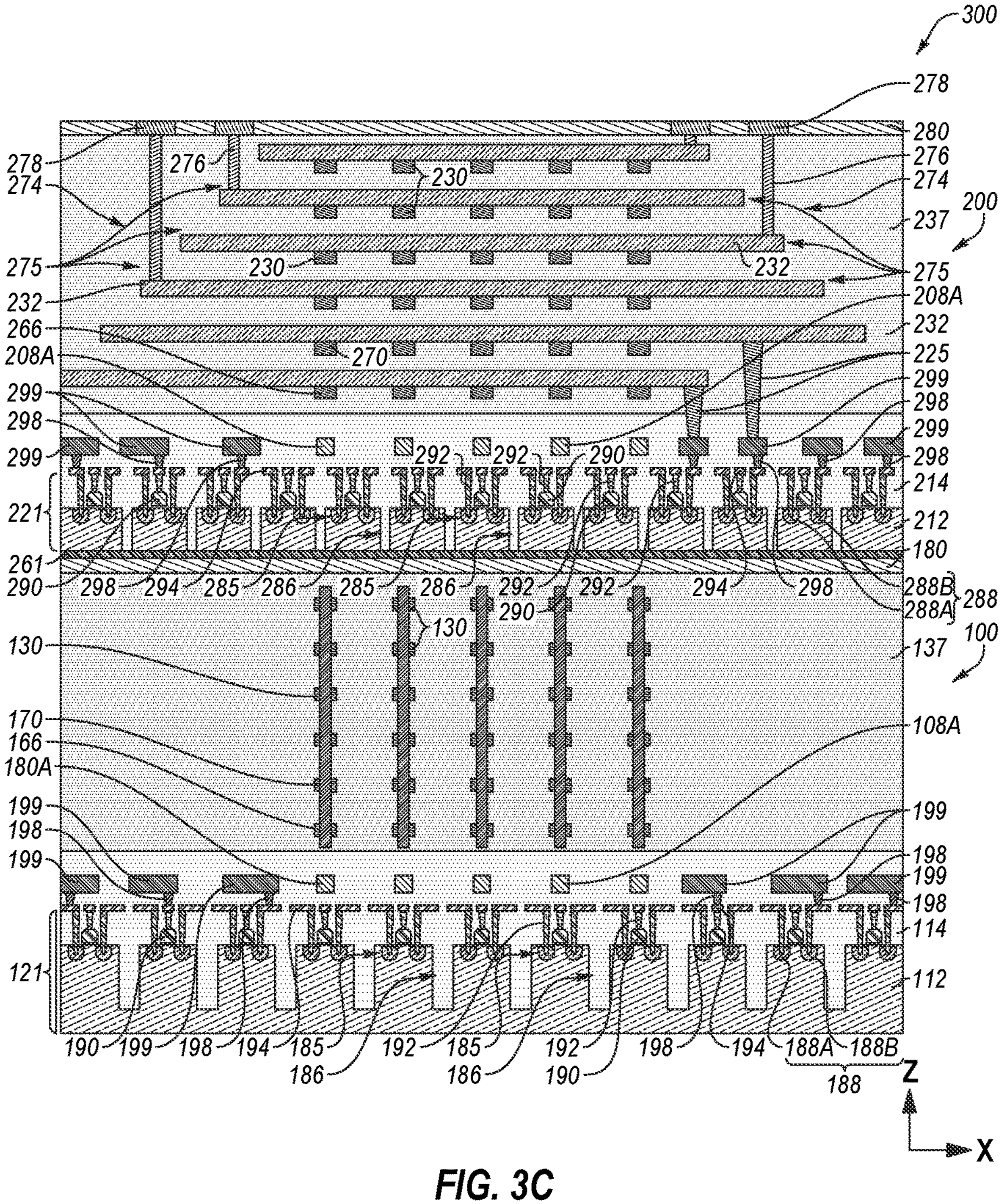
Figure 3D:
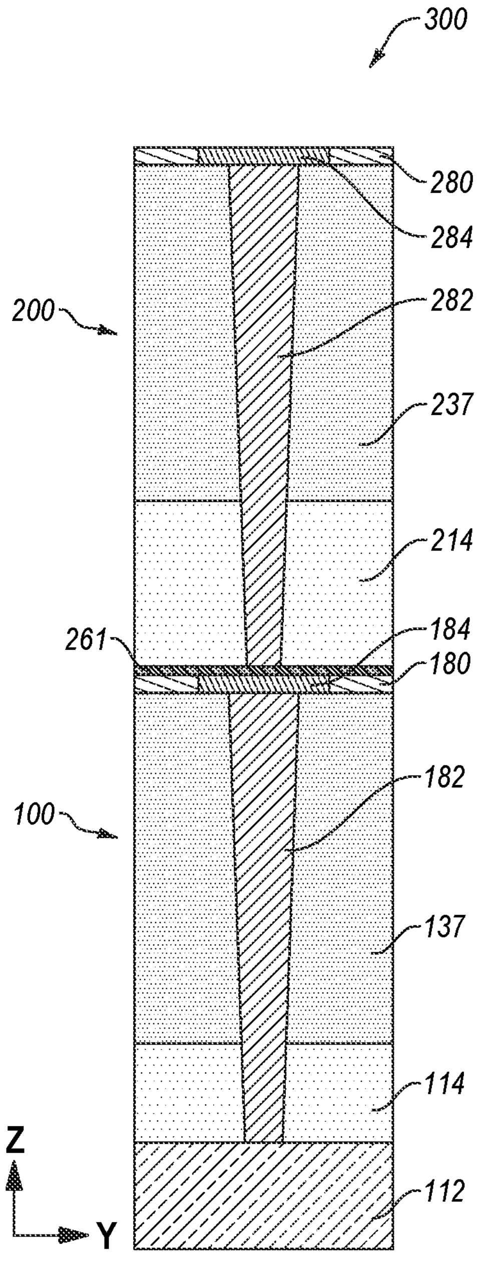
Figure 3E:
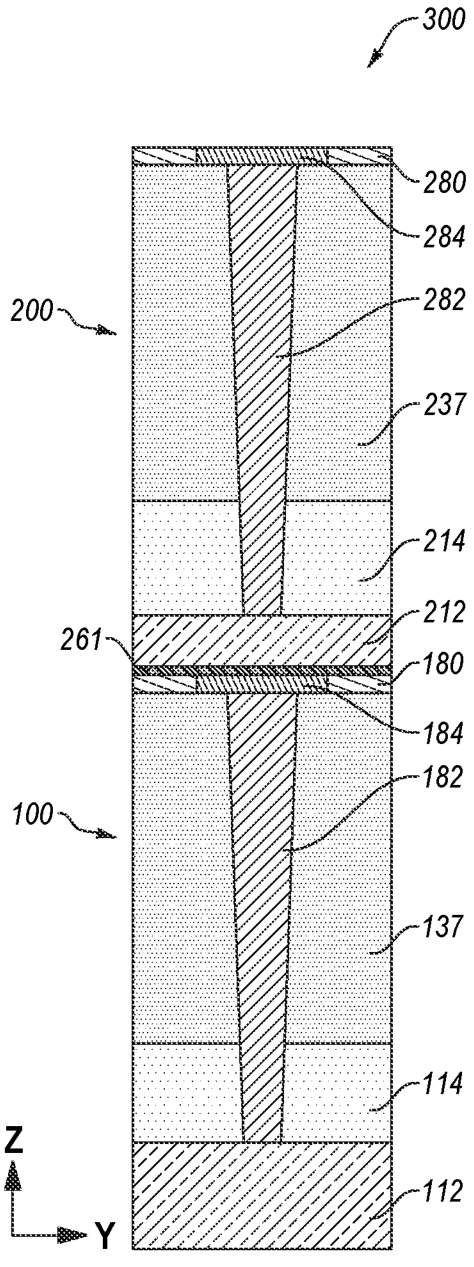
Figure 3F:
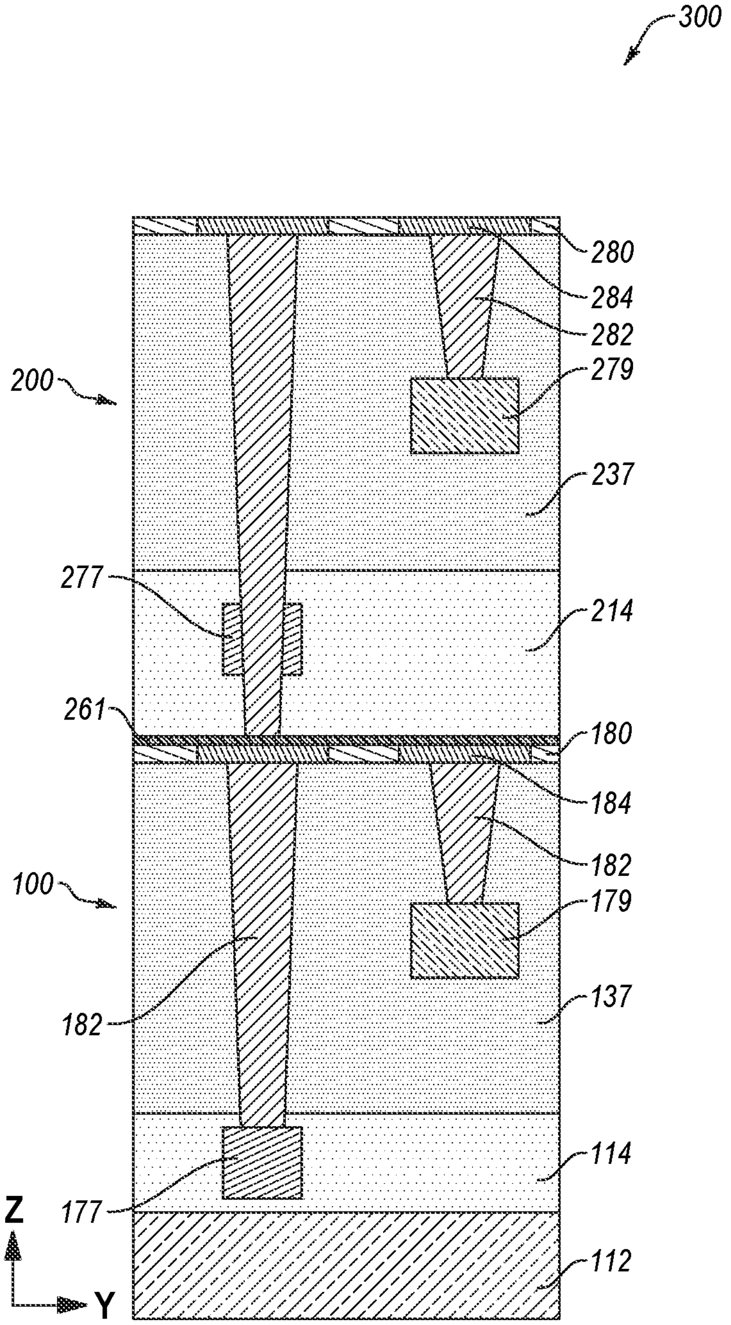

Referring now to FIG. 3A through FIG. 3F, the second microelectronic device structure 200 may be vertically (e.g., in the Z-direction) inverted (e.g., flipped) and attached to the first microelectronic device structure 100 to form a first microelectronic device structure assembly 300 comprising the first microelectronic device structure 100 and the second microelectronic device structure 200 attached to the first microelectronic device structure 100. FIG. 3A illustrates the same cross-sectional view of the first microelectronic device structure 100 as that illustrated in FIG. 1B and the same cross-sectional view of the second microelectronic device structure 200 as that illustrated in FIG. 2H; FIG. 3B illustrates the same cross-sectional view of the first microelectronic device structure 100 as that illustrated in FIG. 1C and the same cross-sectional view of the second microelectronic device structure 200 as that illustrated in FIG. 2J; FIG. 3C illustrates the same cross-sectional view of the first microelectronic device structure 100 as that illustrated in FIG. 1D and the same cross-sectional view of the second microelectronic device structure 200 as that illustrated in FIG. 2I; FIG. 3D illustrates the same cross-sectional view of the first microelectronic device structure 100 as that illustrated in FIG. 1E and the same cross-sectional view of the second microelectronic device structure 200 as that illustrated in FIG. 2K; FIG. 3E illustrates the same cross-sectional view of the first microelectronic device structure 100 as that illustrated in FIG. 1F and the same cross-sectional view of the second microelectronic device structure 200 as that illustrated in FIG. 2L; and FIG. 3F illustrates the same cross-sectional view of the first microelectronic device structure 100 as that illustrated in FIG. 1G and the same cross-sectional view of the second microelectronic device structure 200 as that illustrated in FIG. 2M.

In some embodiments, the second microelectronic device structure 200 is flipped (e.g., vertically flipped), and the sixth insulative material 261 of the second microelectronic device structure 200 is bonded to the second insulative material 180 of the first microelectronic device structure 100 to attach the first microelectronic device structure 100 to the second microelectronic device structure 200 and form the first microelectronic device structure assembly 300. After attaching the second microelectronic device structure 200 to the first microelectronic device structure 100, the carrier wafer assembly 255 may be removed from the second microelectronic device structure 200.

The second microelectronic device structure 200 may be attached to the first microelectronic device structure 100 by placing the sixth insulative material 261 in contact with the second insulative material 180 and exposing the second microelectronic device structure 200 and the first microelectronic device structure 100 to annealing conditions to form bonds (e.g., oxide-to-oxide bonds) between the fifth insulative material 259 in contact with the fourth insulative material 280. In some embodiments, the second microelectronic device structure 200 and the carrier wafer assembly 255 are exposed to a temperature greater than, for example, 800° C., to form the oxide-to-oxide bonds and attach the second microelectronic device structure 200 to the carrier wafer assembly 255.

As described in further detail herein, in some embodiments, attaching the second microelectronic device structure 200 to the first microelectronic device structure 100 includes horizontally aligning (e.g., in the X-direction) the second microelectronic device structure 200 with the first microelectronic device structure 100 and attaching the second microelectronic device structure 200 to the first microelectronic device structure 100. In some embodiments, one or more components of the second microelectronic device structure 200 is horizontally offset (e.g., in the Y-direction) from one or more corresponding components of the first microelectronic device structure 100.

With reference to FIG. 3A, in some embodiments, attaching the second microelectronic device structure 200 to the first microelectronic device structure 100 includes horizontally aligning (e.g., in the X-direction) the vertical stacks of memory cells 220 of the second microelectronic device structure 200 with the vertical stacks of memory cells 120 of the first microelectronic device structure 100. In some embodiments, the vertical stacks of memory cells 220 of the second microelectronic device structure 200 are located within horizontal boundaries (e.g., in the X-direction) of the vertical stacks of memory cells 120 of the first microelectronic device structure 100. In some embodiments, at least some of the vertical stacks of memory cells 220 of the second microelectronic device structure 200 may be horizontally offset (e.g., in the Y-direction) from at least some of the vertical stacks of memory cells 120 of the first microelectronic device structure 100.

In some embodiments, the second sense amplifier device region 205 is located within horizontal boundaries (e.g., in the X-direction, in the Y-direction) of the first sense amplifier device region 105. In some embodiments, each of the second sense amplifier device region 205, the second column decoder region 207, the second multiplexer controller region 209, the second sense amplifier driver region 211, the first sub word line driver region 217, and the second sub word line driver region are located within horizontal boundaries (e.g., in the X-direction, in the Y-direction) the first sense amplifier device region 105. In addition, the first sub word line driver region 217 is located within horizontal boundaries (e.g., in the X-direction, in the Y-direction) of the first column decoder region 107 and the second sub word line driver region 219 is located within horizontal boundaries (e.g., in the X-direction, in the Y-direction) of the first column decoder region 107 and the first multiplexer controller region 109 and the first sense amplifier driver region 111.

With collective reference to FIG. 3B and FIG. 3C, in some embodiments, attaching the second microelectronic device structure 200 to the first microelectronic device structure 100 includes horizontally aligning the fourth routing structures 299 electrically coupled to the transistor structures 285 of the first sub word line driver region 217 and the second sub word line driver region 219 with the first pad structures 178 (FIG. 3B) of the first microelectronic device structure 100; and horizontally aligning (e.g., in the Y-direction) the staircase structures 274 with at least a portion of the vertical stacks of memory cells 120 (such as the access devices 130 of the vertical stacks of memory cells 120).

In other embodiments, attaching the second microelectronic device structure 200 to the first microelectronic device structure 100 includes horizontally aligning (e.g., in the X-direction, in the Y-direction) the staircase structures 274 of the second microelectronic device structure 200 with the staircase structures 174 of the first microelectronic device structure 100. In some such embodiments, the transistor structures 285 of the first sub word line driver region 217 and the second sub word line driver region 219 are horizontally offset (e.g., in the Y-direction) from the staircase structures 174 and the staircase structures 274 and the fourth routing structures 299 in electrical communication with the transistor structures 285 of the first sub word line driver region 217 and the second sub word line driver region 219 are horizontally aligned (e.g., in the X-direction, in the Y-direction) with the staircase structures 174 and the staircase structures 274.

With collective reference to FIG. 3D and FIG. 3E, after attaching the second microelectronic device structure 200 to the first microelectronic device structure 100, eleventh conductive interconnect structures 282 may be formed vertically through (e.g., in the Z-direction) the fourth insulative material 280, the insulative structures 237, the third insulative material, and the sixth insulative material 261 to electrically connect to the second pad structures 184 (FIG. 3D) and/or with one or more components of the second base structure 212 (FIG. 3E) within the second input/output device and socket regions 213.

With reference to FIG. 3F, at least some of the eleventh conductive interconnect structures 282 are in electrical communication with the additional capacitor structures 277 and the additional pump structures 279. In some embodiment, at least some of the eleventh conductive interconnect structures 282 electrically connect to each of the capacitor structures 177 and the additional capacitor structures 277.

After forming the eleventh conductive interconnect structures 282, the fourth insulative material 280 may be formed over the first microelectronic device structure assembly 300 and fourth pad structures 284 may be formed in electrical communication with the eleventh conductive interconnect structures 282.

The eleventh conductive interconnect structures 282 may individually be formed of and include conductive material, such as, for example, one or more of the materials described above with reference to the global digit lines 208. In some embodiments, the eleventh conductive interconnect structures 282 individually comprise tungsten.

The fourth pad structures 284 may be formed of and include conductive material, such as one or more of the materials of the first pad structures 178. In some embodiments, the fourth pad structures 284 individually comprise substantially the same material composition as the first pad structures 178. In some embodiments, the fourth pad structures 284 are formed of and include tungsten. In other embodiments, the fourth pad structures 284 are formed of and include copper.

Figure 4:
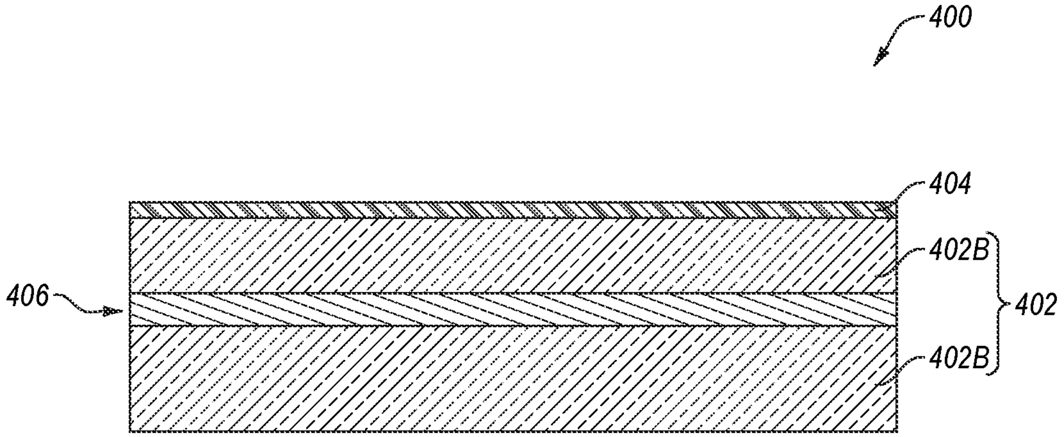
FIG. 4 is a simplified, partial longitudinal cross-sectional view of a third microelectronic device structure, in accordance with embodiments of the disclosure.
Figure 5A:
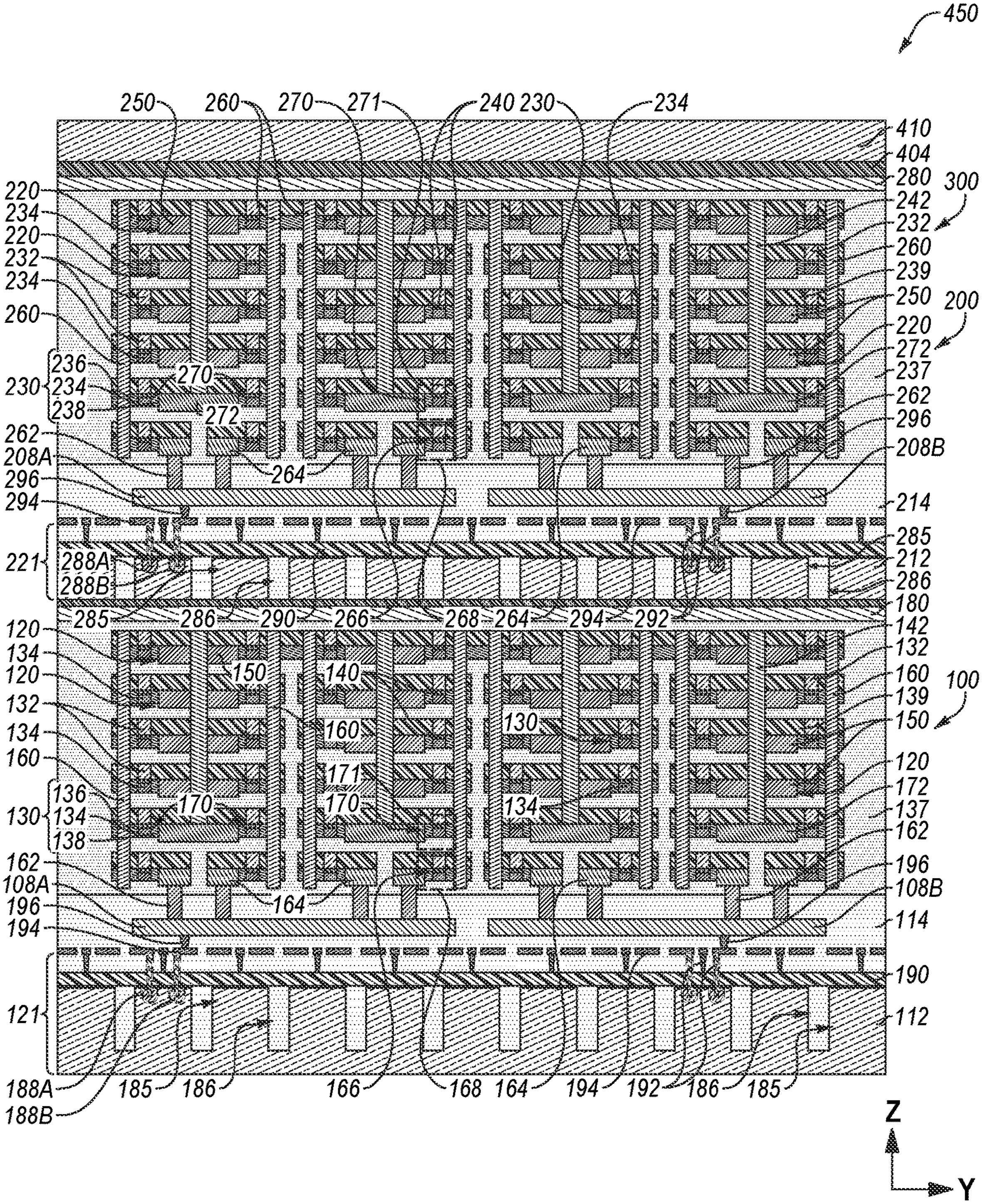
FIG. 5A through FIG. 5F are simplified, partial longitudinal cross-sectional views of a second microelectronic device structure assembly after attachment of the third microelectronic device structure to the first microelectronic device structure assembly, in accordance with embodiments of the disclosure.
Figure 5B:
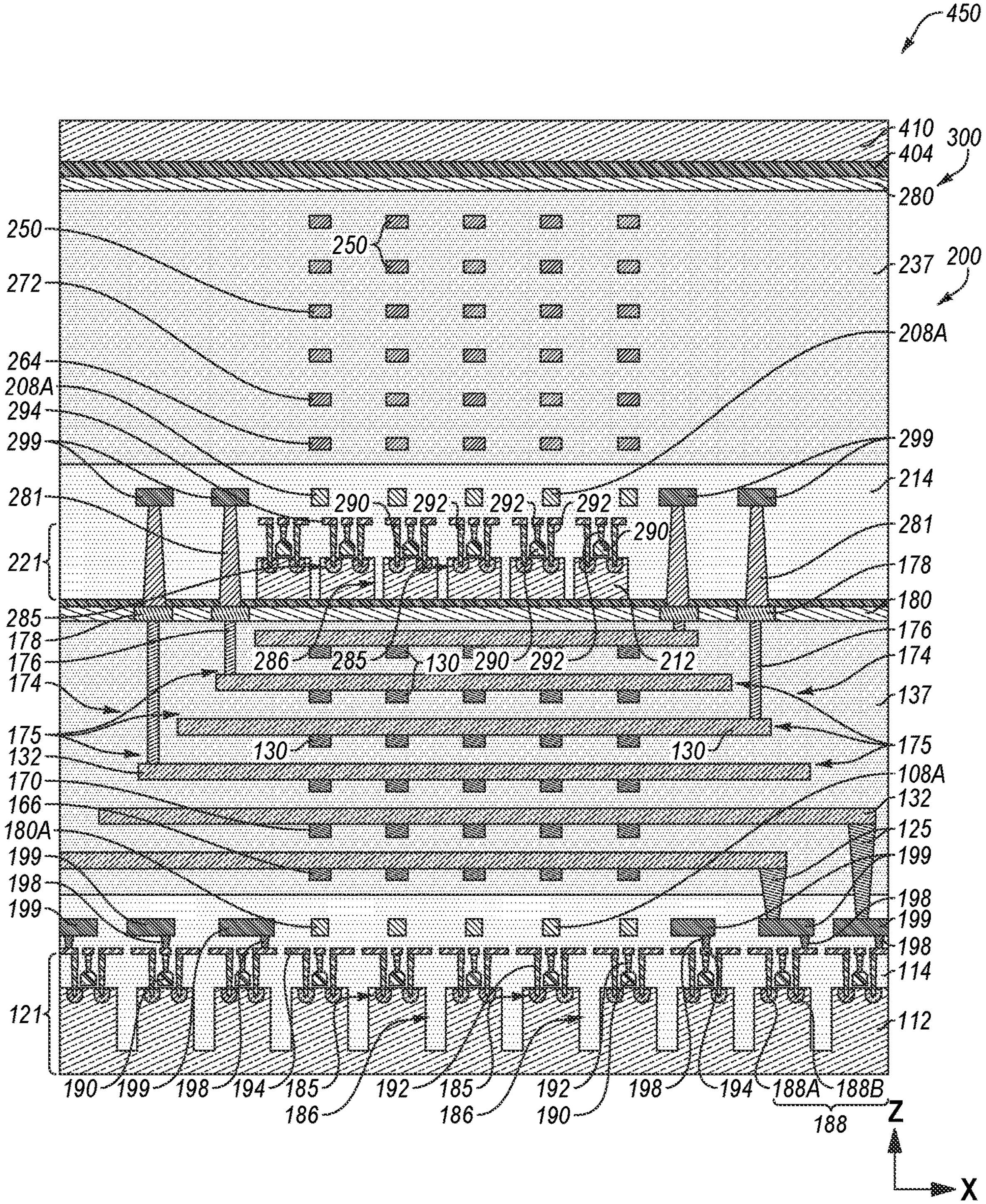
Figure 5C:
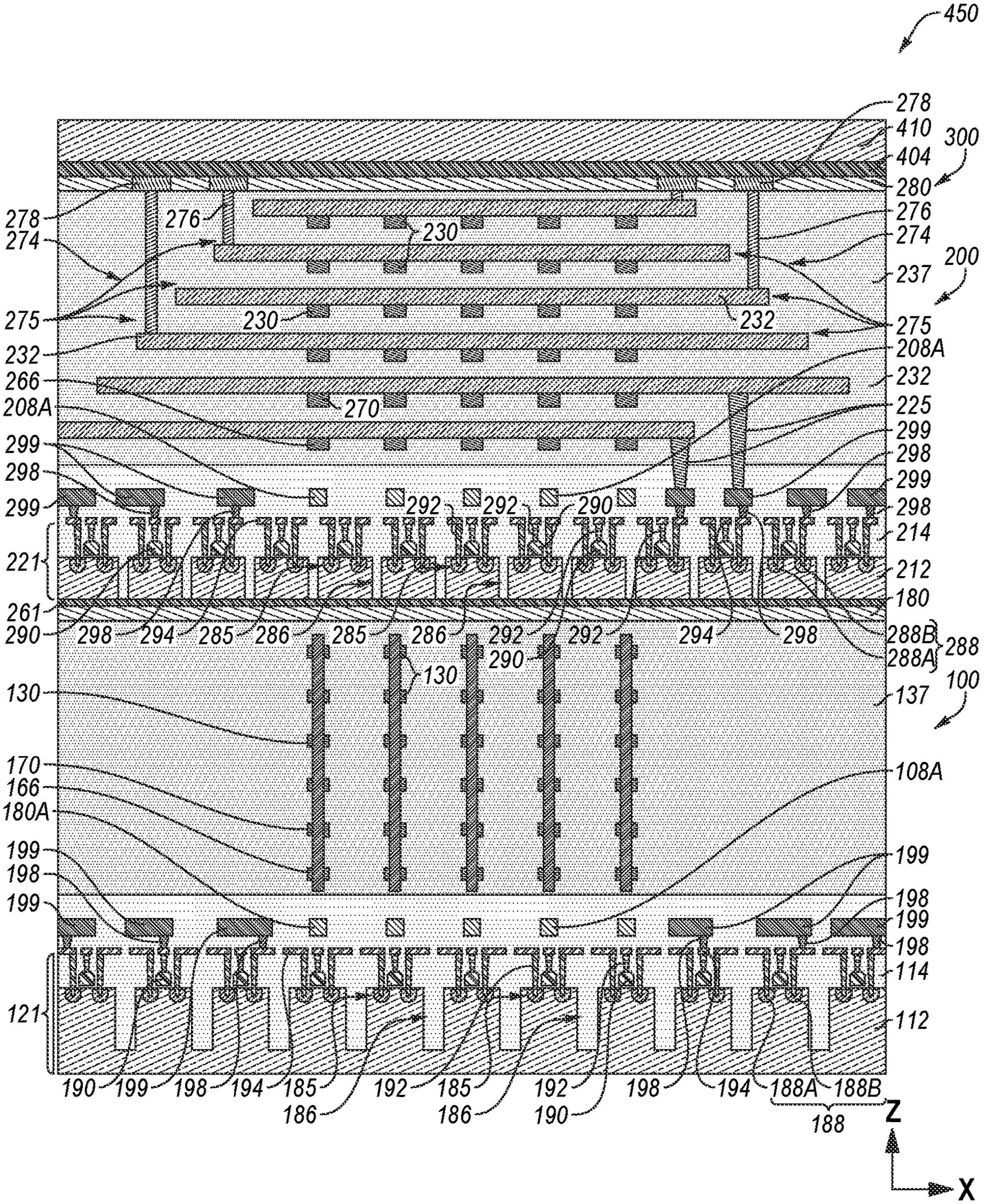
Figure 5D:
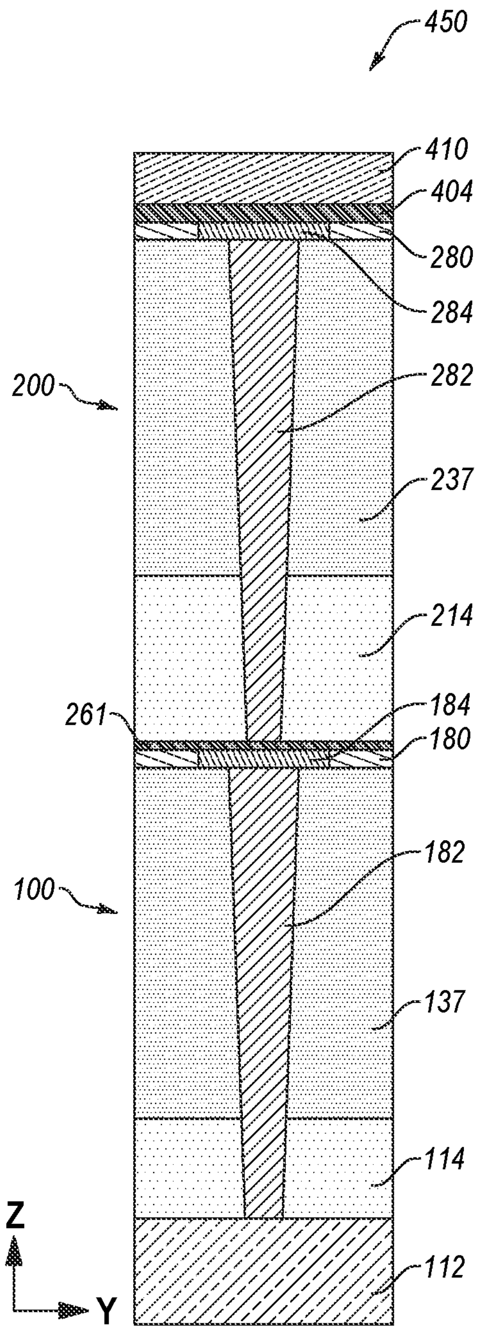
Figure 5E:
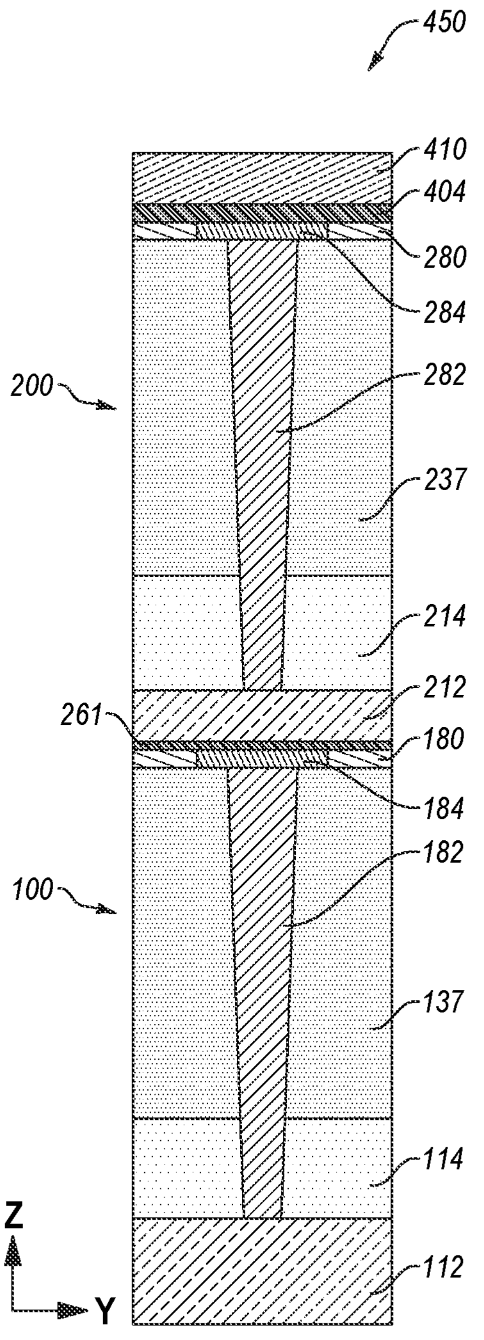
Figure 5F:
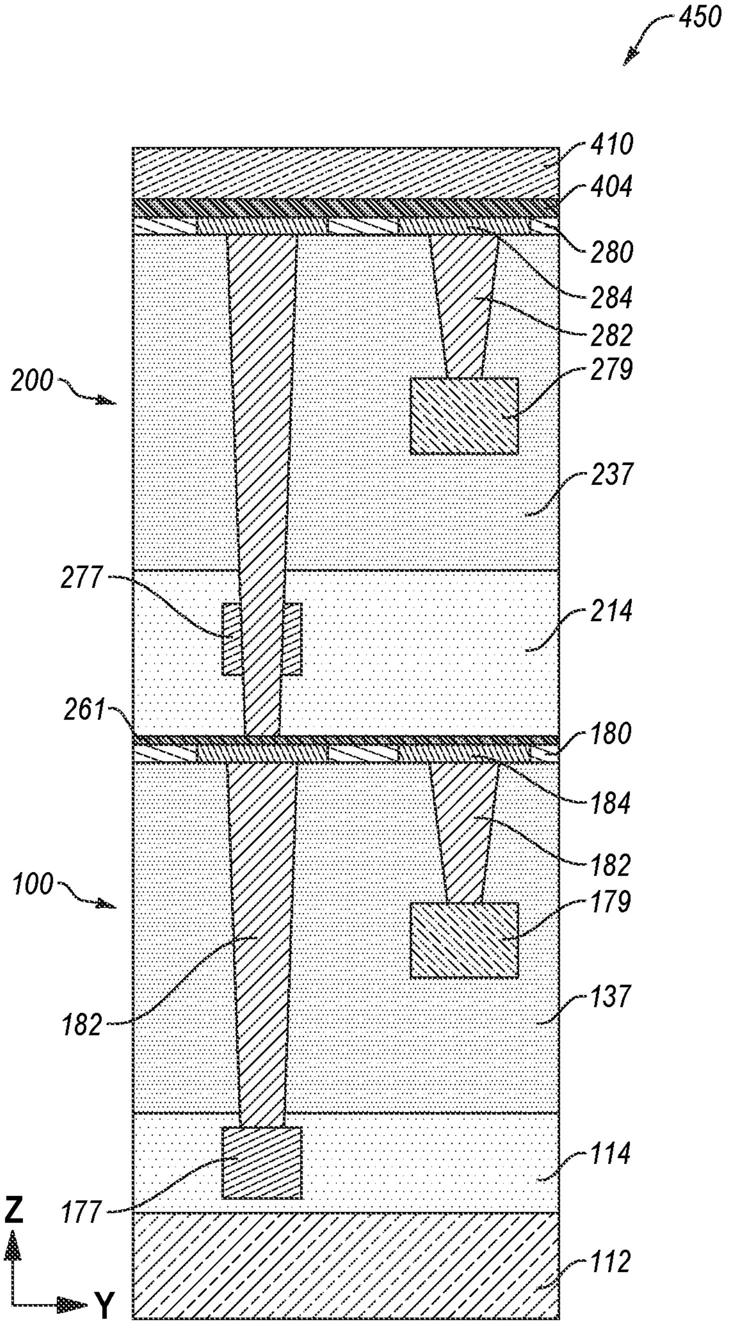

Referring next to FIG. 4, illustrated is simplified, partial longitudinal cross-sectional view of a third microelectronic device structure 400 (e.g., a second wafer) may be formed to include a semiconductor structure 402 and a seventh insulative material 404 formed on, over, or within the semiconductor structure 402. The third microelectronic device structure 400 may be formed separate from the first microelectronic device structure 100 (FIG. 1A through FIG. 1G) and the second microelectronic device structure 200 (FIG. 2A through FIG. 2M). Following separate formation, the third microelectronic device structure 400 may be attached to the first microelectronic device structure assembly 300 (FIG. 3A through FIG. 3F), as described in further detail below with reference to FIG. 5A through FIG. 5F.

The semiconductor structure 402 of the third microelectronic device structure 400 comprises a base material or construction upon which additional features (e.g., materials, structures, devices) of the formed. In some embodiments, the semiconductor structure 402 comprises a wafer. The semiconductor structure 402 may be formed of and include a semiconductor material (e.g., one or more of a silicon material, such monocrystalline silicon or polycrystalline silicon; silicon-germanium; germanium; gallium arsenide; a gallium nitride; gallium phosphide; indium phosphide; indium gallium nitride; and aluminum gallium nitride). By way of non-limiting example, the semiconductor structure 402 may comprise a semiconductor wafer (e.g., a silicon wafer). The semiconductor structure 402 may include one or more layers, structures, and/or regions formed therein and/or thereon.

As shown in FIG. 4, optionally, the semiconductor structure 402 may include at least one detachment region 406 therein configured to promote or facilitate detachment of a portion 402A of the semiconductor structure 402 proximate (e.g., adjacent) the seventh insulative material 404 from an additional portion 402B of the semiconductor structure 402 relatively more distal from the seventh insulative material 404. By way of non-limiting example, the detachment region 406 may include one more of dopants (e.g., hydrogen), void spaces, and/or structural features (e.g., defects, damage) promoting or facilitating subsequent detachment of the portion 402A from the additional portion 402B, as described in further detail below. A vertical depth $D_1$ (e.g., in the Z-direction) of the detachment region 406 within the semiconductor structure 402 may correspond to desired vertical height of the portion 402A of the semiconductor structure 402. The vertical height of the portion 402A may be selected at least partially based on desired configuration of additional features (e.g., structures, materials, devices) to be formed using the portion 402A of the semiconductor structure 402 following the detachment thereof from the additional portion 402B of the semiconductor structure 402. In some embodiments, the vertical depth $D_1$ of the detachment region 406 (and, hence, the vertical height of the portion 402A of the semiconductor structure 402) is within a range of from about 400 nanometers (nm) to about 800 nm. In additional embodiments, the detachment region 406 is absent from the semiconductor structure 402. In some of such embodiments, the additional portion 402B of the semiconductor structure 402 may subsequently be removed relative to the portion 402A of the semiconductor structure 402 through a different process (e.g., a non-detachment-based process, such as a conventional grinding process).

The seventh insulative material 404 of the third microelectronic device structure 400 may be formed of and include at least one insulative material. A material composition of the seventh insulative material 404 may be substantially the same as a material composition of the first insulative material 114; or the material composition of the seventh insulative material 404 may be different than the material composition of the first insulative material 114. In some embodiments, the seventh insulative material 404 is formed of and includes a dielectric oxide material, such as $SiO_x$ (e.g., $SiO_2$).

Referring next to FIG. 5A through FIG. 5F, illustrated are simplified, partial longitudinal cross-sectional views of a second microelectronic device structure assembly 450 after attachment of the third microelectronic device structure 400 to the first microelectronic device structure assembly 300. The cross-sectional view of FIG. 5A corresponds to the cross-sectional view of FIG. 3A; the cross-sectional view of FIG. 5B corresponds to the cross-sectional view of FIG. 3B; the cross-sectional view of FIG. 5C corresponds to the cross-sectional view of FIG. 3C; the cross-sectional view of FIG. 5D corresponds to the cross-sectional view of FIG. 3D; the cross-sectional view of FIG. 5E corresponds to the cross-sectional view of FIG. 3E; and the cross-sectional view of FIG. 5F corresponds to the cross-sectional view of FIG. 3F.

As illustrated in FIG. 5A through FIG. 5F, the first microelectronic device structure assembly 300 may be vertically inverted (e.g., flipped upside down in the Z-direction) and the seventh insulative material 404 may be attached (e.g., bonded, such as through oxide-oxide bonding) to the fourth insulative material 280 of the first microelectronic device structure assembly 300 to form the second microelectronic device structure assembly 450. Alternatively, the first microelectronic device structure assembly 300 may be vertically inverted (e.g., flipped upside down in the Z-direction) and attached to the third microelectronic device structure 400 to form the second microelectronic device structure assembly 450.

The third microelectronic device structure 400 may be attached to the first microelectronic device structure assembly 300 by placing the seventh insulative material 404 in contact with the fourth insulative material 280 and exposing the third microelectronic device structure 400 and the first microelectronic device structure assembly 300 to annealing conditions to form bonds (e.g., oxide-to-oxide bonds) between the seventh insulative material 404 and the fourth insulative material 280. In some embodiments, the third microelectronic device structure 400 and the first microelectronic device structure assembly 300 are exposed to a temperature greater than, for example, 800° C., to form the oxide-to-oxide bonds and attach the third microelectronic device structure 400 and the first microelectronic device structure assembly 300.

With continued reference to FIG. 5A through FIG. 5F, after attaching the third microelectronic device structure 400 to the first microelectronic device structure assembly 300, the additional portion 402B (FIG. 4) of the third microelectronic device structure 400 may be removed using conventional processes (e.g., a detachment process; a wafer thinning process, such as a grinding processes) and conventional processing equipment, which are not described in detail herein. By way of non-limiting example, in some embodiments wherein the semiconductor structure 402 (FIG. 4) includes the detachment region 406 (FIG. 4) including one more of dopants (e.g., hydrogen), void spaces, and/or structural features (e.g., defects, damage) promoting or facilitating subsequent detachment of the portion 402A (FIG. 4) from the additional portion 402B (FIG. 4), the semiconductor structure 402 (FIG. 4) may be acted upon to effectuate such detachment at or proximate the detachment region 406. In addition, parts of the additional portion 402B of the semiconductor structure 402 maintained following the removal of the additional portion 402B of the semiconductor structure 402 may be further processed (e.g., polished, patterned) to remove damaged portions of the portion 402A using conventional processes (e.g., conventional CMP processes, conventional masking processes, conventional etching processes) and conventional processing equipment to form a third base structure 410, which are also not described in detail herein. A vertical height (e.g., in the Z-direction) of the third base structure 410 may be less than or equal to the vertical height of the portion 402A of the semiconductor structure 402. In some embodiments, the vertical height of the third base structure 410 is formed to be less than the vertical height of the portion 402A of the semiconductor structure 402. For example, the vertical height of the third base structure 410 may be formed to be within a range of from about 200 nm to about 500 nm, such as from about 300 nm to about 400 nm.

Figure 6A:
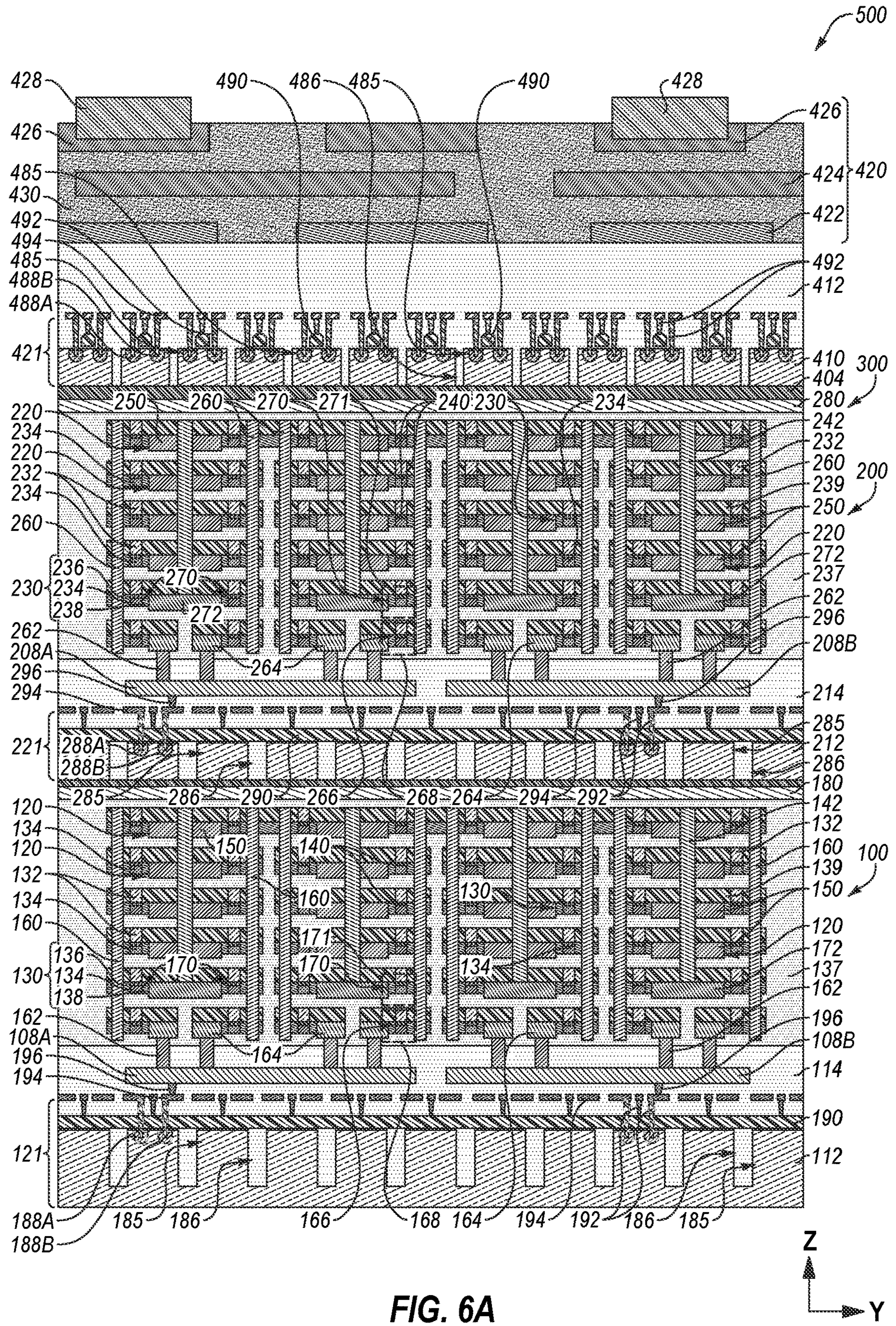
FIG. 6A through FIG. 6F are simplified, partial cross-sectional views illustrating further processing of the second microelectronic device structure assembly to form a microelectronic device, in accordance with embodiments of the disclosure.

Referring now to FIG. 6A through FIG. 6F, the second microelectronic device structure assembly 450 (FIG. 5A through FIG. 5F) may be further processed to form a microelectronic device 500 including additional CMOS devices and circuitry and control logic devices formed within the third microelectronic device structure 400 and a back end of line (BEOL) region vertically over (e.g., in the Z-direction) the third microelectronic device structure 400. FIG. 6A corresponds to the cross-sectional view of FIG. 5A; the cross-sectional view of FIG. 6B corresponds to the cross-sectional view of FIG. 5B; the cross-sectional view of FIG. 6C corresponds to the cross-sectional view of FIG. 5C; the cross-sectional view of FIG. 6D corresponds to the cross-sectional view of FIG. 5D; the cross-sectional view of FIG. 6E corresponds to the cross-sectional view of FIG. 5E; and the cross-sectional view of FIG. 6F corresponds to the cross-sectional view of FIG. 5F.

Figure 6B:
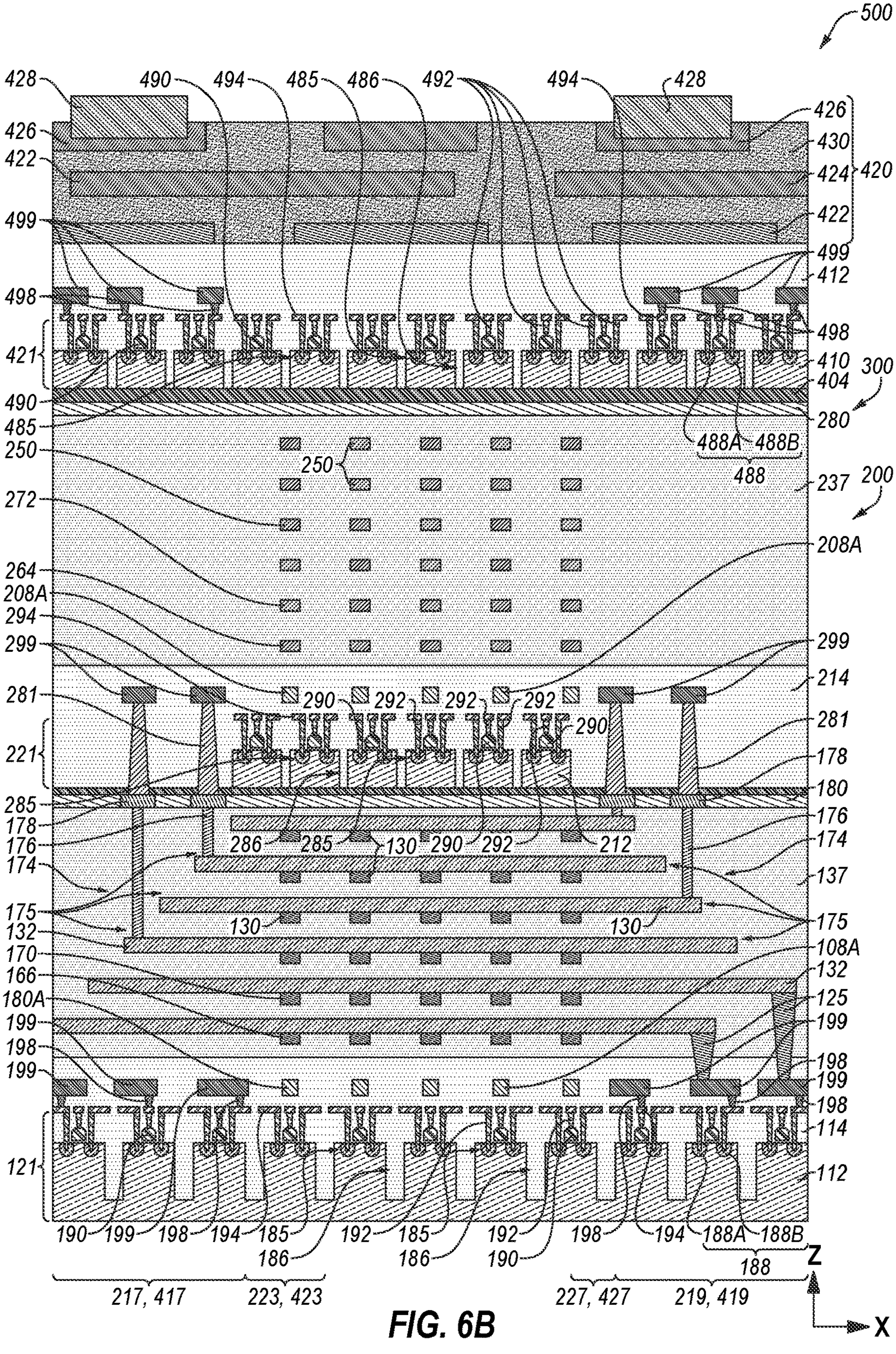
Figure 6C:
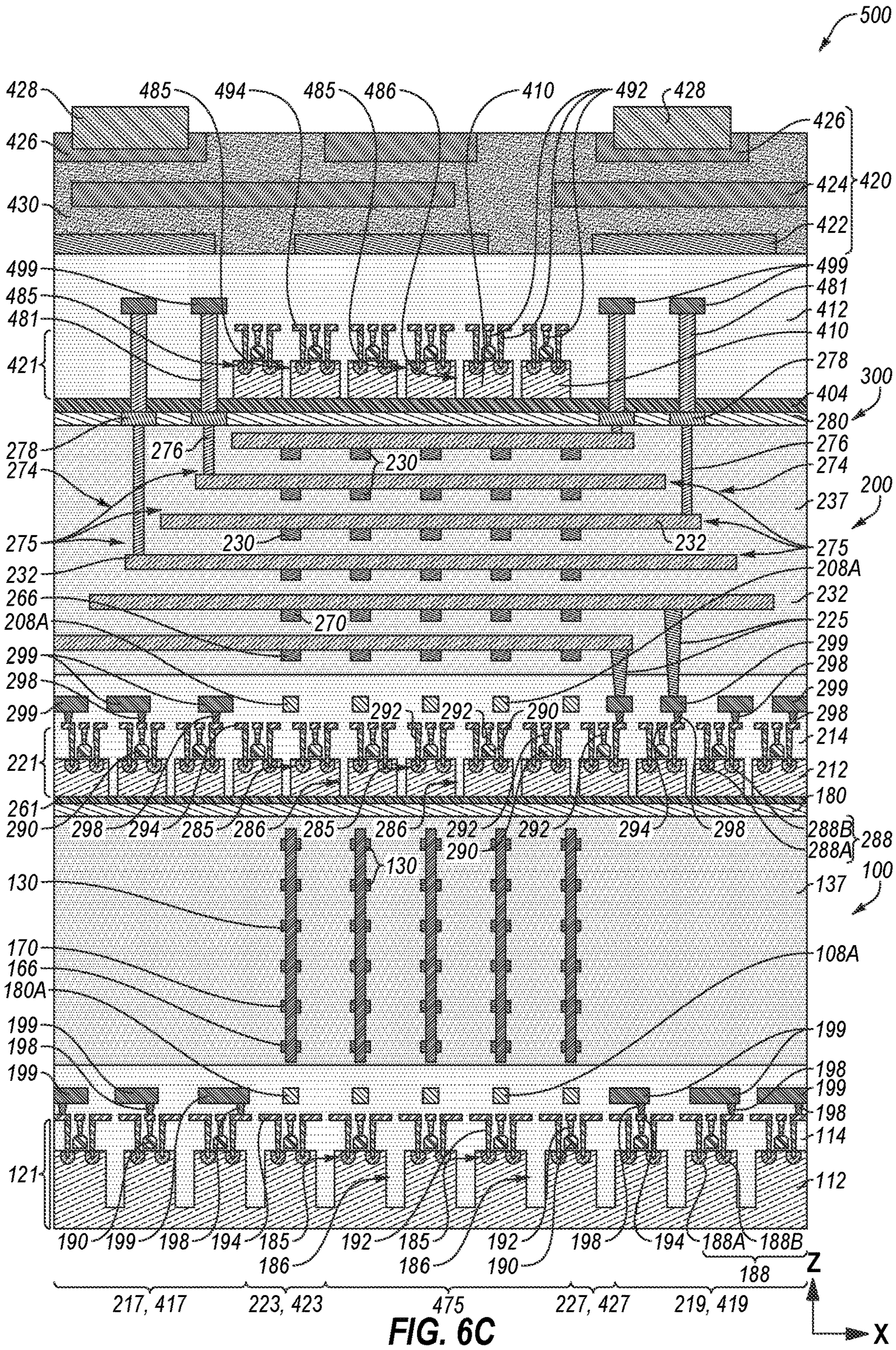

With collective reference to FIG. 6A through FIG. 6C, openings may be formed in the third base structure 410 to isolate neighboring portions of the third base structure 410 and the openings may be filled with an eighth insulative material 412. Transistor structures 485, substantially similar to the transistor structures 285, may be formed to form a third control logic device region 421 within the third base structure 410. The transistor structures 485 may be isolated from one another by trench structures 486 comprising the eighth insulative material 412. The transistor structures 485 may each individually include, for example, conductively doped regions 488, each of which includes a source region 488A and a drain region 488B; and a gate structure 490. The conductively doped regions 488 and the gate structures 490 may be substantially the same as the conductively doped regions 288 and the gate structures 290. The eighth insulative material 412 may include one or more of the materials described above with reference to the first insulative material 112.

Twelfth conductive interconnect structures 492 may be in electrical communication with the gate structures 490 and the conductively doped regions 488 and may individually electrically connect each of the gate structures 490 and the conductively doped regions to fifth routing structures 494. The twelfth conductive interconnect structures 492 and the fifth routing structures 494 may be substantially similar to the sixth conductive interconnect structures 292 and the third routing structures 294.

With collective reference to FIG. 6B and FIG. 6C, the third control logic device region 421 includes an additional first sub word line driver region 417 and an additional second sub word line driver region 419. An additional first row decoder device region 423 horizontally neighbors (e.g., in the X-direction, in the Y-direction) the additional first sub word line driver region 417; and an additional second row decoder device region 427 horizontally neighbors (e.g., in the X-direction, in the Y-direction) the additional second sub word line driver region 419. An additional CMOS device region 475 horizontally neighbors (e.g., in the X-direction, in the Y-direction) each of the additional first row decoder device region 423 and the additional second row decoder device region 427. The additional first sub word line driver region 417 may be substantially the same as the first sub word line driver region 217; the additional second sub word line driver region 419 may be substantially the same as the second sub word line driver region 219; the additional first row decoder device region 423 may be substantially the same as the first row decoder device region 223; and the additional second row decoder device region 427 may be substantially the same as the second row decoder device region 227. In some embodiments, each of the additional first sub word line driver region 417, the additional second sub word line driver region 419, the additional first row decoder device region 423, and the additional second row decoder device region 427 may have a horizontal area (e.g., in the XY plate) that is less than a horizontal area of the respective first sub word line driver region 217, the second sub word line driver region 219, the first row decoder device region 223, and the second row decoder device region 227.

In some embodiments, such as where the every other step of each staircase structure 274 is in electrical communication with an additional first conductive contact structure 276, one of the additional first sub word line driver region 417 and the additional second sub word line driver region 419 comprises an even sub word line driver region including even sub word line drivers configured to be in electrical communication with even levels of the conductive structures 232 and the other of the additional first sub word line driver region 417 and the second sub word line driver region 419 comprises an odd word line driver region including odd sub word line drivers configured to be in electrical communication with odd levels of the conductive structures 232.

The additional CMOS device region 475 may include one or more control logic devices configured for effectuating control operations of one or more of the memory cells 120 of the first microelectronic device structure 100, the memory cells 220 of the third microelectronic device structure 400, the capacitor structures 177, the additional capacitor structures 277, 477, the pump structures 179, and the additional pump structures 279, 479. By way of non-limiting example, the one or more additional CMOS device regions 475 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), one or more data output devices (e.g., DQU, DQL), data input/output terminals (e.g., DQ pins, DQ pads), drain supply voltage ($V_{DD}$) regulators, control devices configured to control column operations and/or row operations for arrays (e.g., the first array region 101, the second array region 201) of the first microelectronic device structure 100 and the second microelectronic device structure 200, such as decoders (e.g., local deck decoders), repair circuitry (e.g., column repair circuitry, row repair circuitry), memory test devices, array multiplexers (MUX), and error checking and correction (ECC) devices, self-refresh/wear leveling devices, page buffers, data paths, I/O devices (e.g., local I/O devices) and controller logic (timing circuitry, clock devices (e.g., a global clock device)), deck enable, read/write circuitry, address circuitry, or other logic devices and circuitry, and various chip/deck control circuitry. The devices and circuitry included in the one or more additional CMOS device regions 475 may employ different conventional conductive metal-oxide-semiconductor (CMOS) devices (e.g., conventional CMOS inverters, conventional CMOS NAND gates, conventional CMOS transmission pass gates, etc.), which are not described in detail herein.

The additional first sub word line driver region 417 may be located vertically over (e.g., in the Z-direction) and within horizontal boundaries (e.g., in the X-direction, in the Y-direction) of the first sub word line driver region 217; the additional second sub word line driver region 419 may be located vertically over (e.g., in the Z-direction) and within horizontal boundaries (e.g., in the X-direction, in the Y-direction) of the second sub word line driver region 219; the additional first row decoder device region 423 may be located vertically over (e.g., in the Z-direction) and within horizontal boundaries (e.g., in the X-direction, in the Y-direction) of the first row decoder device region 223; and the additional second row decoder device region 427 may be located vertically over (e.g., in the Z-direction) and within horizontal boundaries (e.g., in the X-direction, in the Y-direction) of the second sub word line driver region 219.

In some embodiments, each of the additional first sub word line driver region 417 and the additional second sub word line driver region 419 are vertically over the staircase structures 174 and the staircase structures 274.

Each of the additional first sub word line driver region 417 and the additional second sub word line driver region 419 individually include transistor structures 485 in electrical communication with thirteenth conductive interconnect structures 498 that are, in turn, in electrical communication with sixth routing structures 499. The thirteenth conductive interconnect structures 498 and the sixth routing structures 499 are substantially similar to the respective eighth conductive interconnect structures 298 and the fourth routing structures 299.

Referring now to FIG. 6C, the sixth routing structures 499 in electrical communication with the transistor structures 485 within the additional first sub word line driver region 417 and an additional second sub word line driver region 419 are in electrical communication with fourteenth conductive interconnect structures 481 that are in electrical communication with the third pad structures 278. The third pad structures 278 are, in turn, in electrical communication with additional first conductive contact structures 276 in electrical communication with the conductive structures 232.

Figure 6D:
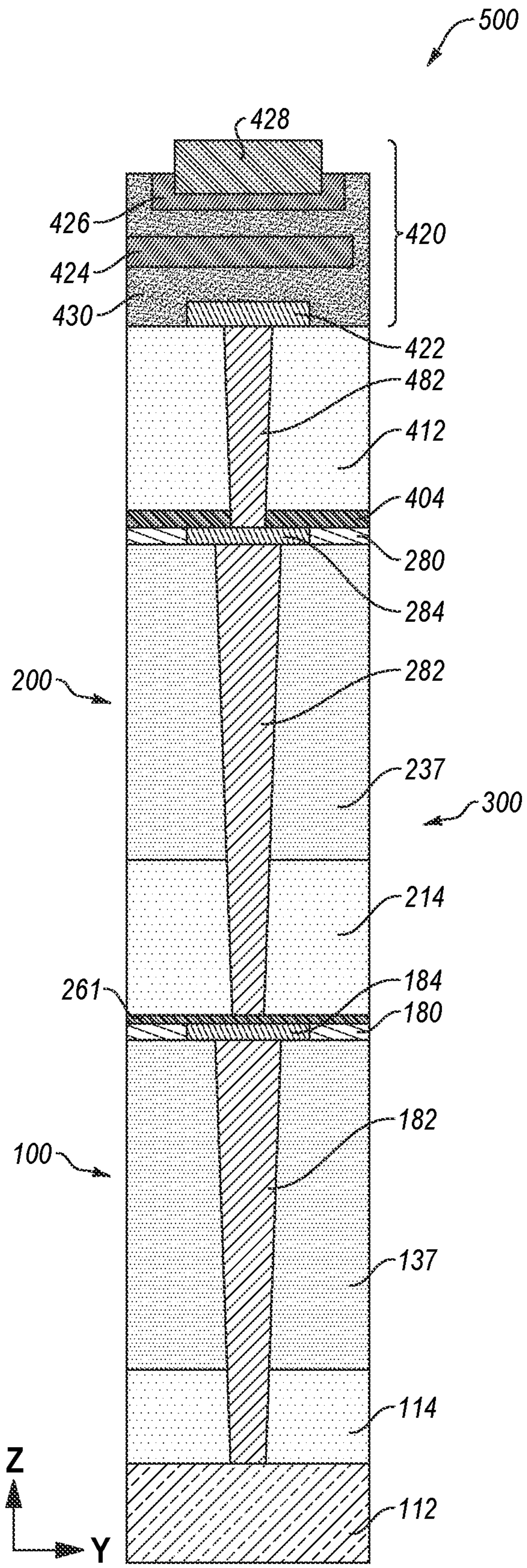
Figure 6E:
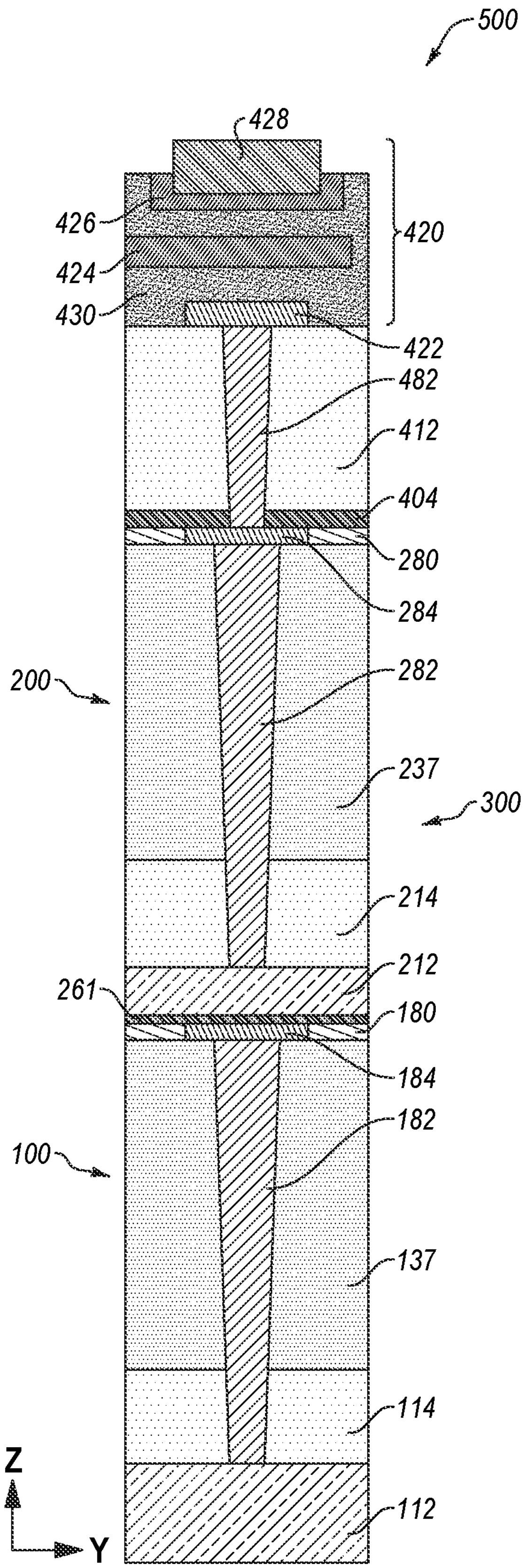
Figure 6F:
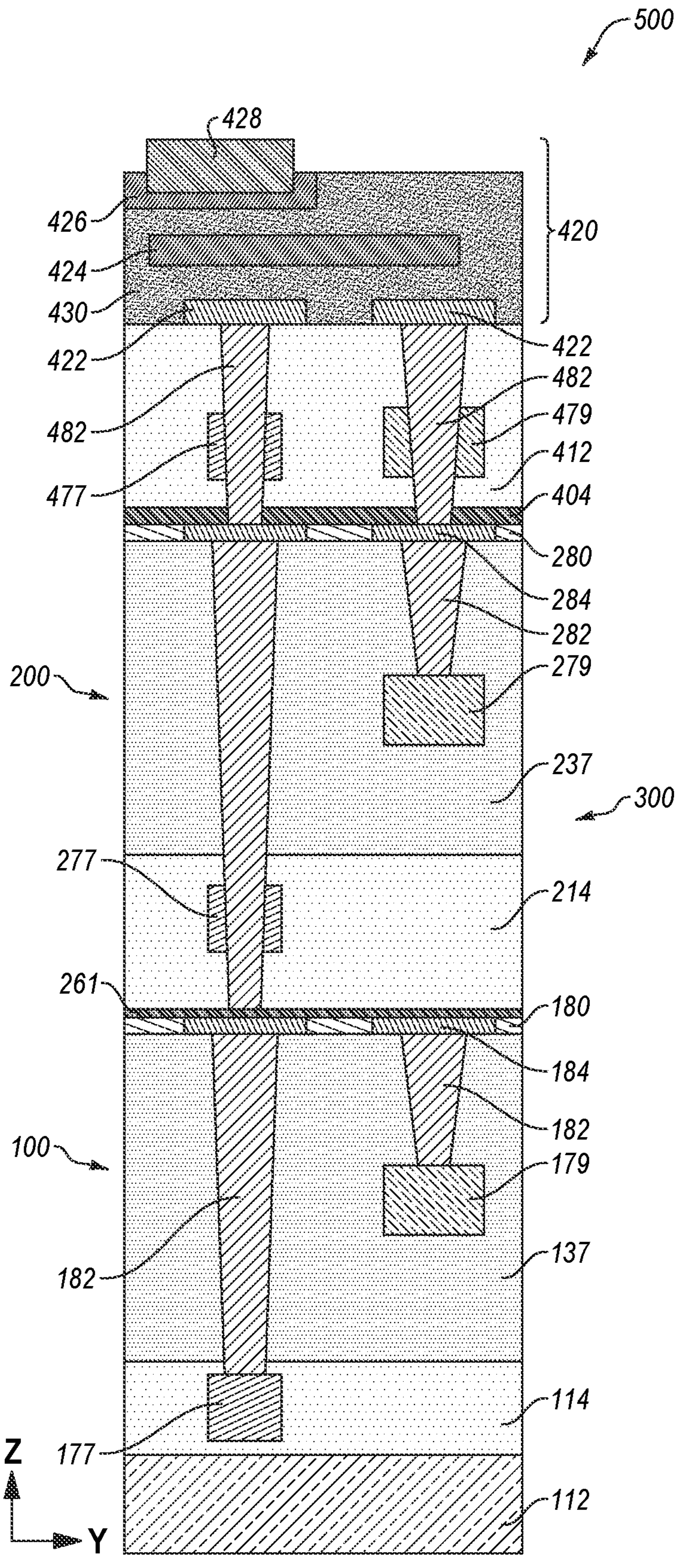

Referring to FIG. 6D and FIG. 6E, in some embodiments, fourteenth conductive interconnect structures 482 may be formed vertically through (e.g., in the Z-direction) the eighth insulative material 412 and electrically connect to the fourth pad structures 284. With reference to FIG. 6F, in some embodiments, additional capacitor structures 477 and additional pump structures 479 are formed within the eighth insulative material 412 vertically over the respective additional capacitor structures 277 and the additional pump structures 279. The additional capacitor structures 477 and additional pump structures 479 may be substantially the same as the respective additional capacitor structures 277 and the additional pump structures 279.

With reference to FIG. 6F, at least some of the fourteenth conductive interconnect structures 482 are in electrical communication with the additional capacitor structures 477 and the additional pump structures 479. In some embodiments, at least some of the fourteenth conductive interconnect structures 482 electrically connect to each of the capacitor structures 477 and the additional capacitor structures 477.

The fourteenth conductive interconnect structures 482 may individually be formed of and include conductive material, such as one or more of the materials described above with reference to the first conductive interconnect structures 192. In some embodiments, the fourteenth conductive interconnect structures 482 individually comprise tungsten. In other embodiments, the fourteenth conductive interconnect structures 482 individually comprise copper.

With continued reference to FIG. 6A through FIG. 6F, after forming the third control logic device region 421, the additional capacitor structures 477, and the additional pump structures 479 over the second microelectronic device structure 200, a back end of line (BEOL) structure 420 may be formed vertically over (e.g., in the Z-direction) the second microelectronic device structure assembly 450 within a ninth insulative material 430 to form the microelectronic device 500.

With collective reference to FIG. 6A through FIG. 6F, fifth pad structures 422 may be formed over the third control logic device region 421. With reference to FIG. 6D and FIG.

6E, the fifth pad structures 422 in each of the first input/output (I/O) device and socket regions 113, the first additional electronic device region 115, the second input/output (I/O) device and socket regions 213, and the second additional electronic device region 215 may be in electrical communication with the fourteenth conductive interconnect structures 482.

The fifth pad structures 422 may individually be formed of and include conductive material, such as one or more of the materials described above with reference to the first pad structures 178. In some embodiments, the fifth pad structures 422 are individually formed of and include tungsten. In other embodiments, the fifth pad structures 422 are individually formed of and include copper.

Conductive line structures 424 may be formed vertically over (e.g., in the Z-direction) the fifth pad structures 422, sixth pad structures 426 may be formed vertically over the conductive line structures 424, and conductive landing pad structures 428 may be formed in electrical communication with the sixth pad structures 426. In some embodiments, conductive interconnect structures vertically extend between and electrically connect at least some of the fifth pad structures 422 to at least some of the conductive line structures 424; and at least some of the conductive line structures 424 to at least some of the sixth pad structures 426.

Each of the conductive line structures 424, the sixth pad structure 426, and the conductive landing pad structures 428 are formed of and include conductive material. Each of the conductive line structures 424, the sixth pad structures 426, and the conductive landing pad structures 428 may individually be formed of and include tungsten. In other embodiments, each of the conductive line structures 424, the sixth pad structure 426, and the conductive landing pad structures 428 may individually be formed of and include copper. In yet other embodiments, each of the conductive line structures 424, the sixth pad structure 426, and the conductive landing pad structures 428 may individually be formed of and include aluminum.

The ninth insulative material 430 may be formed of and include insulative material, such as one or more of the materials described above with reference to the first insulative material 114. In some embodiments, the ninth insulative material 430 comprises silicon dioxide.

Accordingly, the microelectronic device 500 may include the first microelectronic device structure 100 comprising the first array region 101 including vertical stacks of memory cells 120 and the second microelectronic device structure 200 vertically above (e.g., in the Z-direction) the first microelectronic device structure 100 and comprising the second array region 201 including additional vertical stacks of memory cells 220. The microelectronic device 500 includes the first microelectronic device structure 100 including the first control logic device region 121 including the first sense amplifier device region 105, the first column decoder region 107, the first multiplexer controller region 109, the first sense amplifier driver region 111; the second microelectronic device structure 200 vertically over (e.g., in the Z-direction) the first microelectronic device structure 100 and including the second control logic device region 221 including the second sense amplifier device region 205, the second column decoder region 207, the second multiplexer controller region 209, the second sense amplifier driver region 211, the first sub word line driver region 217, the second sub word line driver region 219, the first row decoder device region 223, and the second row decoder device region 227; and the third control logic device region 421 vertically over (e.g., in the Z-direction) the second microelectronic device structure 200 and including the additional first sub word line driver region 417, the additional second sub word line driver region 419, the additional first row decoder device region 423, and the additional second row decoder device region 427. The first sub word line driver region 217, the second sub word line driver region 219, the first row decoder device region 223, and the second row decoder device region 227 of the second control logic device region 221 of the second microelectronic device structure 200 are configured to effectuate control operations of the memory cells 120 of the first array region 101 of the first microelectronic device structure 100; and the additional first sub word line driver region 417, the additional second sub word line driver region 419, the additional first row decoder device region 423, and the additional second row decoder device region 427 of the third base structure 410 are configured to effectuate control operations of the memory cells 220 of the second array region 201 of the second microelectronic device structure 200. Thus, in some embodiments, the second control logic device region 221 includes control logic circuitry (e.g., the first sub word line driver region 217, the second sub word line driver region 219, the first row decoder device region 223, and the second row decoder device region 227) configured to effectuate control operations of memory cells 120 vertically underlying (e.g., in the Z-direction) the second control logic device region 221 includes additional control logic circuitry (e.g., the second sense amplifier device region 205, the second column decoder region 207, the second multiplexer controller region 209, the second sense amplifier driver region 211) configured to effectuate control operations of memory cells 220 vertically overlying (e.g., in the Z-direction) the second control logic device region 221. The third control logic device region 421 includes control logic circuitry (e.g., the additional first sub word line driver region 417, the additional second sub word line driver region 419, the additional first row decoder device region 423, and the additional second row decoder device region 427) configured to effectuate control operations of memory cells 220 vertically underlying (e.g., in the Z-direction) the third control logic device region 421.

Forming the microelectronic device 500 as described herein and the control logic device region 121, the second control logic device region 221, and the third control logic device region 421 including the control logic device regions described herein facilitates forming each of the first microelectronic device structure 100 and the second microelectronic device structure 200 to include a greater number of respective levels of memory cells 120 and levels of memory cells 220 in a smaller horizontal footprint (e.g., in the X-direction, in the Y-direction) compared to conventional microelectronic devices. In some embodiments, dividing at least some of the control logic circuitry among the first microelectronic device structure 100 (e.g., the first control logic device region 121 the first sense amplifier device region 105, the first column decoder region 107, the first multiplexer controller region 109, the first sense amplifier driver region 111), the second microelectronic device structure 200 (e.g., the second control logic device region 221 including the second sense amplifier device region 205, the second column decoder region 207, the second multiplexer controller region 209, the second sense amplifier driver region 211, the first sub word line driver region 217, the second sub word line driver region 219, the first row decoder device region 223, and the second row decoder device region 227) and the third base structure 410 (e.g., the third control logic device region 421 including the additional first sub word line driver region 417, the additional second sub word line driver region 419, the additional first row decoder device region 423, and the additional second row decoder device region 427) may facilitate forming a greater quantity of levels of memory cells 120, 220 within the first microelectronic device structure 100 and the second microelectronic device structure 200.

In some embodiments, separating the sense amplifier device from the sub word line driver regions configured to effectuate control operations for memory cells (e.g., separating the first sense amplifier device region 105 of the first microelectronic device structure 100 configured to effectuate control operations of the memory cells 120 from first sub word line driver region 217, the second sub word line driver region 219, the first row decoder device region 223, and the second row decoder device region 227 configured to effectuate control operations of the memory cells 120; and separating the second sense amplifier device region 205 of the second microelectronic device structure 200 configured to effectuate control operations of the memory cells 220 from additional first sub word line driver region 417, the additional second sub word line driver region 419, the additional first row decoder device region 423, and the additional second row decoder device region 427 configured to effectuate control operations of the memory cells 220) facilitates forming the microelectronic device 500 to include a greater quantity and density of memory cells compared to conventional microelectronic devices since such regions conventionally consume a relatively larger area of the microelectronic device (e.g., the first base structure 112, the second base structure 212, the third base structure 410) compared to other control logic device regions.

Thus, in accordance with some embodiments, a microelectronic device comprises a first microelectronic device structure comprising a first memory array region comprising vertical stacks of memory cells, each vertical stack of memory cells comprising a vertical stack of access devices operably coupled to a vertical stack of storage devices, conductive lines operably associated with the access devices of the vertical stack of access devices and extending in a horizontal direction, horizontal ends of the conductive lines defining staircase structures, and conductive contact structures individually in electrical communication with a conductive line of the conductive lines at a step of a staircase structure of the staircase structures. The first microelectronic device structure further comprises a first control logic device region comprising first control logic devices configured to effectuate control operations for the vertical stacks of memory cells. The microelectronic device further comprises a second microelectronic device structure vertically overlying the first microelectronic device structure. The second microelectronic device structure comprises a second memory array region comprising additional vertical stacks of memory cells, each of the additional vertical stacks of memory cells comprising an additional vertical stack of access devices operably coupled to an additional vertical stack of storage devices, and a second control logic device region. The second control logic device region comprises second control logic devices configured to effectuate control operations for the additional vertical stacks of memory cells of the second microelectronic device structure, and additional first control logic devices configured to effectuate control operations of the vertical stacks of memory cells of the first microelectronic device structure.

Furthermore, in accordance with additional embodiments of the disclosure, a microelectronic device comprises a first die comprising vertical stacks of memory cells, a stack structure comprising conductive structures interleaved with insulative structures, at least some of the conductive structures configured to be in electrical communication with memory cells of the vertical stacks of memory cells, and a first control logic device region comprising a first sense amplifier device region comprising first sense amplifier devices configured to be operably coupled to the memory cells of the vertical stacks of memory cells. The microelectronic device further comprises a second die comprising additional vertical stacks of memory cells, an additional stack structure comprising additional conductive structures interleaved with additional insulative structures, at least some of the additional conductive structures configured to be in electrical communication with memory cells of the additional vertical stacks of memory cells, and a second control logic device region. The second control logic device region comprises a second sense amplifier device region comprising second sense amplifier devices configured to be operably coupled to the memory cells of the additional vertical stacks of memory cells, and sub word line driver regions comprising sub word line drivers operably coupled to the conductive structures of the first die.

Moreover, in accordance with some embodiments of the disclosure, a method of forming a microelectronic device comprises forming a first microelectronic device structure and forming a second microelectronic device structure. The first microelectronic device structure comprises a first control logic device region comprising a first sense amplifier device region, vertical stacks of memory cells vertically overlying the first control logic device region, conductive structures intersecting the vertical stacks of memory cells, conductive interconnect structures in electrical communication with the conductive structures, and a first oxide material vertically overlying the vertical stack of memory cells. The second microelectronic device structure comprises a second control logic device region comprising a second sense amplifier device region, additional vertical stacks of memory cells vertically overlying the second control logic device region, additional conductive structures intersecting the additional vertical stacks of memory cells, additional conductive interconnect structures in electrical communication with the additional conductive structures, and a second oxide material vertically underlying the second control logic device region. The method further comprises attaching the second microelectronic device structure to the first microelectronic device structure to form a first microelectronic device structure, and forming a third control logic device region over the second microelectronic device structure.

Figure 7:
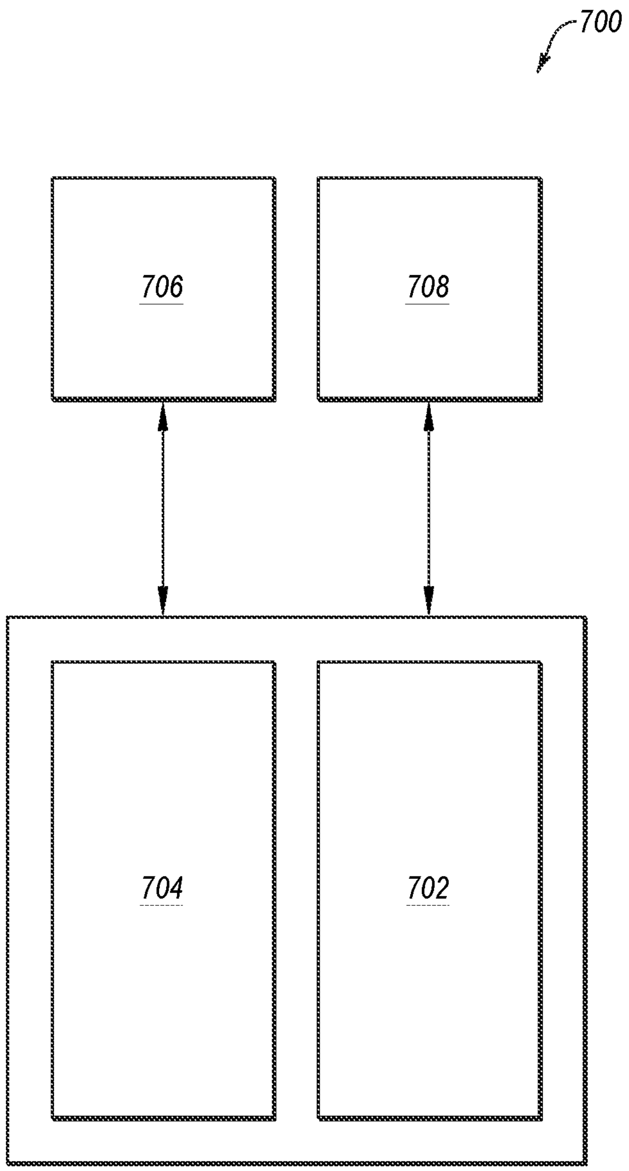
FIG. 7 is a schematic block diagram of an electronic system, in accordance with an embodiment of the disclosure.

Structures, assemblies, and devices in accordance with embodiments of the disclosure may be included in electronic systems of the disclosure. For example, FIG. 7 is a block diagram of an illustrative electronic system 700 according to embodiments of disclosure. The electronic system 700 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 700 includes at least one memory device 702. The memory device 702 may comprise, for example, an embodiment of one or more of a microelectronic device structure, a microelectronic device structure assembly, a relatively larger microelectronic device structure assembly, and a microelectronic device previously described herein with reference to FIG. 1A through FIG. 6F.

The electronic system 700 may further include at least one electronic signal processor device 704 (often referred to as a "microprocessor"). The electronic signal processor device 704 may, optionally, include an embodiment of one or more of a microelectronic device structure, a microelectronic device structure assembly, a relatively larger microelectronic device structure assembly, and a microelectronic device previously described herein with reference to FIG. 1A through FIG. 6F. While the memory device 702 and the electronic signal processor device 704 are depicted as two (2) separate devices in FIG. 7, in additional embodiments, a single (e.g., only one) memory/processor device having the functionalities of the memory device 702 and the electronic signal processor device 704 is included in the electronic system 700. In such embodiments, the memory/processor device may include one or more of a microelectronic device structure, a microelectronic device structure assembly, a relatively larger microelectronic device structure assembly, and a microelectronic device previously described herein with reference to FIG. 1A through FIG. 6F. The electronic system 700 may further include one or more input devices 706 for inputting information into the electronic system 700 by a user, such as, for example, a mouse or other pointing device, a keyboard, a touchpad, a button, or a control panel. The electronic system 700 may further include one or more output devices 708 for outputting information (e.g., visual or audio output) to a user such as, for example, one or more of a monitor, a display, a printer, an audio output jack, and a speaker. In some embodiments, the input device 706 and the output device 708 may comprise a single touchscreen device that can be used both to input information to the electronic system 700 and to output visual information to a user. The input device 706 and the output device 708 may communicate electrically with one or more of the memory device 702 and the electronic signal processor device 704.

Thus, in accordance with embodiments of the disclosure, an electronic system comprises an input device, an output device, a processor device operably coupled to the input device and the output device, and a memory device operably coupled to the processor device. The memory device comprises a first die and a second die. The first die comprises vertical stacks of memory cells, a first control logic device region vertically underlying the vertical stacks of memory cells and comprising first control logic devices configured for effectuating control operations of the vertical stacks of memory cells, and first global digit lines vertically between the first control logic device region and the vertical stacks of memory cells, each of the first global digit lines configured to be in electrical communication with at least some of the vertical stacks of memory cells. The second die comprises additional vertical stacks of memory cells, a second control logic device region vertically underlying the additional vertical stacks of memory cells and comprising second control logic devices configured for effectuating control operations of the additional vertical stacks of memory cells, and second global digit lines vertically between the second control logic device region and the additional vertical stacks of memory cells.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:

a first microelectronic device structure comprising:

a first memory array region comprising:

vertical stacks of memory cells, each vertical stack of memory cells comprising a vertical stack of access devices operably coupled to a vertical stack of storage devices;

conductive lines operably associated with the access devices of the vertical stack of access devices and extending in a horizontal direction, horizontal ends of the conductive lines defining staircase structures; and conductive contact structures individually in electrical communication with a conductive line of the conductive lines at a step of a staircase structure of the staircase structures; and a first control logic device region comprising first control logic devices configured to effectuate control operations for the vertical stacks of memory cells; and a second microelectronic device structure vertically overlying the first microelectronic device structure, the second microelectronic device structure comprising:

a second memory array region comprising additional vertical stacks of memory cells, each of the additional vertical stacks of memory cells comprising an additional vertical stack of access devices operably coupled to an additional vertical stack of storage devices; and a second control logic device region comprising:

second control logic devices configured to effectuate control operations for the additional vertical stacks of memory cells of the second microelectronic device structure; and additional first control logic devices configured to effectuate control operations of the vertical stacks of memory cells of the first microelectronic device structure; and a third control logic device region vertically overlying the second microelectronic device structure, the third control logic device region comprising additional second control logic devices configured to effectuate control operations of the additional vertical stacks of memory cells of the second microelectronic device structure.

2. The microelectronic device of claim 1, wherein the second memory array region further comprises:

additional conductive lines operably associated with the access devices of the additional vertical stack of access devices and extending in the horizontal direction, horizontal ends of the additional conductive lines defining additional staircase structures; and additional conductive contact structures individually in electrical communication with an additional conductive line of the additional conductive lines at a step of an additional staircase structure of the staircase structures.

3. The microelectronic device of claim 1, wherein the third control logic device region further comprises complementary metal-oxide-semiconductor (CMOS) devices.

4. The microelectronic device of claim 1, wherein additional first control logic devices are configured to effectuate control operations for the additional vertical stacks of memory cells of the second control logic device region and comprise sub word line drivers.

5. The microelectronic device of claim 4, wherein the additional first control logic devices are configured to effectuate control operations for the additional vertical stacks of memory cells of the second microelectronic device structure and further comprise row decoders.

6. The microelectronic device of claim 1, wherein:
the first control logic devices of the first control logic device region comprise first sense amplifier devices; and
the second control logic devices of the second control logic device region comprise second sense amplifier devices.

7. The microelectronic device of claim 1, wherein the first control logic device region is vertically below the first memory array region.

8. The microelectronic device of claim 7, wherein the second control logic device region vertically intervenes between the first memory array region and the second memory array region.

9. The microelectronic device of claim 1, wherein the additional vertical stacks of memory cells of the second memory array region comprise fewer levels of memory cells than the vertical stacks of memory cells of the first memory array region.

10. The microelectronic device of claim 1, wherein every other conductive line of the conductive lines of one of the staircase structures is in electrical communication with one of the conductive contact structures at a first horizontal end of the conductive lines.

11. The microelectronic device of claim 1, further comprising global digit lines vertically between the first control logic device region and the first memory array region.

12. A microelectronic device, comprising:
a first die comprising:
vertical stacks of memory cells;
a stack structure comprising conductive structures interleaved with insulative structures, at least some of the conductive structures configured to be in electrical communication with memory cells of the vertical stacks of memory cells; and
a first control logic device region comprising a first sense amplifier device region comprising first sense amplifier devices configured to be operably coupled to the memory cells of the vertical stacks of memory cells; and
a second die comprising:
additional vertical stacks of memory cells;
an additional stack structure comprising additional conductive structures interleaved with additional insulative structures, at least some of the additional conductive structures configured to be in electrical communication with memory cells of the additional vertical stacks of memory cells; and
a second control logic device region comprising:
a second sense amplifier device region comprising second sense amplifier devices configured to be operably coupled to the memory cells of the additional vertical stacks of memory cells; and
sub word line driver regions comprising sub word line drivers operably coupled to the conductive structures of the first die; and
a third control logic device region vertically overlying the second die and comprising additional sub word line driver regions comprising additional sub word line drivers operably coupled to the additional conductive structures of the second die.

13. The microelectronic device of claim 12, wherein the third control logic device region further comprises row decoders.

14. The microelectronic device of claim 12, wherein the third control logic device region further comprises complementary metal-oxide-semiconductor (CMOS) devices.

15. The microelectronic device of claim 12, wherein the second control logic device region further comprises row decoders.

16. The microelectronic device of claim 12, wherein the second sense amplifier device region has a smaller horizontal area than the first sense amplifier device region.

17. The microelectronic device of claim 12, wherein the second sense amplifier device region is located within horizontal boundaries of the first sense amplifier device region.

18. The microelectronic device of claim 12, wherein:
the first control logic device region further comprises a first column decoder region, a first multiplexer controller region, and a first sense amplifier driver region; and
the second control logic device region further comprises a second column decoder region, a second multiplexer controller region, and a second sense amplifier driver region.

19. The microelectronic device of claim 18, wherein each of the first column decoder region, the first multiplexer controller region, and the first sense amplifier driver region have a larger horizontal area than the respective ones of the second column decoder region, the second multiplexer controller region, and the second sense amplifier driver region.

20. The microelectronic device of claim 12, further comprising conductive pillar structures vertically extending through the vertical stacks of memory cells.

21. A method of forming a microelectronic device, the method comprising:
forming a first microelectronic device structure comprising:
a first control logic device region comprising a first sense amplifier device region;
vertical stacks of memory cells vertically overlying the first control logic device region;
conductive structures intersecting the vertical stacks of memory cells;
conductive interconnect structures in electrical communication with the conductive structures; and
a first oxide material vertically overlying the vertical stack of memory cells;
forming a second microelectronic device structure comprising:
a second control logic device region comprising a second sense amplifier device region;
additional vertical stacks of memory cells vertically overlying the second control logic device region;
additional conductive structures intersecting the additional vertical stacks of memory cells;
additional conductive interconnect structures in electrical communication with the additional conductive structures; and
a second oxide material vertically underlying the second control logic device region;
attaching the second microelectronic device structure to the first microelectronic device structure to form a first microelectronic device structure assembly; and
forming a third control logic device region over the second microelectronic device structure, the third control logic device region comprising sub word line drivers in electrical communication with the additional conductive structures of the second microelectronic device structure.

22. The method of claim 21, wherein forming a second control logic device region comprises forming the second control logic device region to comprise control logic devices in electrical communication with the vertical stacks of memory cells of the first microelectronic device structure.

23. The method of claim 21, wherein forming a second control logic device region comprises forming sub word line drivers to be in electrical communication with the conductive structures of the first microelectronic device structure.

24. An electronic system, comprising:

an input device;

an output device;

a processor device operably coupled to the input device and the output device; and a memory device operably coupled to the processor device and comprising:

a first die comprising:

vertical stacks of memory cells;

a first control logic device region vertically underlying the vertical stacks of memory cells and comprising first control logic devices configured for effectuating control operations of the vertical stacks of memory cells, the first control logic device region comprising a first sense amplifier device region comprising sense amplifier devices; and first global digit lines vertically between the first control logic device region and the vertical stacks of memory cells, each of the first global digit lines configured to be in electrical communication with at least some of the vertical stacks of memory cells, and each sense amplifier device in electrical communication with at least one of the first global digit lines; and a second die vertically overlying the first die, the second die comprising:

additional vertical stacks of memory cells;

a second control logic device region vertically underlying the additional vertical stacks of memory cells and comprising second control logic devices configured for effectuating control operations of the additional vertical stacks of memory cells; and second global digit lines vertically between the second control logic device region and the additional vertical stacks of memory cells.

25. The electronic system of claim 24, wherein:

the first die further comprises a stack structure comprising conductive structures interleaved with insulative structures, at least some of the conductive structures in electrical communication with memory cells of the vertical stacks of memory cells; and the second die further comprises an additional stack structure comprising additional conductive structures interleaved with additional insulative structures, at least some of the additional conductive structures in electrical communication with memory cells of the additional vertical stacks of memory cells.

26. The electronic system of claim 24, wherein the second control logic device region further comprises additional first control logic devices configured to effectuate control operations of the vertical stacks of memory cells of the first die.

27. The electronic system of claim 24, wherein the second control logic device region further comprises additional first control logic devices configured for effectuating control operations of the vertical stacks of memory cells.

28. The electronic system of claim 27, wherein the additional first control logic devices comprise sub word line drivers.

29. The electronic system of claim 27, wherein the additional first control logic device region are located within horizontal boundaries of staircase structures of the first die.

30. The electronic system of claim 24, further comprising a third control logic device region vertically overlying the second die and comprising additional second control logic devices configured for effectuating control operations of the additional vertical stacks of memory cells.

* * * * *